(12) United States Patent
Blackwell et al.

(10) Patent No.: US 12,012,473 B2
(45) Date of Patent: Jun. 18, 2024

(54) DIRECTED SELF-ASSEMBLY STRUCTURES AND TECHNIQUES

(71) Applicant: Intel Corporation, Santa Clara, CA (US)

(72) Inventors: James Munro Blackwell, Portland, OR (US); Robert L. Bristol, Portland, OR (US); Xuanxuan Chen, Hillsboro, OR (US); Lauren Elizabeth Doyle, Portland, OR (US); Florian Gstrein, Portland, OR (US); Eungnak Han, Portland, OR (US); Brandon Jay Holybee, Portland, OR (US); Marie Krysak, Portland, OR (US); Tayseer Mahdi, Beaverton, OR (US); Richard E. Schenker, Portland, OR (US); Gurpreet Singh, Portland, OR (US); Emily Susan Walker, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 615 days.

(21) Appl. No.: 17/032,517

(22) Filed: Sep. 25, 2020

(65) Prior Publication Data

US 2021/0375745 A1 Dec. 2, 2021

Related U.S. Application Data

(60) Provisional application No. 63/033,721, filed on Jun. 2, 2020.

(51) Int. Cl.
*G03F 7/11* (2006.01)
*C08F 265/02* (2006.01)
(Continued)

(52) U.S. Cl.
CPC .......... *C08F 265/04* (2013.01); *C08F 265/02* (2013.01); *G03F 7/11* (2013.01); *H01L 23/5226* (2013.01); *H01L 23/528* (2013.01)

(58) Field of Classification Search
CPC ............... H01L 23/5226; H01L 23/528; H01L 21/0337; H01L 21/31144; H01L 21/76816;
(Continued)

(56) References Cited

U.S. PATENT DOCUMENTS

2012/0214094 A1\* 8/2012 Mikoshiba .......... H01L 21/3086
438/689
2014/0170821 A1 6/2014 Nyhus et al.
(Continued)

FOREIGN PATENT DOCUMENTS

CN 109698238 A 4/2019
DE 102021121935 A1 3/2022
(Continued)

OTHER PUBLICATIONS

A-B-A Triblock Copolymer Compound Summary, PubChem, 10 pages.
(Continued)

*Primary Examiner* — Galina G Yushina
(74) *Attorney, Agent, or Firm* — Akona IP PC

(57) ABSTRACT

Disclosed herein are structures and techniques utilizing directed self-assembly for microelectronic device fabrication. For example, a microelectronic structure may include a patterned region including a first conductive line and a second conductive line, wherein the second conductive line is adjacent to the first conductive line; and an unordered region having an unordered lamellar pattern, wherein the unordered region is coplanar with the patterned region.

20 Claims, 41 Drawing Sheets

(51) Int. Cl.
*C08F 265/04* (2006.01)
*H01L 23/522* (2006.01)
*H01L 23/528* (2006.01)

(58) Field of Classification Search
CPC ........ C08F 265/04; C08F 265/02; G03F 7/11;
G03F 7/0002
See application file for complete search history.

(56) References Cited

U.S. PATENT DOCUMENTS

| | | |
|---|---|---|
| 2014/0295669 A1 | 10/2014 | Kawanishi et al. |
| 2015/0093702 A1 | 4/2015 | Nyhus et al. |
| 2015/0170961 A1* | 6/2015 | Romero ............ H01L 21/28506 |
| | | 438/641 |
| 2015/0325470 A1 | 11/2015 | Chang et al. |
| 2015/0332973 A1 | 11/2015 | Zhong et al. |
| 2016/0190009 A1* | 6/2016 | Wallace .............. H01L 23/5329 |
| | | 438/631 |
| 2016/0204002 A1 | 7/2016 | Wallace et al. |
| 2017/0058401 A1* | 3/2017 | Blackwell ......... H01L 21/28556 |
| 2017/0170007 A1* | 6/2017 | Chan ................... H01L 21/0332 |
| 2017/0263551 A1 | 9/2017 | Bristol et al. |
| 2018/0158694 A1 | 6/2018 | Lin et al. |
| 2018/0173109 A1 | 6/2018 | Gronheid et al. |
| 2018/0281499 A1 | 10/2018 | Millward et al. |
| 2018/0308807 A1* | 10/2018 | Cheng ............... H01L 23/53257 |
| 2018/0323078 A1* | 11/2018 | Bojarski ............... G03F 7/0002 |
| 2019/0139887 A1 | 5/2019 | Lin et al. |
| 2019/0206719 A1 | 7/2019 | Chen et al. |
| 2019/0341384 A1 | 11/2019 | Lilak et al. |
| 2019/0363008 A1 | 11/2019 | Gstrein et al. |
| 2020/0006427 A1 | 1/2020 | Sato et al. |
| 2020/0027827 A1 | 1/2020 | Lin et al. |
| 2020/0058548 A1 | 2/2020 | Han et al. |
| 2020/0152468 A1 | 5/2020 | Wang et al. |
| 2022/0102148 A1 | 3/2022 | Wallace |

FOREIGN PATENT DOCUMENTS

| | | |
|---|---|---|
| EP | 3758064 A1 | 12/2020 |
| KR | 101343760 B1 | 12/2013 |
| WO | 2019190453 A1 | 10/2019 |

OTHER PUBLICATIONS

Jeong, S., et al "Directed self-assembly of block copolymers for next generation nanolithography", Materials Today, vol. 16, No. 12, Dec. 2013, pp. 468-476.

Ji, S. et al., "Directed Assembly of Non-equilibrium ABA Triblock Copolymer Morphologies on Nanopatterned Substrates", ACS Nano, vol. 6, No. 6, 2012, pp. 5440-5448.

Welander, A. et al., "Directed Assembly of Block Copolymers in Thin to Thick Films", American Chemical Society, Macromolecules 2013, 46, 3915-3921.

International Search Report and Written Opinion in International Patent Application PCT/US2021/031203 dated Aug. 25, 2021, 11 pages.

Netherlands Search Report in Netherlands Patent Application No. 2028300 dated Apr. 21, 2022, 3 pages.

* cited by examiner

DIRECTED SELF-ASSEMBLY STRUCTURES AND TECHNIQUES

CROSS-REFERENCE TO RELATED APPLICATION

This application claims priority to U.S. Provisional Patent Application No. 63/033,721, filed Jun. 2, 2020 and titled "CHEMICAL COMPOSITIONS & METHODS OF PATTERNING MICROELECTRONIC DEVICE STRUCTURES." This priority application is hereby incorporated herein in its entirety.

BACKGROUND

Conventional microelectronic fabrication techniques may not be able to reliably pattern particularly small features. Consequently, the size and performance of microelectronic devices has been limited.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

DETAILED DESCRIPTION

Figure 1A:
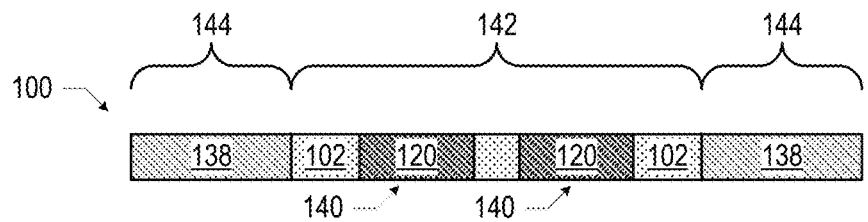
FIGS. 1A-1C are various views of a microelectronic structure including lines having low line edge roughness (LER), in accordance with various embodiments.

Disclosed herein are structures and techniques utilizing directed self-assembly (DSA) for microelectronic device fabrication. The structures and techniques disclosed herein may achieve fine feature sizes with low roughness and defect densities, and may be particularly suitable to accompany and improve extreme ultraviolet (EUV) lithography techniques.

Existing conventional lithography techniques, such as existing conventional EUV techniques, may not be able to pattern features that are both sufficiently small and have sufficiently few defects to be used in commercial microelectronic devices. For example, conventional EUV lithography may suffer from high roughness and excessive bridging defects at tight pitches (e.g., pitches below 32 nanometers), which may limit or effectively prevent deployment of EUV patterning techniques (e.g., spacer-based pitch-division techniques having resist "backbones" defined by EUV lithography). Conventional EUV lithographic techniques also suffer from a trade-off between EUV dose and resist thickness; although higher EUV doses have the potential to pattern lines with lower roughnesses, such higher EUV doses typically require thinner resist layers in order to achieve a desired depth of focus and avoid pattern collapse, but these thinner resist layers typically cannot withstand etch transfer (i.e., the transfer of a pattern in the resist to one or more underlying layers) as well as thicker resists can. These constraints have provided significant barriers to the adoption of EUV techniques in commercial microelectronic fabrication processes.

Various ones of the embodiments disclosed herein may remedy the deficiencies of conventional EUV lithographic techniques through the use of DSA operations. DSA-based techniques may utilize the propensity of some materials to self-organize into particular patterns under certain conditions, and these patterns may be utilized in various ways to fabricate small and accurate features in a microelectronic device. For example, various ones of the embodiments disclosed herein may include lines with low line edge roughness (LER) at varying pitches that can be reliably manufactured using DSA-based techniques.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The phrase "A, B, or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "conductive" material refers to an electrically conductive material, unless otherwise specified. When used to describe a range of dimensions, the phrase "between X and Y" represents a range that includes X and Y. For convenience, the phrase "FIG. 1" may be used to refer to the collection of drawings of FIGS. 1A-1C, the phrase "FIG. 2" may be used to refer to the collection of drawings of FIGS. 2A-2L, etc. Although mask materials are referred to with various reference numerals repeated between different ones of the drawings (e.g., mask material 126, mask material 128, mask material 148, etc.), this is simply for ease of illustration, and a mask material having a specific reference numeral referred to in one of the drawings (e.g., the mask material 128 referred to in the drawings of FIG. 7) need not be the same mask material as the mask material having the same reference numeral referred to in another of the drawings (e.g., the mask material 128 referred to in the drawings of FIG. 9).

Figure 1B:
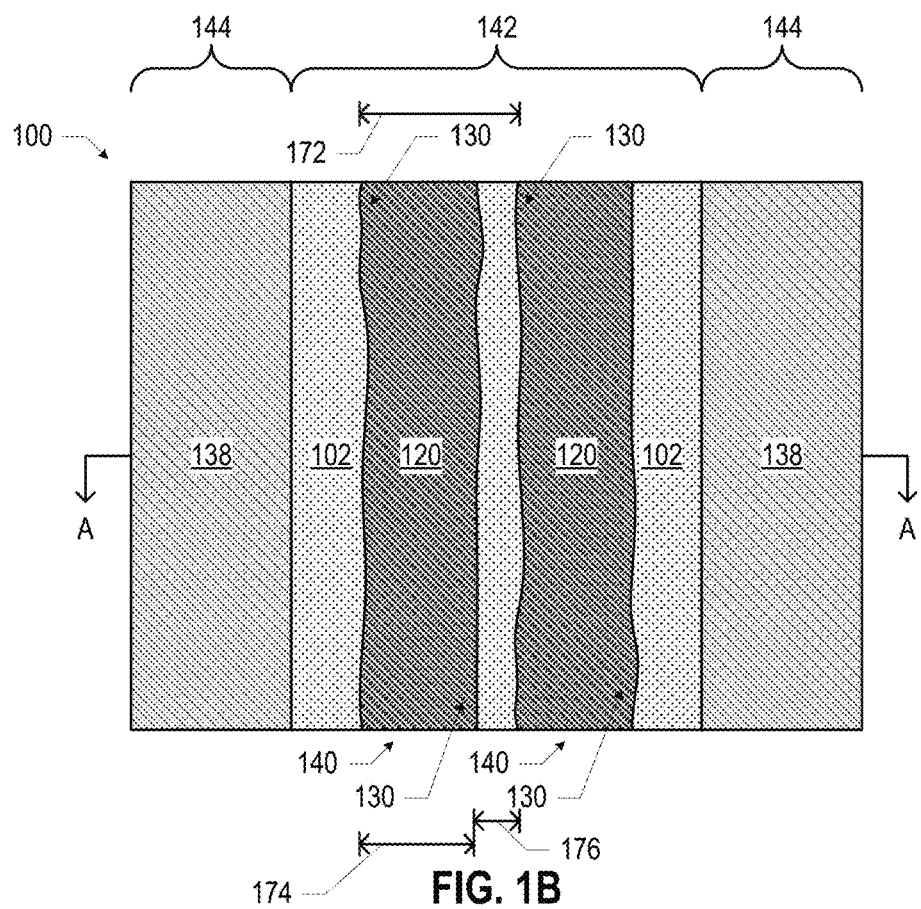
Figure 1C:
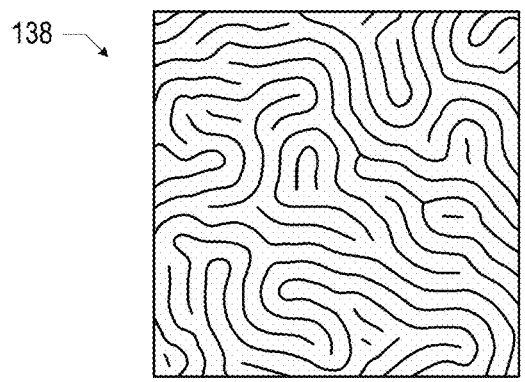

FIGS. 1A-1C are various views of an example microelectronic structure 100 including lines 140 having low LER; such lines 140 may be referred to herein as low-LER lines 140. FIG. 1A is a side, cross-sectional view of the microelectronic structure 100 through the section A-A of FIG. 1B, FIG. 1B is a top view of the microelectronic structure 100, and FIG. 1C is a detailed top view of an unordered lamellar structure 138 of a microelectronic structure 100 (discussed further below). The low-LER lines 140 of FIG. 1 may have edges 130, as shown. The term "low," when used with reference to the low-LER lines 140, is a relative one, indicating that the LER of low-LER lines 140 is less than the LER of other "high-LER" lines (e.g., the high-LER lines 170 discussed below). The LER may measure a local deviation of a line edge from its center of mass; in some embodiments, the LER may be quantified as the root-mean-square deviation of a line edge from a best-fit straight line. In some embodiments, low-LER lines 140 may be those patterned utilizing various ones of the DSA-based techniques disclosed herein, while high-LER lines may be patterned utilizing conventional techniques (e.g., EUV lithography). In some embodiments, the LER of a low-LER line 140 may be less than 1.2 nanometers, while the LER of a high-LER line may be greater than 1.2 nanometers; in other embodiments, the LER of a low-LER line 140 may be less than 1.5 nanometers, while the LER of a high-LER line may be greater than 1.5 nanometers, but these are simply examples and other LER thresholds may apply (e.g., dependent upon pitch and process). In some embodiments, the microelectronic structure 100 of FIG. 1 may be part of an interconnect layer in a microelectronic device (e.g., as discussed below with reference to FIG. 29).

The microelectronic structure 100 of FIG. 1 includes multiple low-LER lines 140 formed of parallel arrangements of line material 120 through a dielectric material 102. The line material 120 may include one or more layers of various materials, such as one or more layers of liner material and fill material. In some embodiments, a liner material may include tantalum, tantalum nitride, titanium, titanium nitride, cobalt, or ruthenium (e.g., combinations thereof) and a fill material may include tungsten, cobalt (e.g., as cobalt silicide), ruthenium, molybdenum, copper, silver, nickel (e.g., as nickel silicide), gold, aluminum, other metals or alloys, or other combinations of materials. The dielectric material 102 may include any suitable dielectric material. For example, in some embodiments, the dielectric material 102 may include an inorganic dielectric material, such as silicon oxide, carbon-doped oxide, silicon nitride, silicon carbide, silicon oxynitride, silicon oxycarbide, or insulating metal oxides such as hafnium oxide and zirconium oxide. In some embodiments, the dielectric material 102 may have a porosity that is less than 50% (e.g., less than 30%) and/or air gaps. In some embodiments, the pitch 172 of the low-LER lines 140 may be less than 30 nanometers (e.g., less than 24 nanometers), the line width 174 of a low-LER line 140 may be less than 15 nanometers (e.g., less than 12 nanometers), and/or the spacing between adjacent low-LER lines 140 may be less than 15 nanometers (e.g., less than 12 nanometers).

The low-LER lines 140 may be part of a patterned region 142, and the microelectronic structure 100 may also include one or more unpatterned regions 144. In some embodiments, when DSA-based techniques are used to manufacture the microelectronic structure 100 (e.g., as discussed below with reference to FIG. 2), the unpatterned regions 144 may include an unordered lamellar structure 138 like that illustrated in FIG. 10. The unordered lamellar structure 138 may include the line material 120 and the dielectric material 102 patterned according to the unordered lamellar structure of a DSA material that did not assume an ordered structure during preceding patterning operations (e.g., due to the absence of a patterned brush material over the unpatterned regions 144, as discussed below with reference to FIG. 2). The presence of an unordered lamellar structure 138, like that illustrated in FIG. 10, in an unpatterned region 144 of a microelectronic structure 100 may be indicative of the use of a DSA-based technique during fabrication of the patterned region 142. In some embodiments, the unpatterned region 144 may be part of a transition region of a die including the microelectronic structure 100, under a guard ring of a die including the microelectronic structure 100, or in a frame of a die including the microelectronic structure 100 (e.g., any of the dies 1502 discussed below with reference to FIG. 28).

FIGS. 2A-2L illustrate stages in an example process of manufacturing the microelectronic structure 100 of FIG. 1, in accordance with various embodiments. Although the operations of the method of FIG. 2 (and others of the methods disclosed herein) may be illustrated with reference to particular embodiments of the microelectronic structures 100 disclosed herein, the method of FIG. 2 (and others of the methods disclosed herein) may be used to form any suitable microelectronic structures 100. Operations are illustrated once each and in a particular order in FIG. 2 (and others of the drawings descriptive of the methods disclosed herein), but the operations may be reordered and/or repeated as suitable (e.g., with different operations performed in parallel when manufacturing multiple microelectronic structures 100 simultaneously).

Figure 2A:
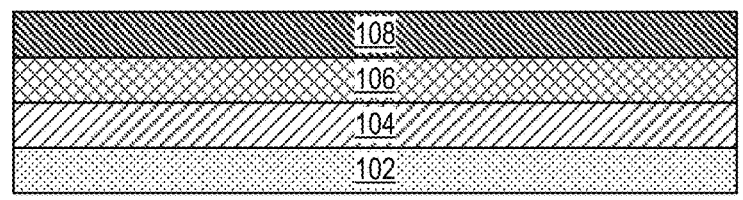
FIGS. 2A-2L illustrate stages in an example process of manufacturing the microelectronic structure of FIG. 1, in accordance with various embodiments.

FIG. 2A is a side, cross-sectional view of an assembly including a dielectric material 102, a mask material 104, a mask material 106, and a mask material 108. In some embodiments, the mask material 104 may include titanium nitride. In some embodiments, the mask material 106 may include silicon nitride, silicon oxide, or a silicon anti-reflective coating. In some embodiments, the mask material 108 may be a carbon-based hardmask or may include amorphous silicon. The particular number and arrangement of mask materials depicted in the assembly of FIG. 2A (and others of the accompanying drawings) is simply illustrative, and more or fewer mask materials may be arranged in any desired manner in accordance with the techniques disclosed herein.

Figure 2B:
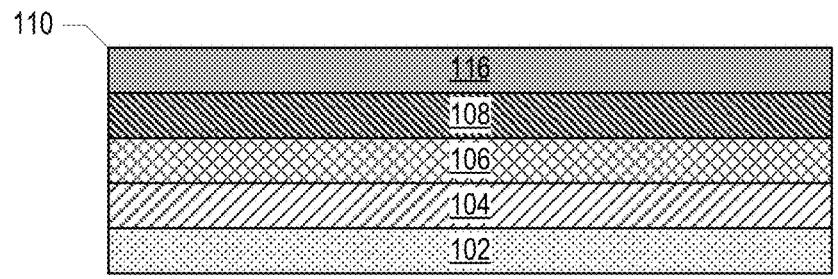

FIG. 2B is a side, cross-sectional view of an assembly subsequent to forming an initial brush 110 on the mask material 108 of the assembly of FIG. 2A. The initial brush 110 may include a material that will serve as a template for DSA of a block copolymer (BCP), as described below, and in some embodiments, may include one or more of the components of the BCP. For ease of discussion, the DSA-based techniques disclosed herein may refer to a BCP (e.g., the BCP 114 discussed below) having two components, a first component 116 and a second component 118, but this is simply illustrative, and a BCP having more than two components may be utilized in any of the techniques disclosed herein. One example of a BCP that may serve as the BCP 114 in the operations disclosed herein is polystyrene-co-poly (methyl methacrylate) (PS-PMMA); when the BCP 114 is PS-PMMA, the first component 116 may be polystyrene (PS) while the second component 118 may be polymethyl methacrylate (PMMA). As noted above, the DSA-based techniques disclosed herein may utilize a brush 110 that includes one or more of the first component 116 and the second component 118 of a BCP 114, but this is also simply illustrative, and any suitable material or materials may be included in a brush 110 (e.g., materials that are not components of the BCP that will undergo DSA on the brush 110). FIG. 2B (and others of the accompanying drawings) may illustrate a brush 110 that includes the first component 116. Although the brush 110 is illustrated as including the first component 116, the brush 110 may include other materials as well, as suitable (e.g., the brush 110 may include the second component 118, instead of or in addition to the first component 116, or the brush 110 may include one or more materials different from the first component 116 and the second component 118). As used herein, a "brush" may refer to any material that facilitates the self-assembly of a DSA material thereon, and may include large polymers, small polymers, self-assembled monolayers (SAMs), and other suitable materials.

Figure 2C:
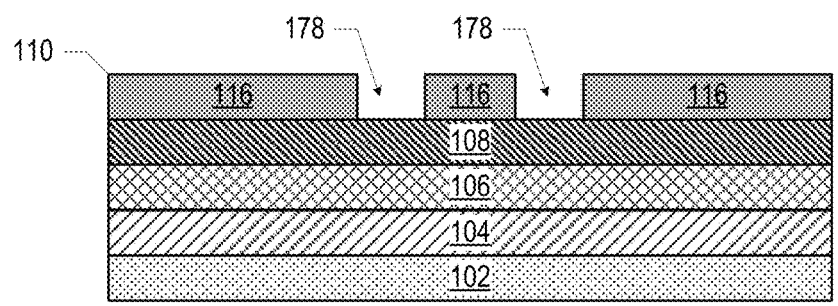
Figure 2D:
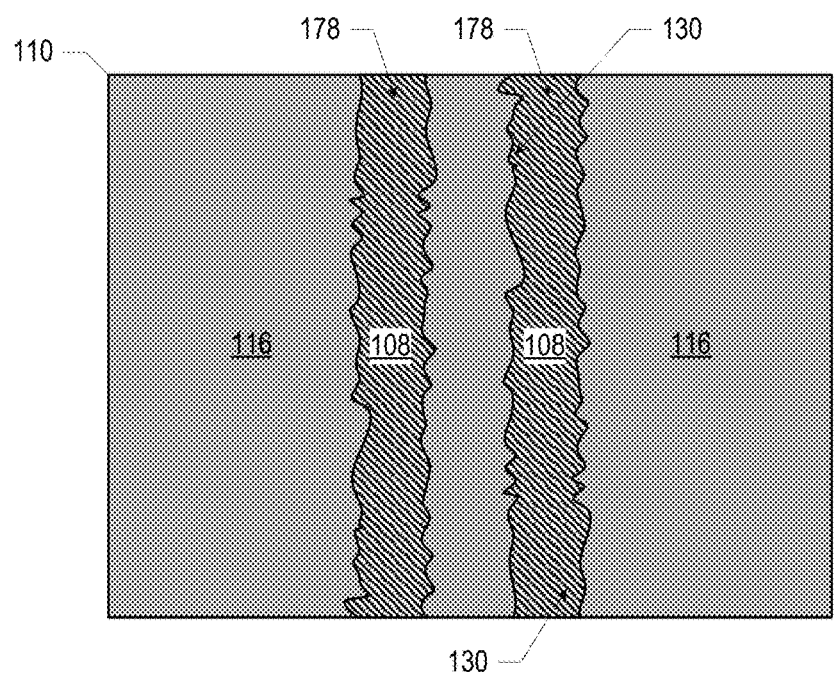

FIG. 2C is a side, cross-sectional view of an assembly subsequent to patterning the initial brush 110 of the assembly of FIG. 2B to form openings 178 in the brush 110. The locations of the openings 178 may correspond to the desired locations of low-LER lines 140 in a microelectronic structure 100, although the roughness of the edges 130 of the openings 178 in the assembly of FIG. 2C may not be "low," as discussed below. In some embodiments, the brush 110 may itself be photolithographically patterned (e.g., the brush 110 may be selectively treated to change properties of the brush 110 in accordance with a desired pattern, then portions of the brush 110 may be removed by a suitable etch or rinse to yield the desired pattern). In some such embodiments, the brush 110 may include a component that can undergo chain scission reactions upon photon or electron exposure (e.g., a PMMA resist). In other such embodiments, the brush 110 may include a surface anchoring group that may be cleaved by photon or electron exposure, or a reaction with a subsequent photo acid or base. In other such embodiments, the brush 110 may undergo a polarity switch upon photon or electron exposure; such a polarity switch may generate either a 2-color tone or a 3-color tone brush contrast, depending on the edge broadening effect. In other embodiments, the brush 110 may be patterned by applying a photoresist material (not shown), patterning the photoresist material, transferring the pattern of the photoresist material into the brush 110, and then removing the photoresist material. FIG. 2D is a top view of the assembly of FIG. 2C, illustrating the edges 130 of the openings 178 in the brush 110. The illustration of FIG. 2C is taken through the section C-C of FIG. 2D. As noted above, the openings 178 may have highly rough edges 130; if the pattern of the openings 178 were transferred into the dielectric material 102, and the transferred openings were filled with the line material 120, the resulting lines would be similarly rough, and thus would be high-LER lines (e.g., the high-LER lines 170 discussed below).

Figure 2E:
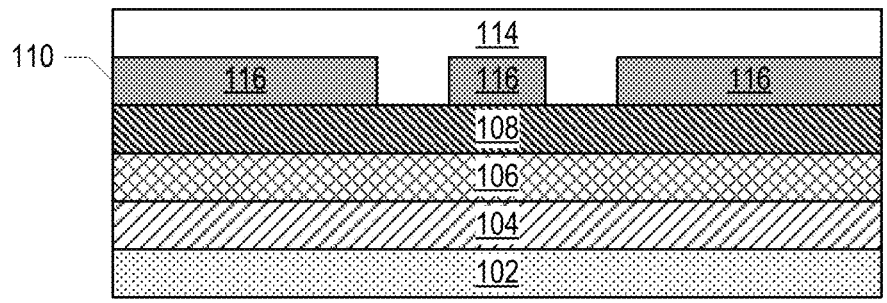

FIG. 2E is a side, cross-sectional view of an assembly subsequent to depositing a BCP 114 on the assembly of FIGS. 2C and 2D. As noted above, the brush 110 and the BCP 114 may be selected so as to achieve a desired DSA behavior, as discussed below with reference to FIG. 2F. In the embodiment of FIG. 2, as noted above, the BCP 114 may include a first component 116 and a second component 118 (not shown in FIG. 2E).

Figure 2F:
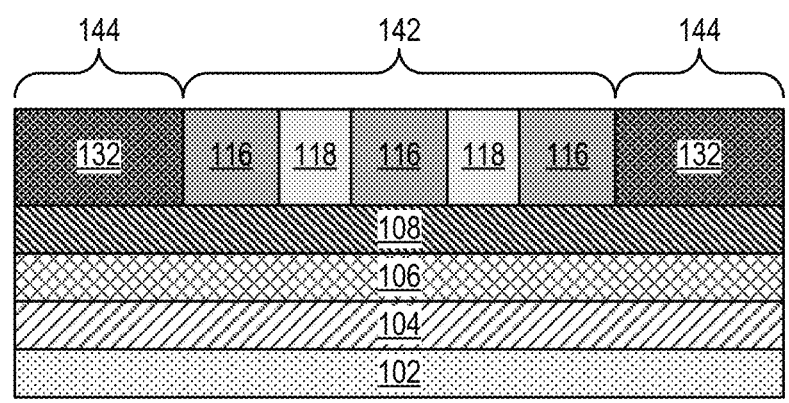

FIG. 2F is a side, cross-sectional view of an assembly subsequent to treating the assembly of FIG. 2E to cause the BCP 114 to self-assemble in accordance with the template provided by the brush 110. In the particular embodiment of FIG. 2F, the self-assembly of the BCP 114 includes the BCP 114 self-segregating its first component 116 and second component 118 into bands, forming alternating vertically oriented regions of the first component 116 and the second component 118 in the patterned region 142. The dimensions and spacing of the openings 178 in the brush 110 may be selected to correspond with the size and spacing of the bands of the second component 118 of the BCP 114, as shown, and the dimensions and spacing of the first component 116 in the brush 110 may be selected to correspond with the size and spacing of the bands of the first component 116 of the BCP 114, so that the brush 110 provides a "template" for the self-assembly of the BCP 114, aligning the self-assembled BCP 114 as desired with respect to the underlying brush 110. A BCP 114 may be able to "stretch" or "shrink" around a nominal "inherent" spacing of the self-assembled bands of the first component 116/second component 118, allowing a range of dimensions of the self-assembled bands of the first component 116/second component 118, as well as some tolerance to deviation in the patterning of the brush 110 from its intended pattern. The particular band-like self-assembly illustrated in FIG. 2F is one example of a pattern into which a BCP 114 may self-assemble; some BCPs 114 may self-assemble into other patterns, and various BCPs 114 may self-assemble into multiple different patterns under different conditions, as discussed below. Outside the patterned region 142, the brush 110 may not provide a surface on which the BCP 114 readily self-assembles into alternating vertically oriented regions of the first component 116 and the second component 118, and so instead, the BCP 114 in the unpatterned regions 144 may self-assemble into unordered lamellae 132 of the first component 116 and the second component 118; the unordered lamellae 132 may have a structure like that illustrated in FIG. 10.

Figure 2G:
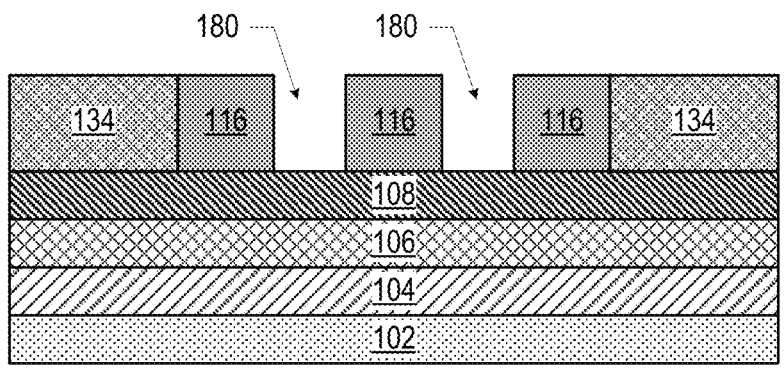
Figure 2H:
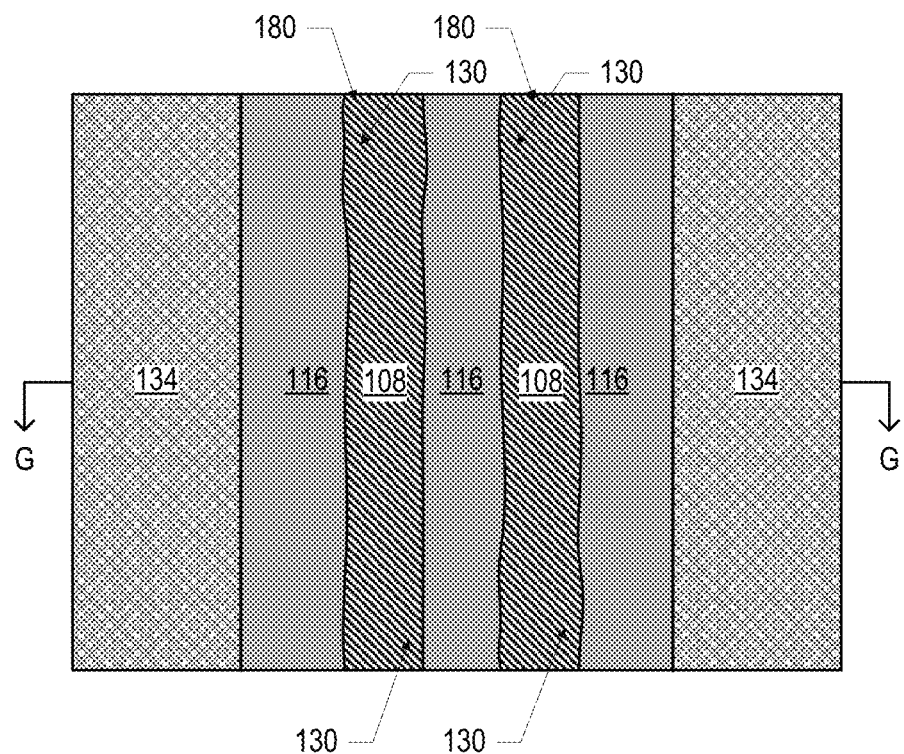

FIG. 2G is a side, cross-sectional view of an assembly subsequent to removing the second component 118 from the assembly of FIG. 2F. The first component 116 may remain in place, and thus the patterned region 142 may include a series of parallel openings 180. In some embodiments, the assembly of FIG. 2F may be treated with an ion implant technique to harden the first component 116 (e.g., PS) prior to removing the second component 118 (e.g., PMMA). In some embodiments, a suitable selective etch technique may be used to remove the second component 118 while leaving the first component 116 in place. Removing the second component 118 from the unordered lamellae 132 of the unpatterned regions 144 may result in partially etched unordered lamellae 134, which may retain a structure like that illustrated in FIG. 10. FIG. 2H is a top view of the assembly of FIG. 2G, illustrating the edges 130 of the openings 180 in the first component 116. The illustration of FIG. 2G is taken through the section G-G of FIG. 2H. These openings 180 may have edges 130 with low LER; if the pattern of the openings 180 were transferred into the dielectric material 102 (as discussed below), and the transferred openings were filled with a line material 120 (as discussed below), the resulting lines will be similarly rough, and thus will be low-LER lines 140. The process of performing a DSA-based technique on the "rough" openings 178 of the assembly of FIG. 2D may result in the "smooth" openings 180 of the assembly of FIG. 2H, and thus the technique of FIG. 2 (and others of the DSA-based techniques disclosed herein) may be said to "rectify" the "rough" openings 178. The ability of the DSA-based techniques disclosed herein to rectify rough lithographic features may enable the use of lower-dose EUV lithography for fabrication; since the additional roughness associated with lower-dose EUV lithography (relative to higher-dose EUV lithography) may be remedied by the DSA operations, the benefits of lower-dose EUV lithography (e.g., the ability to use thicker resist materials) may be realized without the conventionally associated roughness penalty.

Figure 2I:
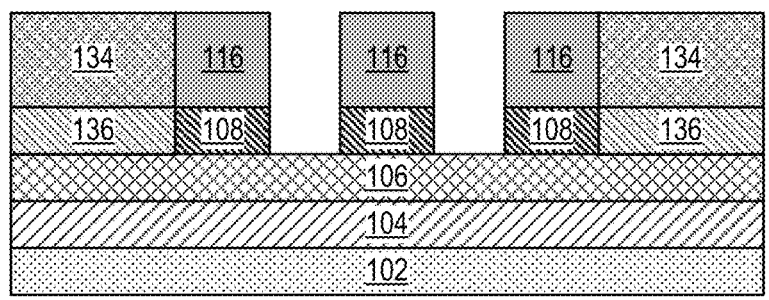

FIG. 2I is a side, cross-sectional view of an assembly subsequent to transferring the pattern of the openings 180 of the assembly of FIGS. 2G and 2H into the underlying mask material 108. Any suitable etch technique may be used. Transferring the pattern of the openings 180 into the mask material 108 may also result in transferring the unordered lamellar patterns of the partially etched unordered lamellae 134 into the underlying mask material 108 in the unpatterned regions 144, yielding the unordered lamellae-patterned mask material 136.

Figure 2J:
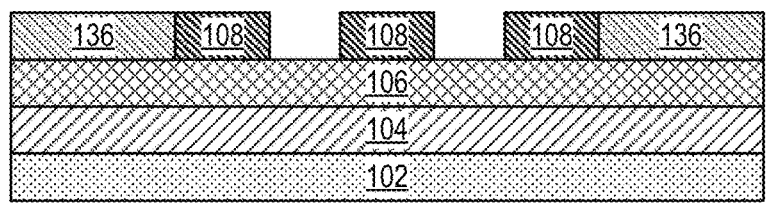

FIG. 2J is a side, cross-sectional view of an assembly subsequent to removing the first component 116 from the assembly of FIG. 2I. Any suitable selective etch technique may be used (e.g., when the first component 116 includes PS, an ash technique may be used).

Figure 2K:
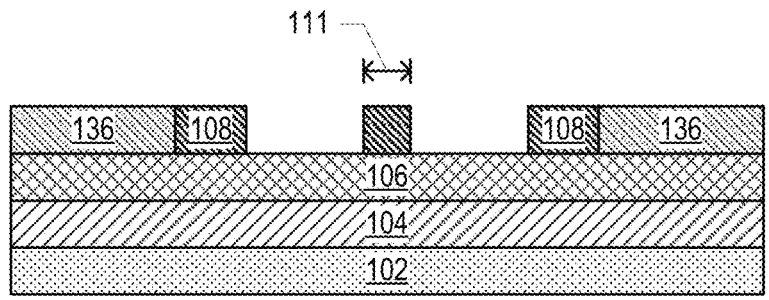

FIG. 2K is a side, cross-sectional view of an assembly subsequent to performing a lateral etch on the mask material 108 of FIG. 2J to decrease the lateral size of the portions of the mask material 108 and thereby increase the distance between adjacent portions of the mask material 108. This etch may be controlled to achieve a desired distance between adjacent portions of the mask material. In some embodiments, the width 111 of a portion of mask material 108 may be between 10 nanometers and 12 nanometers.

Figure 2L:
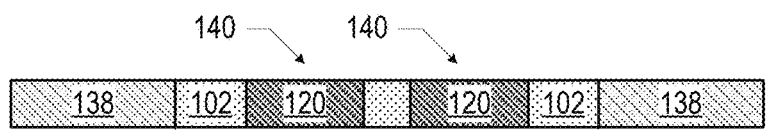

FIG. 2L is a side, cross-sectional view of an assembly subsequent to transferring the pattern of the mask material 108/unordered lamellae-patterned mask material 136 into the dielectric material 102 of the assembly of FIG. 2K (through the intermediate mask materials 104 and 106, subsequently removed), and then providing line material 120 in the openings of the dielectric material 102 to form the low-LER lines 140. The pattern of the unordered lamellae-patterned mask material 136 may be transferred into the dielectric material 102 to form the unordered lamellar structure 138. The assembly of FIG. 2L may take the form of the microelectronic structure 100 of FIG. 1.

Figure 3:
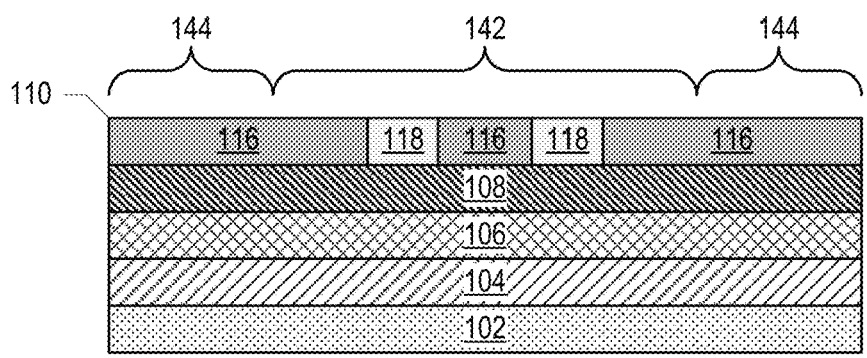
FIG. 3 illustrates a stage in another example process of manufacturing the microelectronic structure of FIG. 1, in accordance with various embodiments.

As noted above, in some embodiments, a brush 110 may include multiple different materials arranged in a desired pattern. For example, FIG. 3 illustrates an assembly subsequent to depositing the second component 118 in the openings 178 of the brush 110 of the assembly of FIG. 2C. The operations discussed above with reference to FIGS. 2E-2L may be performed on the assembly of FIG. 3 to form the microelectronic structure 100 of FIG. 1. Utilizing multiple different materials in a brush 110 may provide a stronger "template" to the BCP 114, and may thereby improve the resulting self-assembly and achieve low-LER lines 140 with even lower LER.

Figure 4A:
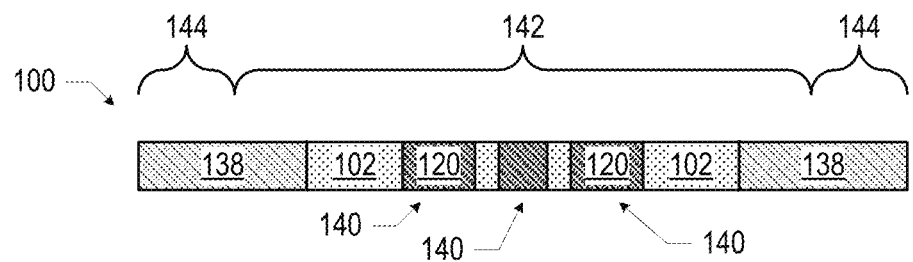
FIGS. 4A-4B are various views of another microelectronic structure including lines having low (LER), in accordance with various embodiments.
Figure 4B:
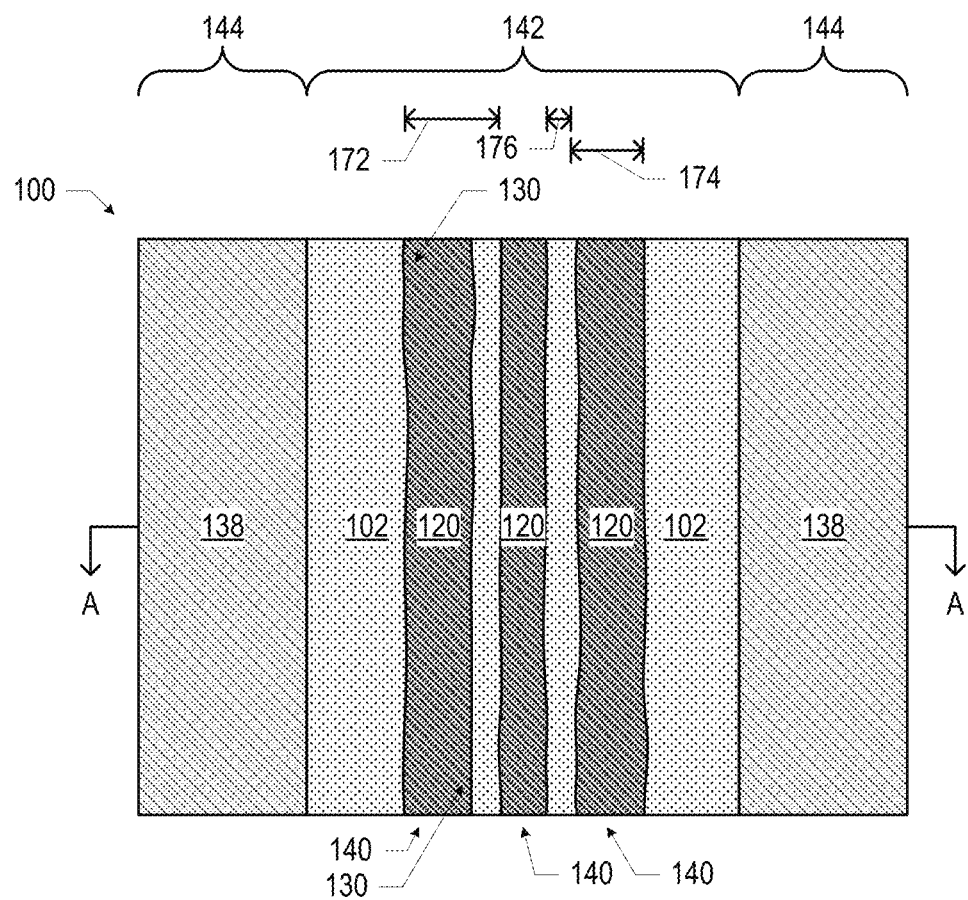

In some embodiments, spacer-based techniques may be used to further reduce the pitch 172 of low-LER lines 140 in a patterned region 142. For example, FIGS. 4A-4B are various views of another microelectronic structure 100 including low-LER lines 140, in accordance with various embodiments. FIG. 4A is a side, cross-sectional view of the microelectronic structure 100 through the section A-A of FIG. 4B, and FIG. 4B is a top view of the microelectronic structure 100; the unordered lamellar structure 138 of the microelectronic structure 100 of FIG. 4 may take the form illustrated in FIG. 10. The embodiment of FIG. 4 shares a number of elements with the embodiment of FIG. 1; for ease of discussion, a description of these elements is not repeated, and these elements may take the form of any of the embodiments of these elements disclosed herein. Relative to the embodiment of FIG. 1, the low-LER lines 140 of the embodiment of FIG. 4 may have a smaller pitch 172, smaller line width 174, and/or smaller spacing 176.

Figure 5A:
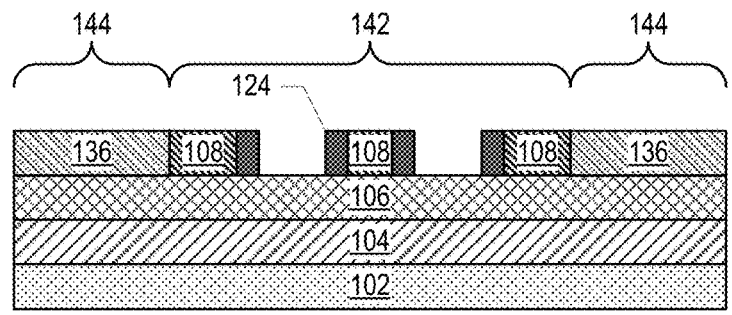
FIGS. 5A-5D illustrate stages in an example process of manufacturing the microelectronic structure of FIG. 4, in accordance with various embodiments.

FIGS. 5A-5D illustrate stages in an example process of manufacturing the microelectronic structure 100 of FIG. 4, in accordance with various embodiments. FIG. 5A is a side, cross-sectional view of an assembly subsequent to forming spacers 124 at side faces of the patterned mask material 108 of the assembly of FIG. 2K. The spacers 124 may include a dielectric material, and may be fabricated using any suitable spacer technique (e.g., a conformal deposition of the dielectric material, such as by atomic layer deposition (ALD), followed by a "downward" directional etch to remove the dielectric material on horizontal surfaces and leave the dielectric material in place on side faces).

Figure 5B:
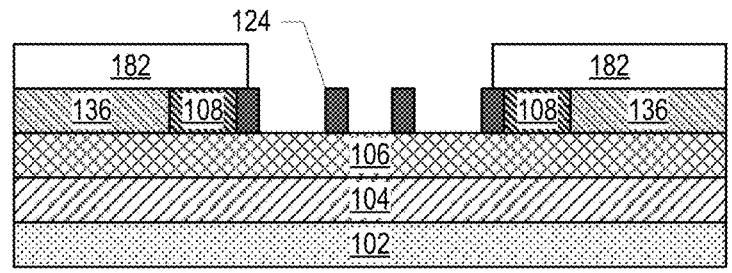

FIG. 5B is a side, cross-sectional view of an assembly subsequent to depositing and patterning a mask material 182 on the assembly of FIG. 5A to cover the mask material 108 proximate to the unordered lamellae-patterned mask material 136, and then removing the remaining mask material 108. Any suitable mask material 182, deposition techniques, patterning techniques, and etch techniques may be used.

Figure 5C:
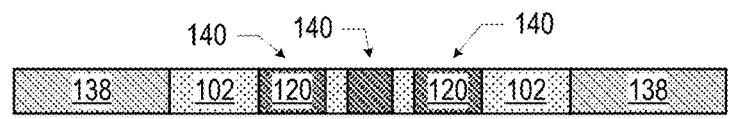
Figure 5D:
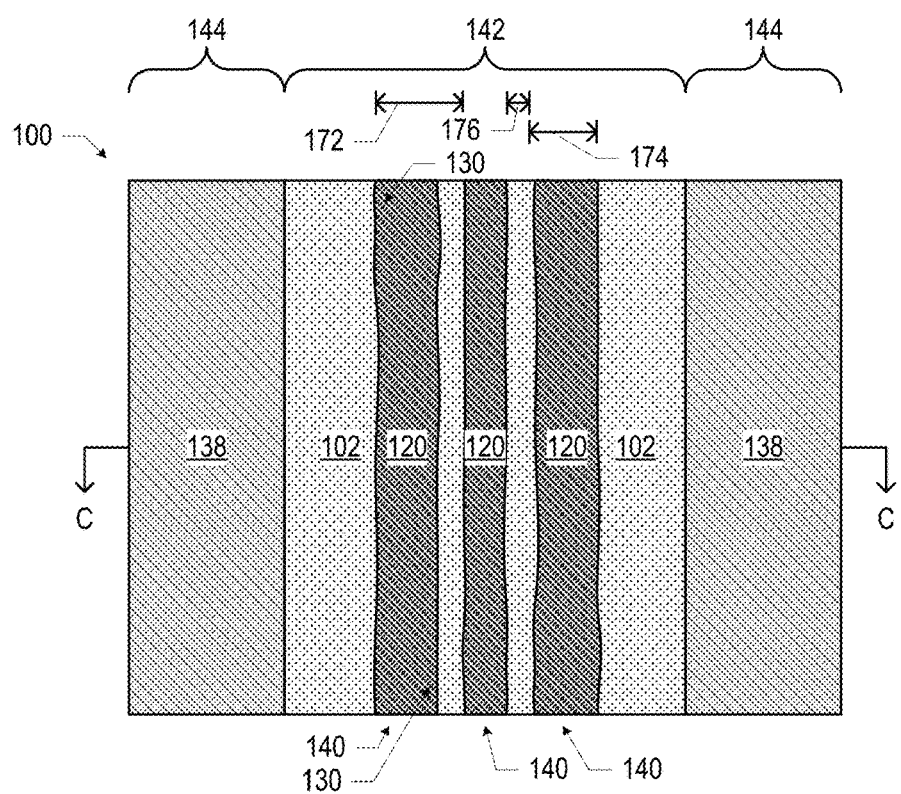

FIG. 5C is a side, cross-sectional view of an assembly subsequent to transferring the pattern of the mask material 108/unordered lamellae-patterned mask material 136 into the dielectric material 102 of the assembly of FIG. 5B (through the intermediate mask materials 104 and 106, subsequently removed), and then providing line material 120 in the openings of the dielectric material 102 to form the low-LER lines 140. The pattern of the unordered lamellae-patterned mask material 136 may be transferred into the dielectric material 102 to form the unordered lamellar structure 138. FIG. 5D is a top view of the assembly of FIG. 5C, illustrating the edges 130 of the low-LER lines 140. The illustration of FIG. 5C is taken through the section C-C of FIG. 5D. The assembly of FIGS. 5C and 5D may take the form of the microelectronic structure 100 of FIG. 4.

Figure 6A:
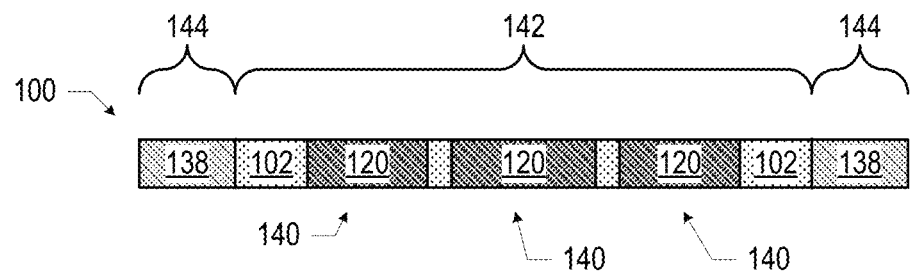
FIGS. 6A-6B are various views of another microelectronic structure including lines having low LER, in accordance with various embodiments.
Figure 6B:
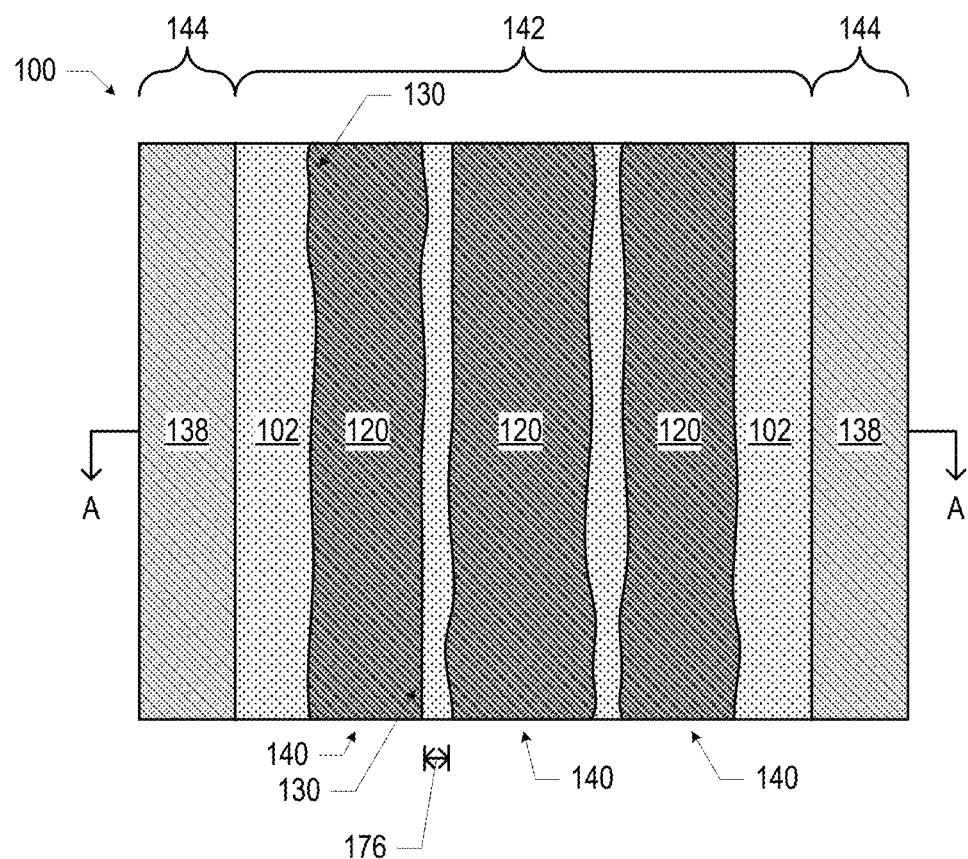

Spacer-based techniques may be used to reduce the spacing 176 between low-LER lines 140 in a microelectronic structure 100 in other ways. For example, FIGS. 6A-6B are various views of another microelectronic structure 100 including low-LER lines 140, in accordance with various embodiments. FIG. 6A is a side, cross-sectional view of the microelectronic structure 100 through the section A-A of FIG. 6B, and FIG. 6B is a top view of the microelectronic structure 100; the unordered lamellar structure 138 of the microelectronic structure 100 of FIG. 6 may take the form illustrated in FIG. 10. The embodiment of FIG. 6 shares a number of elements with preceding embodiments; for ease of discussion, a description of these elements is not repeated, and these elements may take the form of any of the embodiments of these elements disclosed herein. Relative to the embodiment of FIG. 1, the low-LER lines 140 of the embodiment of FIG. 6 may have a smaller spacing 176.

Figure 7A:
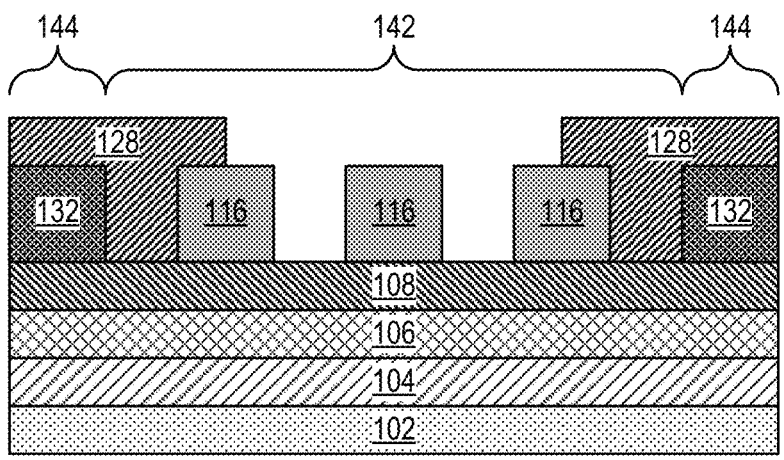
FIGS. 7A-7H illustrate stages in an example process of manufacturing the microelectronic structure of FIG. 6, in accordance with various embodiments.

FIGS. 7A-7H illustrate stages in an example process of manufacturing the microelectronic structure 100 of FIG. 6, in accordance with various embodiments. FIG. 7A is a side, cross-sectional view of an assembly subsequent to providing and patterning a mask material 128 in the unpatterned regions 144 of an assembly substantially similar to that of FIG. 2G, but with additional openings 180 between the outermost portions of the first component 116 and the unordered lamellae 132 for illustrative purposes. Any suitable mask material 128 may be used.

Figure 7B:
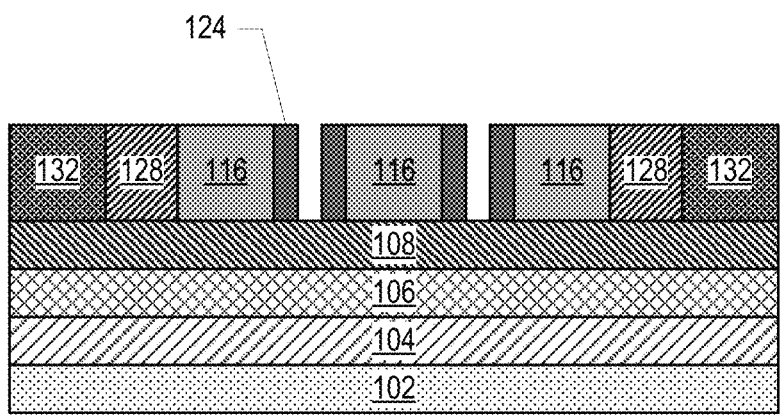

FIG. 7B is a side, cross-sectional view of an assembly subsequent to forming spacers 124 at side faces of the first component 116 of the assembly of FIG. 7A. The spacers 124 may take any of the forms disclosed herein.

Figure 7C:
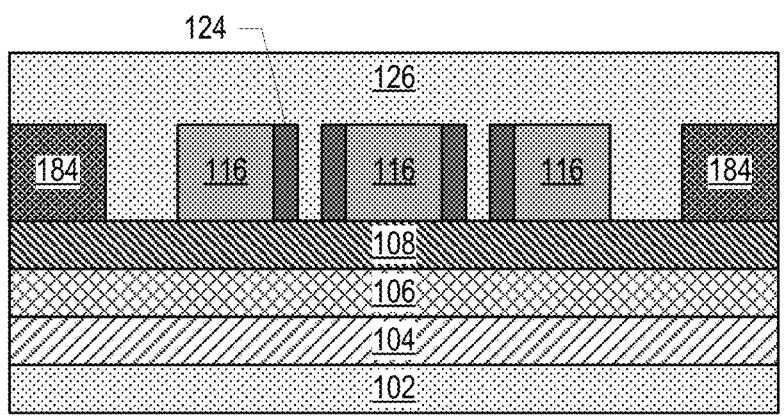

FIG. 7C is a side, cross-sectional view of an assembly subsequent to depositing a mask material 126 over the assembly of FIG. 7B. In some embodiments, the mask material 126 may include amorphous silicon. The mask material 126 may fill in openings in the unordered lamellae 132, forming a lamellar material 184.

Figure 7D:
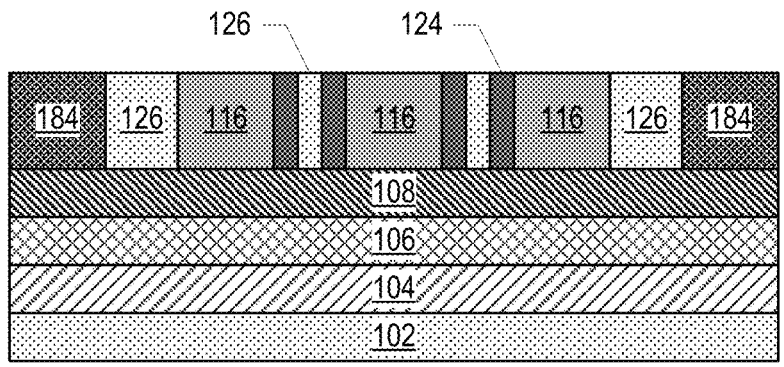

FIG. 7D is a side, cross-sectional view of an assembly subsequent to the assembly of FIG. 7C to remove the overburden of mask material 126. In some embodiments, a chemical mechanical polishing (CMP) technique may be used.

Figure 7E:
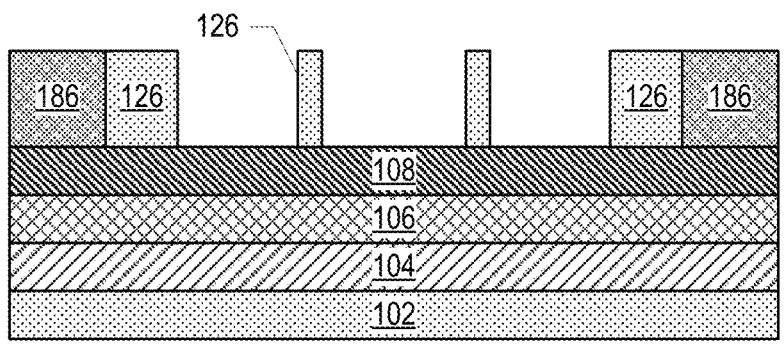

FIG. 7E is a side, cross-sectional view of an assembly subsequent to removing the first component 116 and the spacers 124 from the assembly of FIG. 7D. Any suitable selective etch technique(s) may be used (e.g., when the first component 116 includes PS, an ash technique may be used). Removing the first component 116 from the lamellar material 184 may result in the partially etched lamellar material 186, which may have a structure like that of FIG. 10.

Figure 7F:
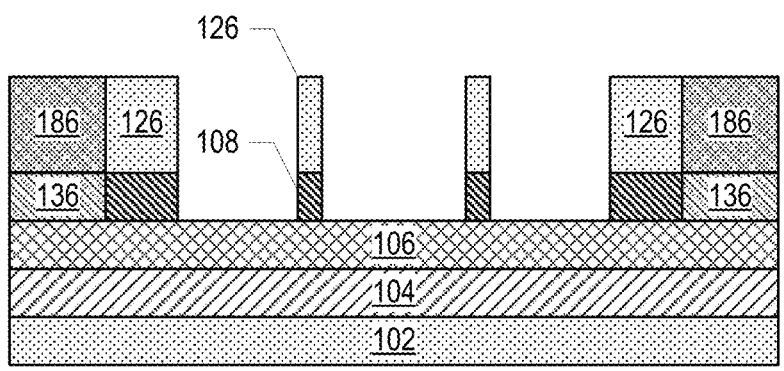

FIG. 7F is a side, cross-sectional view of an assembly subsequent to transferring the pattern of the partially etched lamellar material 186/mask material 126 of the assembly of FIG. 7E into the mask material 108. Transferring the pattern may include transferring the unordered lamellar patterns of the partially etched lamellar material 186 into the underlying mask material 108 in the unpatterned regions 144, yielding the unordered lamellae-patterned mask material 136.

Figure 7G:
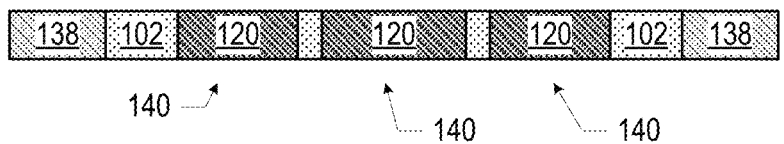
Figure 7H:
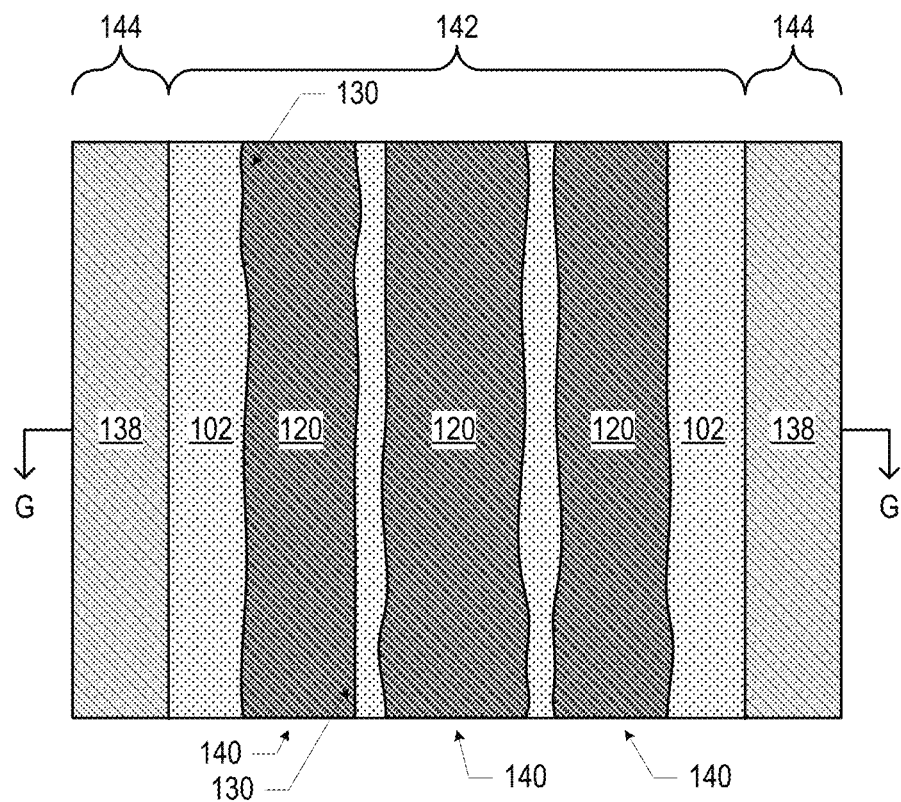

FIG. 7G is a side, cross-sectional view of an assembly subsequent to transferring the pattern of the mask material 108/unordered lamellae-patterned mask material 136 of the assembly of FIG. 7F into the dielectric material 102 (through the intermediate mask materials 104 and 106, subsequently removed), and then providing line material 120 in the openings of the dielectric material 102 to form the low-LER lines 140. The pattern of the unordered lamellae-patterned mask material 136 may be transferred into the dielectric material 102 to form the unordered lamellar structure 138. FIG. 7H is a top view of the assembly of FIG. 7G, illustrating the edges 130 of the low-LER lines 140. The illustration of FIG. 7G is taken through the section G-G of FIG. 7H. The assembly of FIGS. 7G and 7H may take the form of the microelectronic structure 100 of FIG. 6.

Figure 8A:
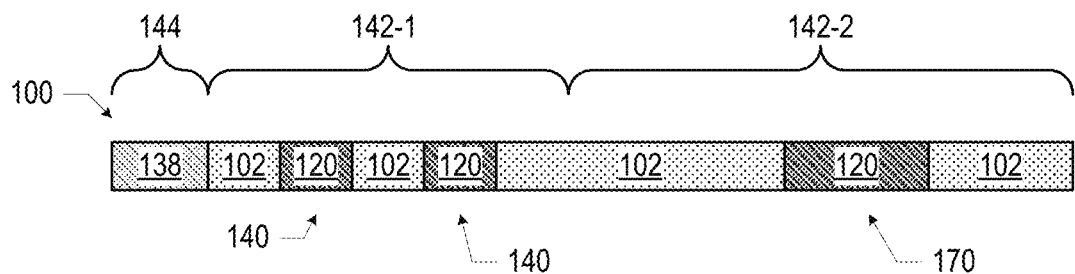
FIGS. 8A-8B are various views of a microelectronic structure including lines having low LER and lines having high LER, in accordance with various embodiments.
Figure 8B:
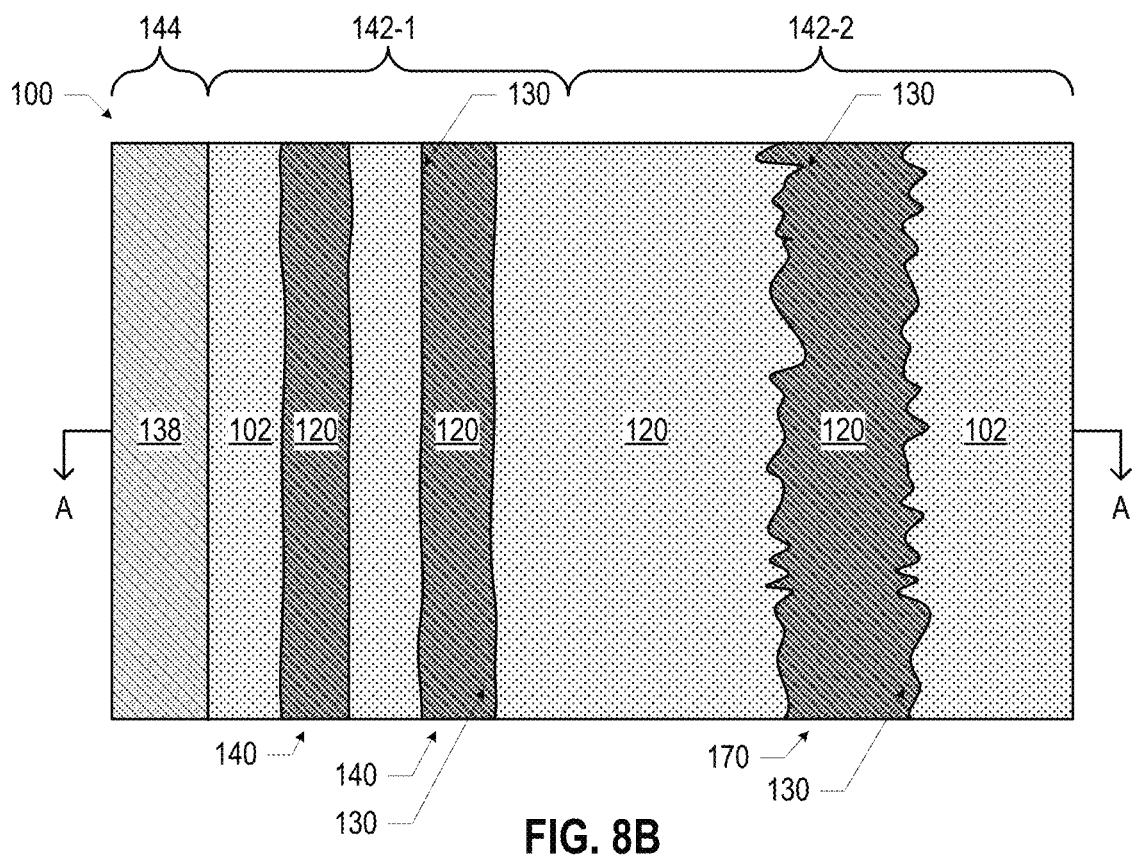

In some embodiments, a microelectronic structure 100 may include low-LER lines 140 and high-LER lines 170. For example, FIGS. 8A-8B are various views of another microelectronic structure 100 including low-LER lines 140, in accordance with various embodiments. FIG. 8A is a side, cross-sectional view of the microelectronic structure 100 through the section A-A of FIG. 8B, and FIG. 8B is a top view of the microelectronic structure 100; the unordered lamellar structure 138 of the microelectronic structure 100 of FIG. 8 may take the form illustrated in FIG. 10. The embodiment of FIG. 8 shares a number of elements with preceding embodiments; for ease of discussion, a description of these elements is not repeated, and these elements may take the form of any of the embodiments of these elements disclosed herein. Relative to the embodiment of FIG. 1, the microelectronic structure 100 of FIG. 8 includes a first patterned region 142-1 including low-LER lines 140 and a second patterned region 142-2 including one (as shown) or more high-LER lines 170.

As noted above, in some embodiments, lines or other features patterned by DSA-based techniques may be distinguished from lines or other features patterned by lithographic techniques (e.g., EUV lithographic techniques) by their LER; in particular, lines or other features patterned by the DSA-based techniques disclosed herein may have lower LER than lines or other features patterned by lithographic techniques. Other markers may distinguish lines or other features patterned by the DSA-based techniques disclosed herein from lines or other features patterned by lithographic techniques. For example, in some embodiments, lines or other features patterned by conventional lithographic techniques (e.g., EUV lithographic techniques) may have a line width roughness (LWR) that is equal to the LER of those lines or other features, multiplied by the square root of 2. This "lithographic property" may not hold for lines or other features patterned by the DSA-based techniques disclosed herein, and thus the presence of this lithographic property may indicate whether a feature was patterned using conventional lithographic techniques or the DSA-based techniques disclosed herein.

Figure 9A:
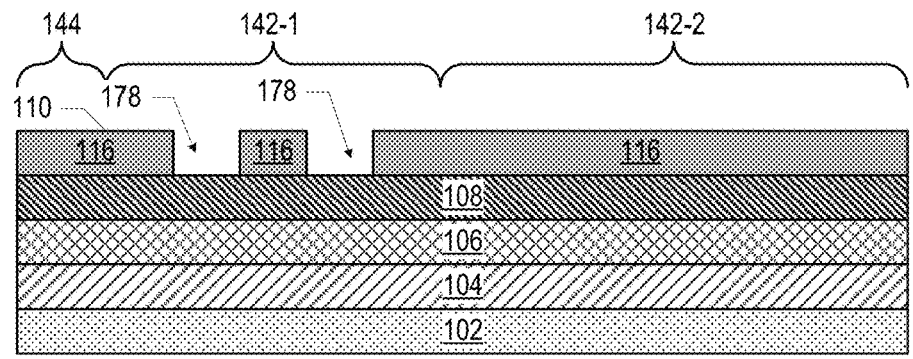
FIGS. 9A-9M illustrate stages in an example process of manufacturing the microelectronic structure of FIG. 8, in accordance with various embodiments.

FIGS. 9A-9M illustrate stages in an example process of manufacturing the microelectronic structure 100 of FIG. 8, in accordance with various embodiments. FIG. 9A is a side, cross-sectional view of an assembly like that of FIG. 2C, including a patterned initial brush 110. The assembly of FIG. 9A may be formed in accordance with any of the fabrication techniques discussed herein with reference to FIG. 2C. Like the assembly of FIG. 2C, openings 178 may be patterned into the first patterned region 142-1 of the first component 116 using lithographic techniques, and thus may have highly rough edges.

Figure 9B:
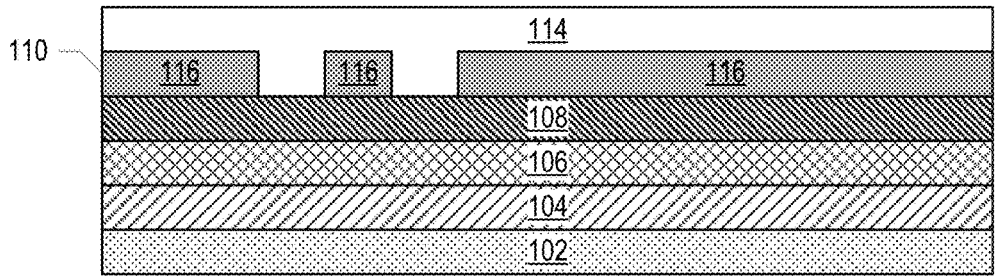

FIG. 9B is a side, cross-sectional view of an assembly subsequent to depositing a BCP 114 on the assembly of FIG. 9A. The brush 110 and the BCP 114 may be selected so as to achieve a desired behavior when the BCP 114 self-assembles on the brush 110. In the embodiment of FIG. 9, the BCP 114 may include a first component 116 and a second component 118.

Figure 9C:
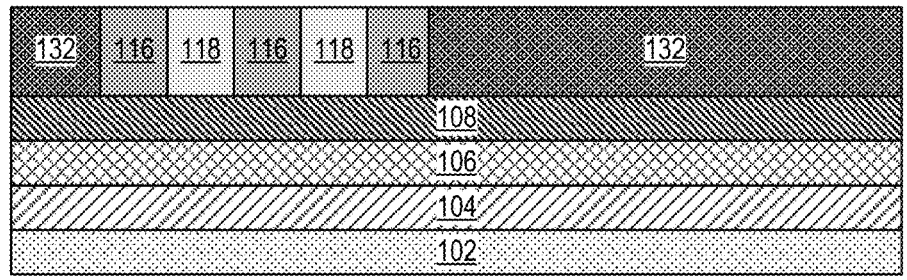

FIG. 9C is a side, cross-sectional view of an assembly subsequent to treating the assembly of FIG. 9B to cause the BCP 114 to self-assemble in accordance with the template provided by the brush 110. As discussed above with reference to FIG. 2, the resulting assembly may include alternating vertically oriented regions of the first component 116 and the second component 118 in the first patterned region 142-1. Outside the first patterned region 142-1, the brush 110 may not provide a surface on which the BCP 114 readily self-assembles into alternating vertically oriented regions of the first component 116 and the second component 118, and so instead, the BCP 114 in the unpatterned region 144 and the second patterned region 142-2 may self-assemble into unordered lamellae 132 of the first component 116 and the second component 118; the unordered lamellae 132 may have a structure like that illustrated in FIG. 10.

Figure 9D:
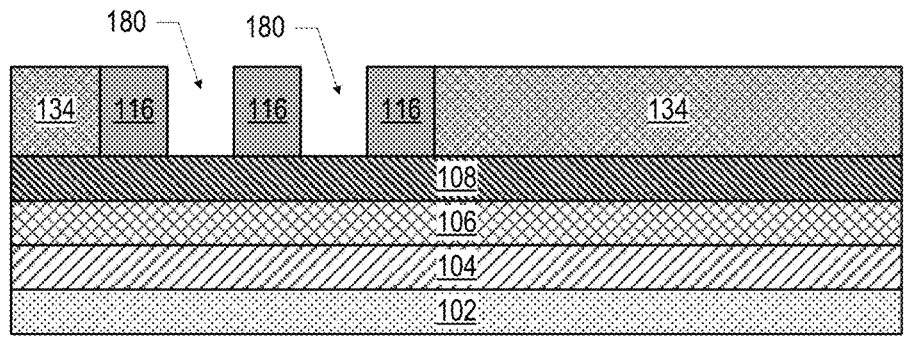

FIG. 9D is a side, cross-sectional view of an assembly subsequent to removing the second component 118 from the assembly of FIG. 9C. The first component 116 may remain in place, and thus the first patterned region 142-1 may include a series of parallel openings 180. In some embodiments, the assembly of FIG. 9C may be treated with an ion implant technique to harden the first component 116 (e.g., PS) prior to removing the second component 118 (e.g., PMMA). In some embodiments, a suitable selective etch technique may be used to remove the second component 118. Removing the second component 118 from the unordered lamellae 132 may result in the partially etched unordered lamellae 134, which may retain a structure like that illustrated in FIG. 10. As discussed above with reference to FIGS. 2G and 2H, the process of performing a DSA operation on the "rough" openings 178 of the assembly of FIG. 9A may result in the "smooth" openings 180 of the assembly of FIG. 9D, and thus the technique of FIG. 9 (and others of the DSA-based techniques disclosed herein) may be said to "rectify" the "rough" openings 178.

Figure 9E:
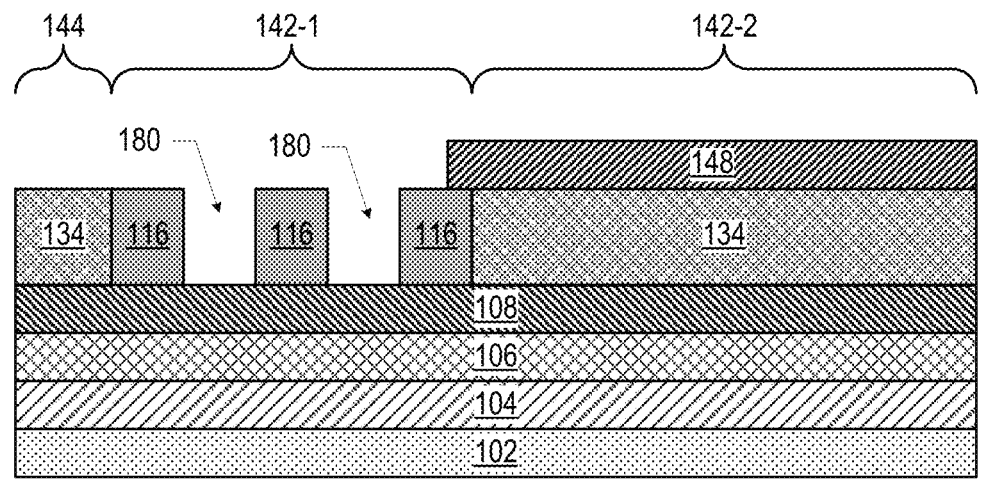

FIG. 9E is a side, cross-sectional view of an assembly subsequent to depositing and patterning a mask material 148 on the assembly of FIG. 9D so as to cover the partially etched unordered lamellae 134 in the second patterned region 142-2. Any suitable mask material 148, and any suitable patterning technique, may be used.

Figure 9F:
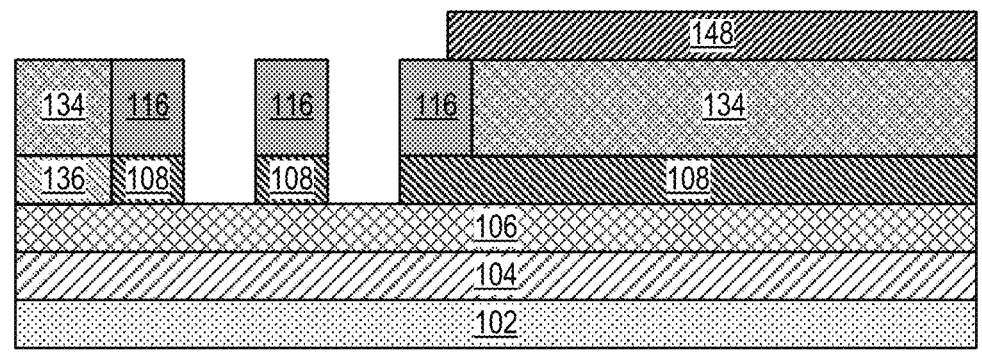

FIG. 9F is a side, cross-sectional view of an assembly subsequent to transferring the pattern of the openings 180 of the assembly of FIG. 9E into the underlying mask material 108. Any suitable etch technique may be used. Transferring the pattern of the openings 180 into the mask material 108 may also result in transferring the unordered lamellar patterns of the exposed partially etched unordered lamellae 134 into the underlying mask material 108 in the unpatterned region 144, yielding the unordered lamellae-patterned mask material 136.

Figure 9G:
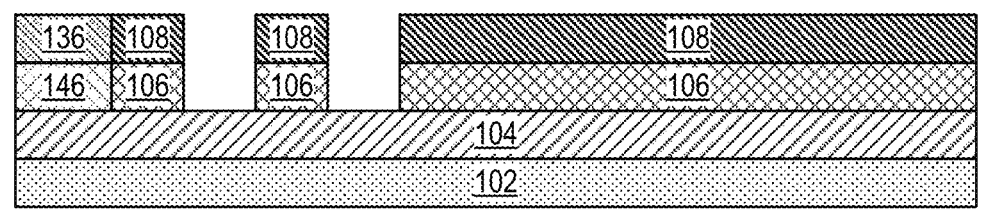

FIG. 9G is a side, cross-sectional view of an assembly subsequent to removing the mask material 148 from the assembly of FIG. 9F, and then removing the first component 116. Any suitable selective etch techniques may be used (e.g., when the first component 116 includes PS, an ash technique may be used).

Figure 9H:
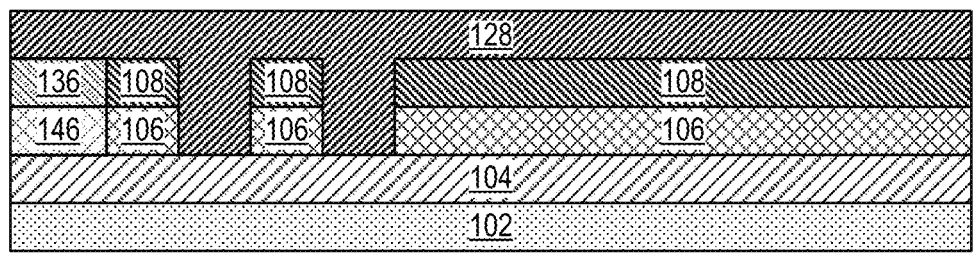

FIG. 9H is a side, cross-sectional view of an assembly subsequent to depositing a mask material 128 on the assembly of FIG. 9G. Any suitable mask material 128 may be used.

Figure 9I:
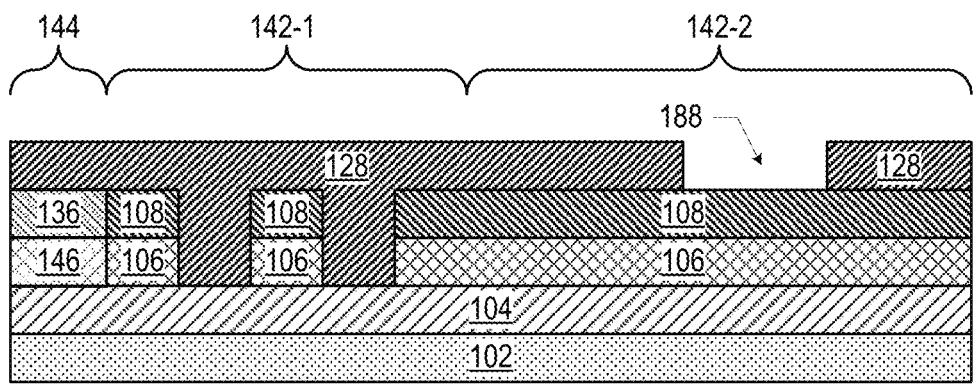

FIG. 9I is a side, cross-sectional view of an assembly subsequent to patterning the mask material 128 in the second patterned region 142-2 to form an opening 188 that will correspond to the high-LER line 170 of FIG. 8. In some embodiments, the opening 188 may be formed using lithographic techniques, and thus may have rough edges.

Figure 9J:
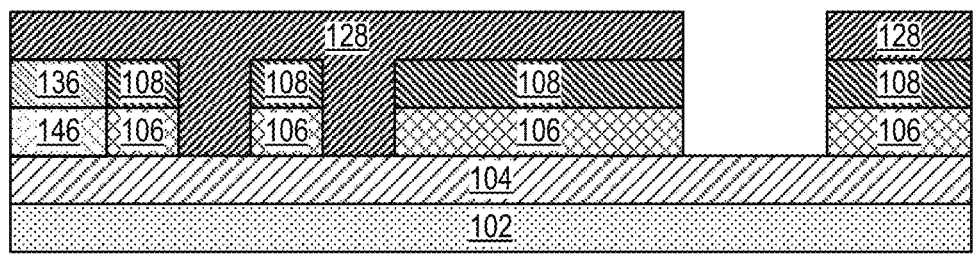

FIG. 9J is a side, cross-sectional view of an assembly subsequent to transferring the pattern of the mask material 128 of the assembly of FIG. 9I into the mask material 108 and the mask material 106. Any suitable etch techniques may be used.

Figure 9K:
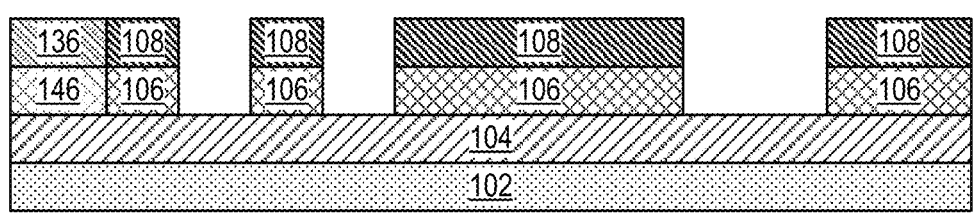

FIG. 9K is a side, cross-sectional view of an assembly subsequent to removing the mask material 128 from the assembly of FIG. 9J. Any suitable etch technique may be used.

Figure 9L:
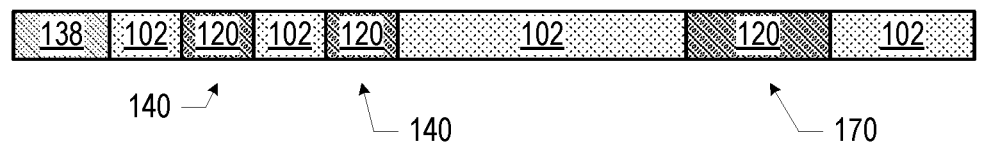
Figure 9M:
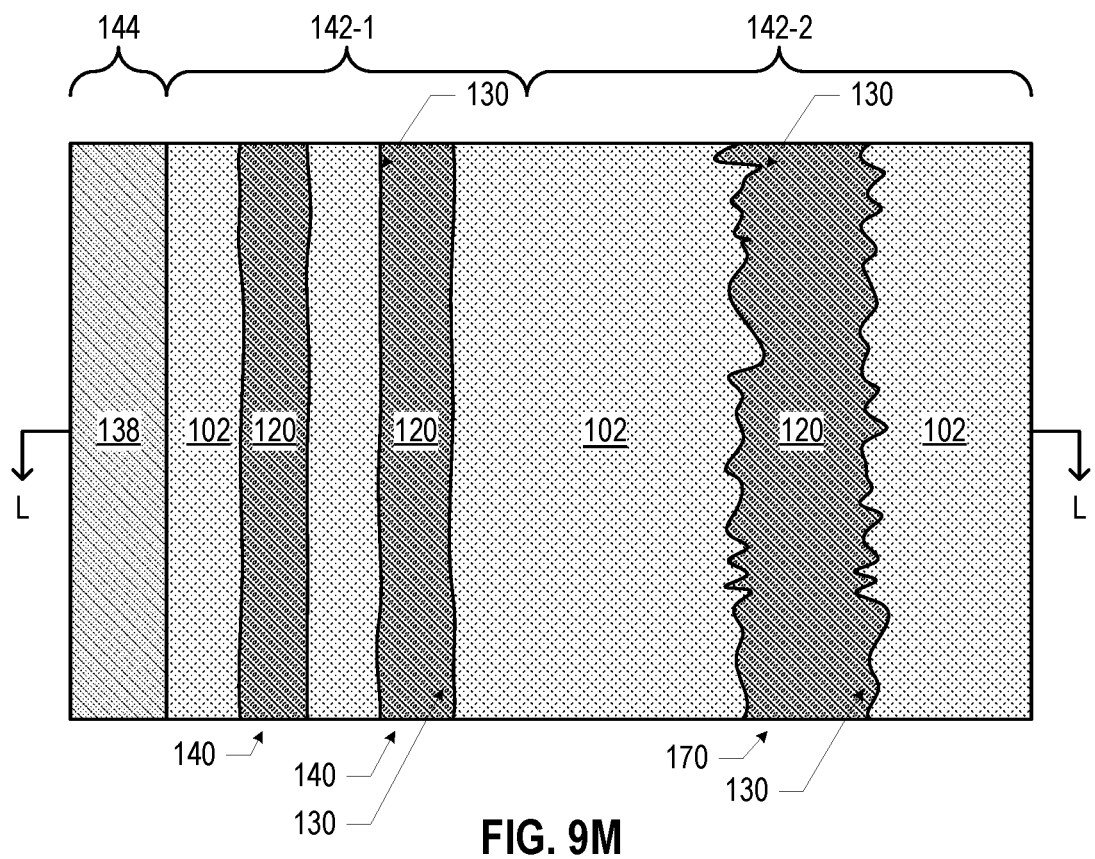

FIG. 9L is a side, cross-sectional view of an assembly subsequent to transferring the pattern of the mask material 108/unordered lamellae-patterned mask material 136 into the dielectric material 102 (through the intermediate mask materials 104 and 106, subsequently removed), and then providing line material 120 in the openings of the dielectric material 102 to form the low-LER lines 140 and the high-LER line 170. The pattern of the unordered lamellae-patterned mask material 136 may be transferred into the dielectric material 102 to form the unordered lamellar structure 138. FIG. 9M is a top view of the assembly of FIG. 9L, illustrating the edges 130 of the low-LER lines 140 and the high-LER line 170. The illustration of FIG. 9L is taken through the section L-L of FIG. 9M. The assembly of FIGS. 9L and 9M may take the form of the microelectronic structure 100 of FIG. 8.

Figure 10A:
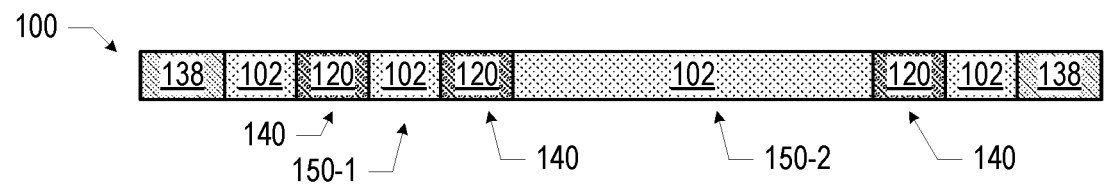
FIGS. 10A-10B are various views of another microelectronic structure including lines having low LER, in accordance with various embodiments.
Figure 10B:
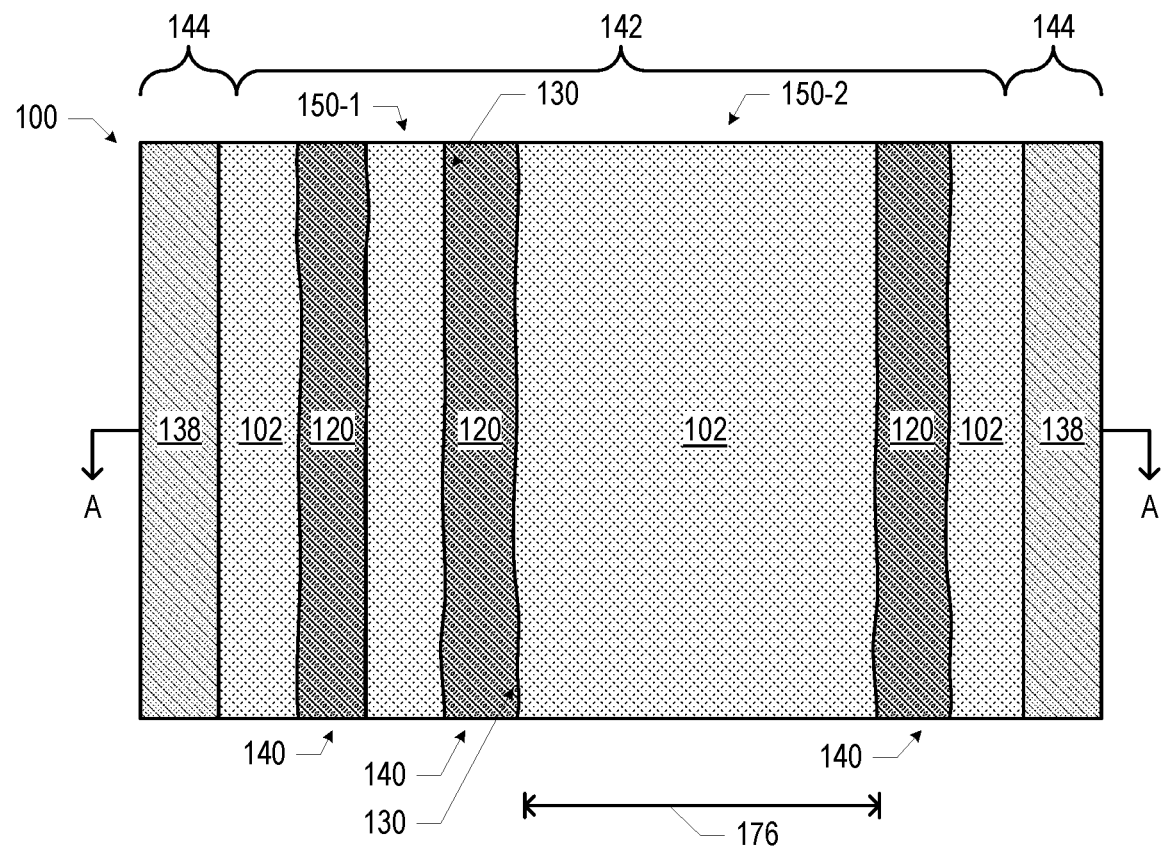

In some embodiments, the spacing 176 between adjacent low-LER lines 140 may be increased by selective depopulation using a DSA-based technique. For example, FIGS. 10A-10B are various views of another microelectronic structure 100 including low-LER lines 140, in accordance with various embodiments. FIG. 10A is a side, cross-sectional view of the microelectronic structure 100 through the section A-A of FIG. 10B, and FIG. 10B is a top view of the microelectronic structure 100; the unordered lamellar structure 138 of the microelectronic structure 100 of FIG. 10 may take the form illustrated in FIG. 10. The embodiment of FIG. 10 shares a number of elements with preceding embodiments; for ease of discussion, a description of these elements is not repeated, and these elements may take the form of any of the embodiments of these elements disclosed herein. Relative to the embodiment of FIG. 1, the microelectronic structure 100 of FIG. 10 includes smaller inter-line spaces 150-1 and larger inter-line spaces 150-2 between adjacent low-LER lines 140. The particular arrangement of smaller inter-line spaces 150-1 and larger inter-line spaces 150-2 is simply illustrative, and any desired arrangement may be included in a microelectronic structure 100 in accordance with the techniques disclosed herein.

Figure 11A:
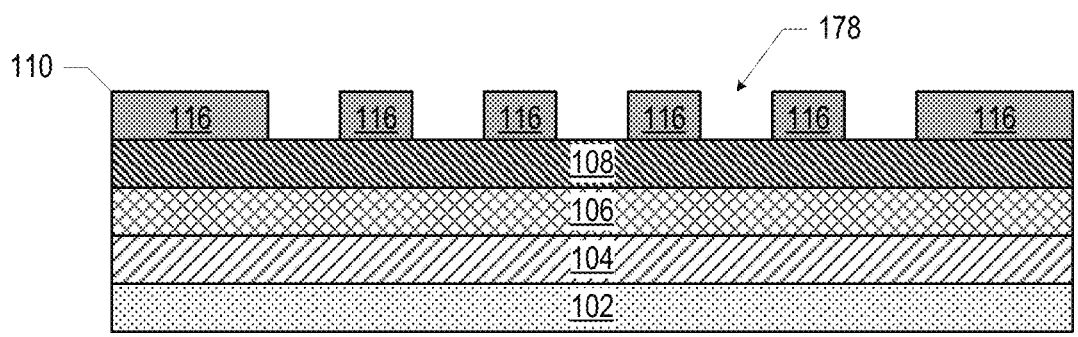
FIGS. 11A-11H illustrate stages in an example process of manufacturing the microelectronic structure of FIG. 10, in accordance with various embodiments.

FIGS. 11A-11H illustrate stages in an example process of manufacturing the microelectronic structure of FIG. 10, in accordance with various embodiments. FIG. 11A is a side, cross-sectional view of an assembly like that of FIGS. 2C and 9A, including a patterned initial brush 110. The assembly of FIG. 11A may be formed in accordance with any of the fabrication techniques discussed herein with reference to FIG. 2C. Like the assembly of FIG. 2C, openings 178 may be patterned into the first component 116 using lithographic techniques, and thus may have highly rough edges.

Figure 11B:
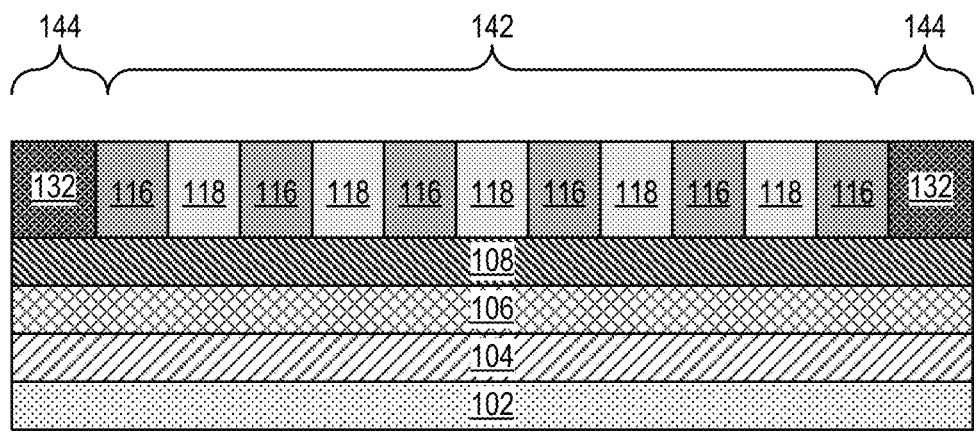

FIG. 11B is a side, cross-sectional view of an assembly subsequent to depositing a BCP (e.g., a BCP 114 as discussed above, not shown) on the assembly of FIG. 11A, and then treating the resulting assembly in order to cause the BCP to self-assemble in accordance with the template provided by the brush 110. The resulting assembly includes alternating vertically oriented regions of the first component 116 and the second component 118 in the patterned region 142. Outside the patterned region 142, the brush 110 may not provide a surface on which the BCP readily self-assembles into alternating vertically oriented regions of the first component 116 and the second component 118, and so instead, the BCP 114 in the unpatterned region 144 may self-assemble into unordered lamellae 132 of the first component 116 and the second component 118; the unordered lamellae 132 may have a structure like that illustrated in FIG. 10.

Figure 11C:
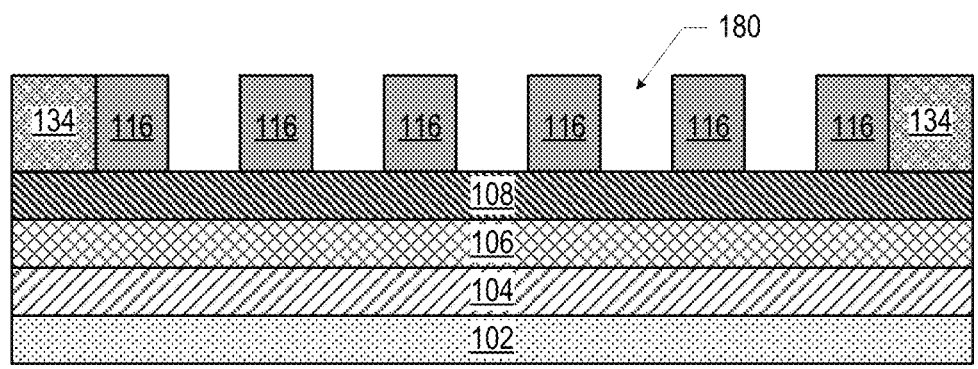

FIG. 11C is a side, cross-sectional view of an assembly subsequent to removing the second component 118 from the assembly of FIG. 11B. The first component 116 may remain in place, and thus the patterned region 142 may include a series of parallel openings 180. In some embodiments, the assembly of FIG. 11B may be treated with an ion implant technique to harden the first component 116 (e.g., PS) prior to removing the second component 118 (e.g., PMMA). In some embodiments, a suitable selective etch technique may be used to remove the second component 118. Removing the second component 118 from the unordered lamellae 132 may result in the partially etched unordered lamellae 134, which may retain a structure like that illustrated in FIG. 10. As discussed above with reference to FIGS. 2G and 2H, the process of performing a DSA operation on the "rough" openings 178 of the assembly of FIG. 11A may result in the "smooth" openings 180 of the assembly of FIG. 11C, and thus the technique of FIG. 11 (and others of the DSA-based techniques disclosed herein) may be said to "rectify" the "rough" openings 178.

Figure 11D:
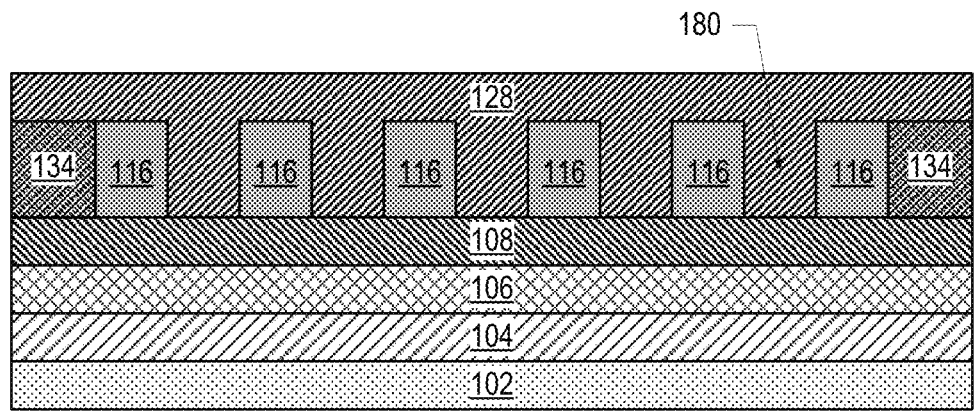

FIG. 11D is a side, cross-sectional view of an assembly subsequent to depositing a mask material 128 over the assembly of FIG. 11C. Any suitable mask material 128 may be used.

Figure 11E:
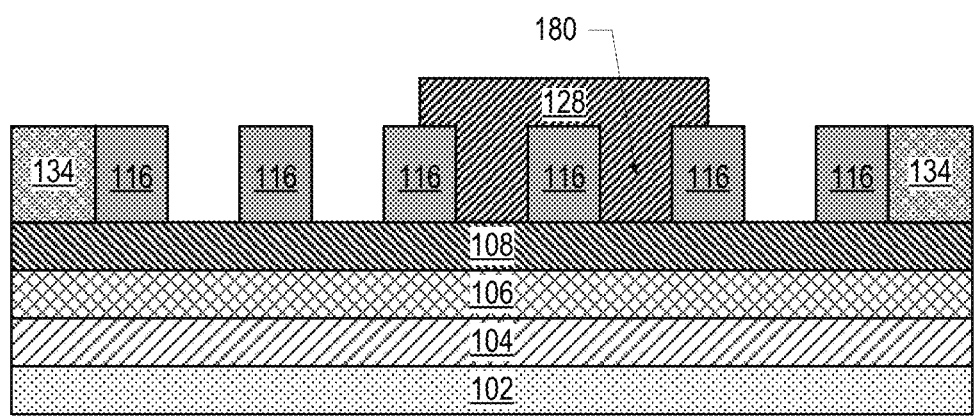

FIG. 11E is a side, cross-sectional view of an assembly subsequent to patterning the mask material 128 of the assembly of FIG. 11D to cover the openings 180 in a region that will correspond to the larger inter-line space 150-2 between adjacent low-LER lines 140. Any suitable patterning technique may be used.

Figure 11F:
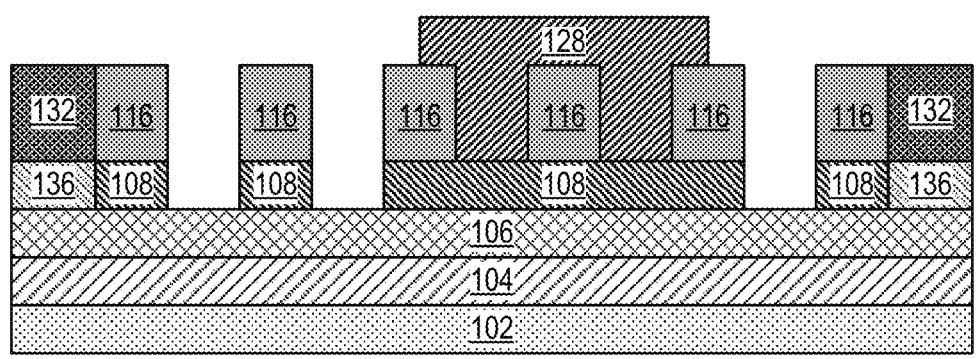

FIG. 11F is a side, cross-sectional view of an assembly subsequent to transferring the pattern of the exposed openings 180 of the assembly of FIG. 11E into the underlying mask material 108. Any suitable etch technique may be used. Transferring the pattern of the openings 180 into the mask material 108 may also result in transferring the unordered lamellar patterns of the exposed partially etched unordered lamellae 134 into the underlying mask material 108 in the unpatterned region 144, yielding the unordered lamellae-patterned mask material 136.

Figure 11G:
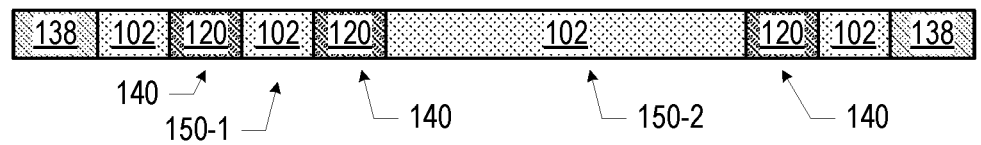
Figure 11H:
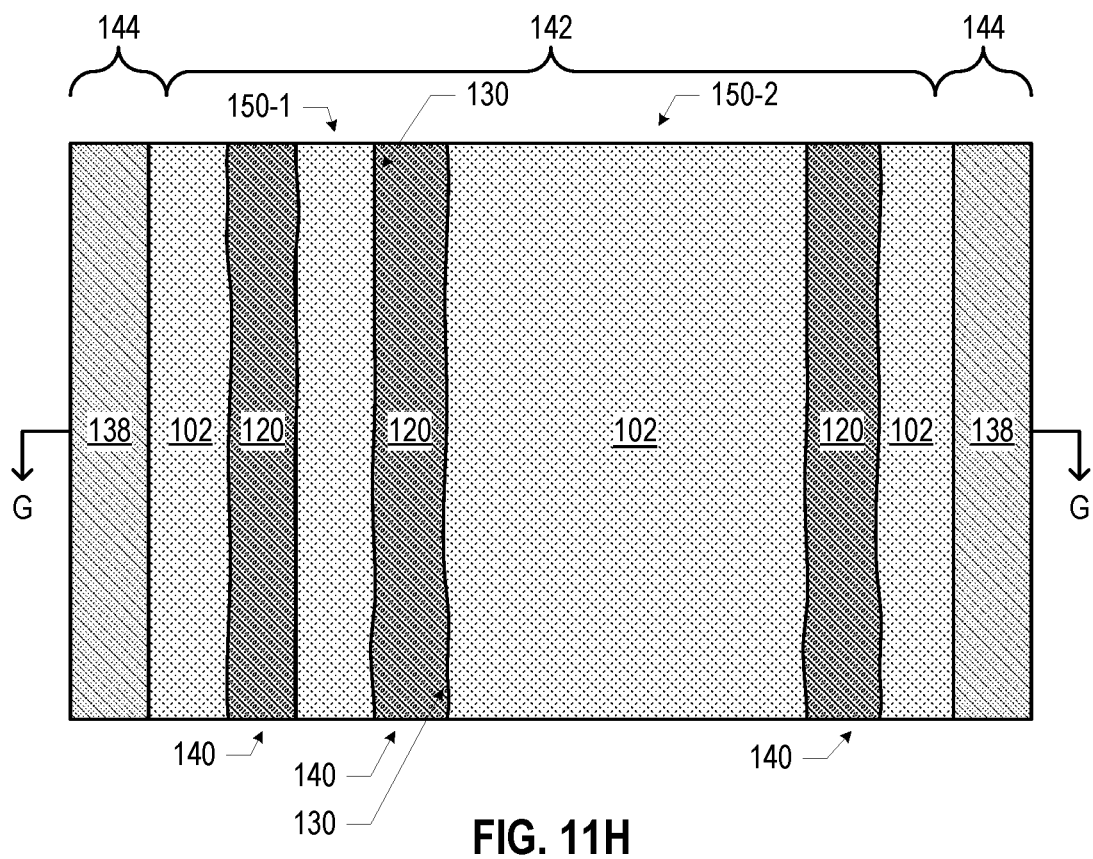

FIG. 11G is a side, cross-sectional view of an assembly subsequent to removing the mask material 128 from the assembly of FIG. 11F, transferring the pattern of the mask material 108/unordered lamellae-patterned mask material 136 into the dielectric material 102 (through the intermediate mask materials 104 and 106, subsequently removed), and then providing line material 120 in the openings of the dielectric material 102 to form the low-LER lines 140. The pattern of the unordered lamellae-patterned mask material 136 may be transferred into the dielectric material 102 to form the unordered lamellar structure 138. FIG. 11H is a top view of the assembly of FIG. 11G, illustrating the edges 130 of the low-LER lines 140, the smaller inter-line spaces 150-1, and a larger inter-line space 150-2. The illustration of FIG. 11G is taken through the section G-G of FIG. 11H. The assembly of FIGS. 11G and 11H may take the form of the microelectronic structure 100 of FIG. 10.

FIGS. 1-24 illustrate example microelectronic structures 100 and examples of methods of manufacture of such microelectronic structures 100. Any of the features discussed with reference to any of FIGS. 1-24 herein may be combined with any other features to form a microelectronic structure 100. For example, FIGS. 3 and 4 illustrate an embodiment in spacer-based techniques are used to reduce the pitch of low-LER lines 140, FIGS. 8 and 9 illustrate an embodiment including both low-LER lines 140 and high-LER lines 170, and FIGS. 10 and 11 illustrate an embodiment in which the spacing between various pairs of adjacent low-LER lines 140 is increased by selective depopulation. These features of FIGS. 3, 4, 8, 9, 10, and 11 may be combined so that a microelectronic structure 100 includes reduced pitch low-LER lines 140, both low-LER lines 140 and high-LER lines 170, and increased spacing between various pairs of low-LER lines 140. Such an embodiment of a microelectronic structure 100 is illustrated in FIG. 12, and a method of manufacturing the microelectronic structure 100 of FIG. 12 is illustrated in FIG. 13. However, this particular combination is simply an example, and any combination may be used.

Figure 12A:
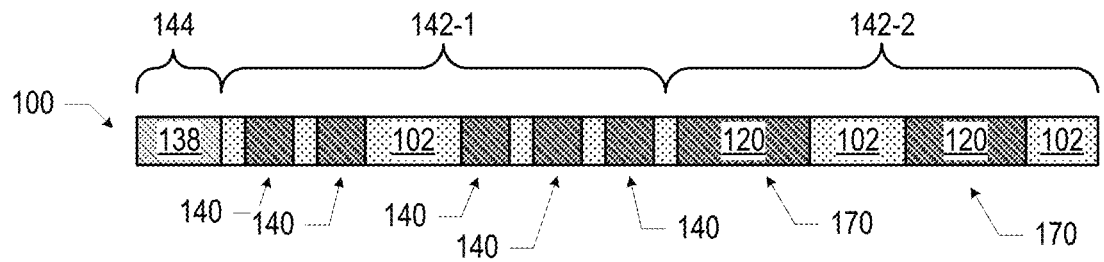
FIGS. 12A-12B are various views of another microelectronic structure including lines having low LER and lines having high LER, in accordance with various embodiments.
Figure 12B:
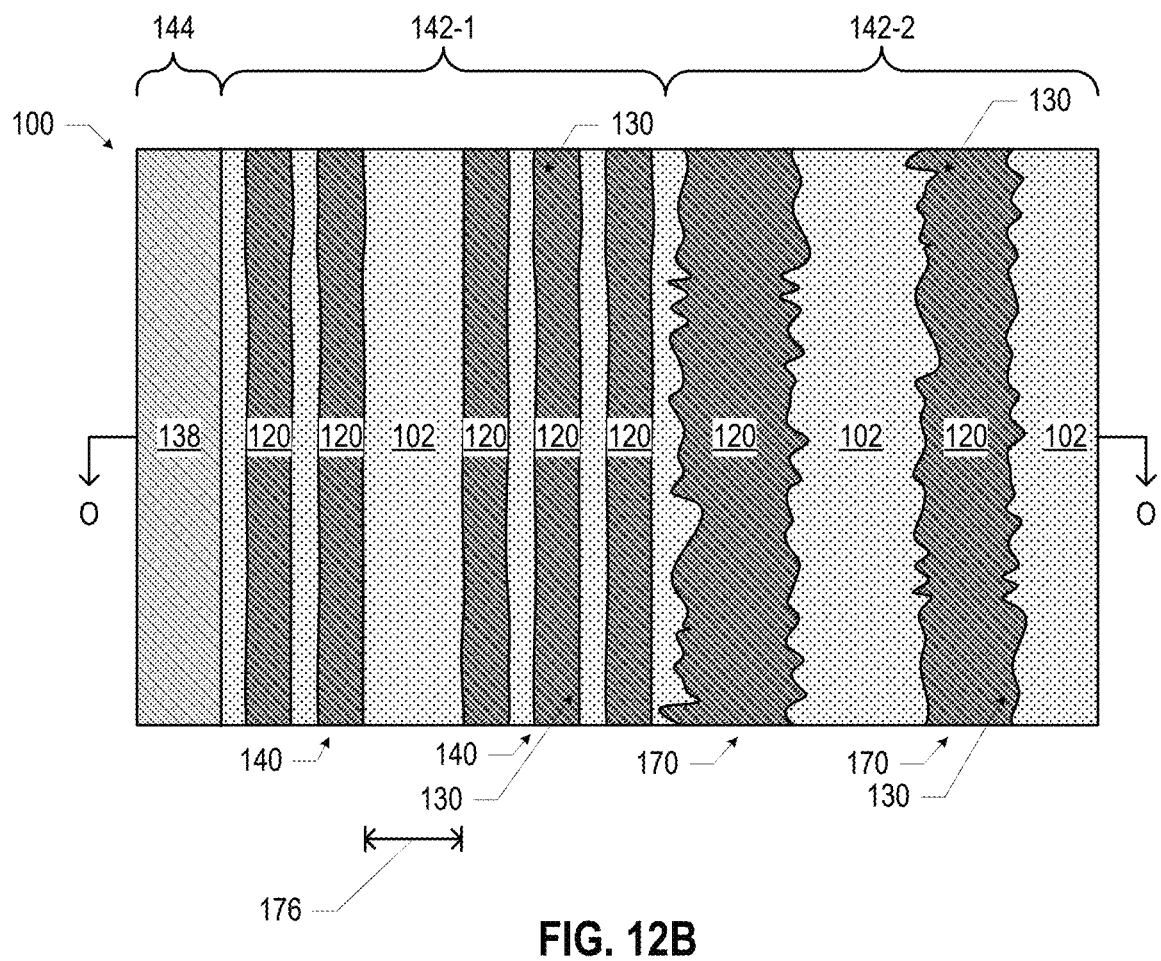

As noted above, FIGS. 12A-12B are various views of another microelectronic structure 100 including low-LER lines 140 and high-LER lines 170, in accordance with various embodiments. FIG. 12A is a side, cross-sectional view of the microelectronic structure 100 through the section A-A of FIG. 12B, and FIG. 12B is a top view of the microelectronic structure 100; the unordered lamellar structure 138 of the microelectronic structure 100 of FIG. 12 may take the form illustrated in FIG. 10. The embodiment of FIG. 12 shares a number of elements with preceding embodiments; for ease of discussion, a description of these elements is not repeated, and these elements may take the form of any of the embodiments of these elements disclosed herein. Relative to the embodiment of FIG. 1, the microelectronic structure 100 includes reduced pitch low-LER lines 140, both low-LER lines 140 and high-LER lines 170, and increased spacing 176 between various pairs of low-LER lines 140.

Figure 13A:
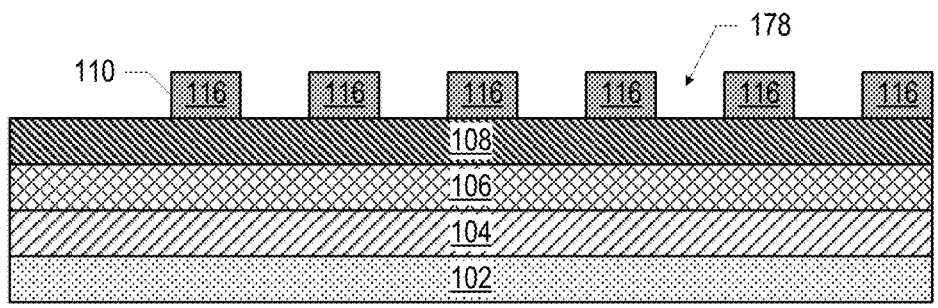
FIGS. 13A-13P illustrate stages in an example process of manufacturing the microelectronic structure of FIG. 12, in accordance with various embodiments.
Figure 13B:
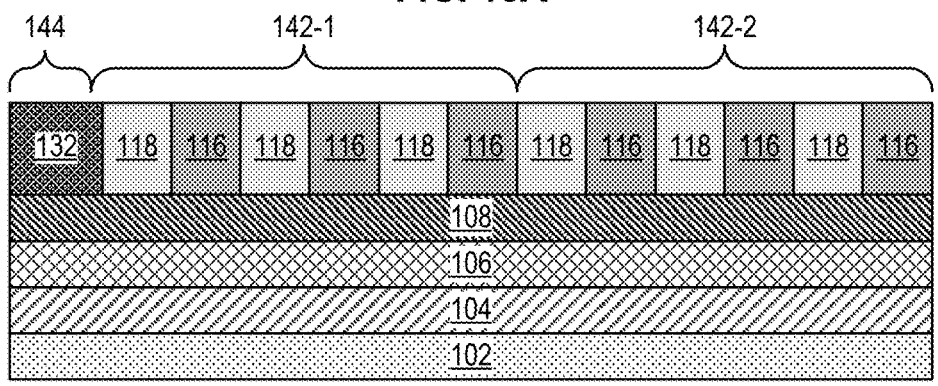
Figure 13C:
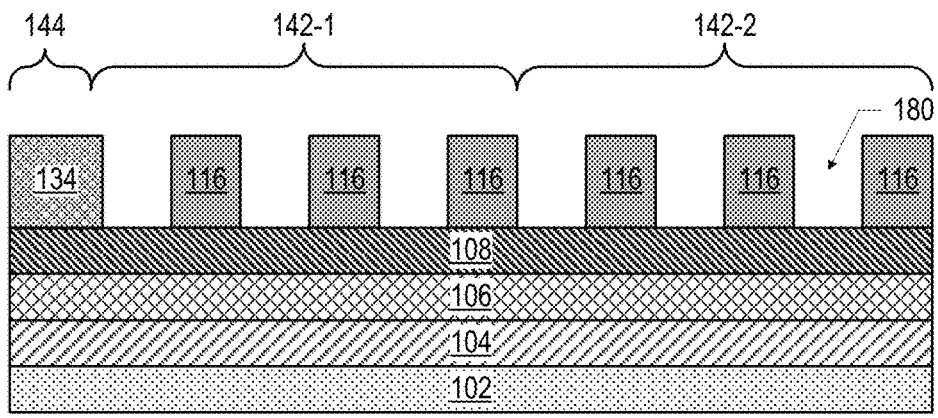
Figure 13D:
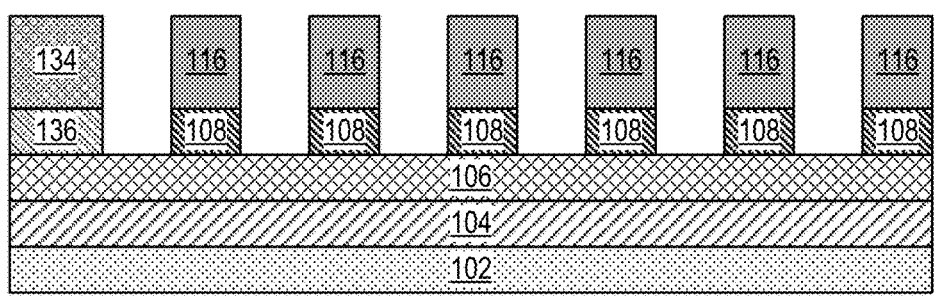
Figure 13E:
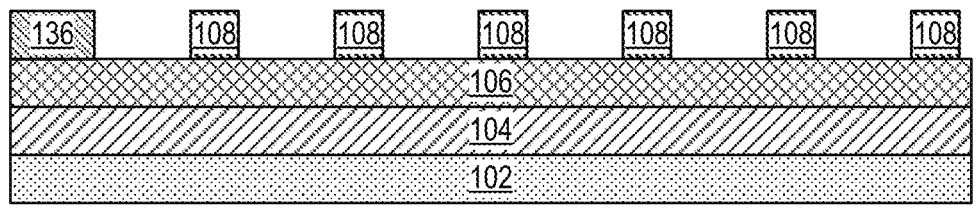
Figure 13F:
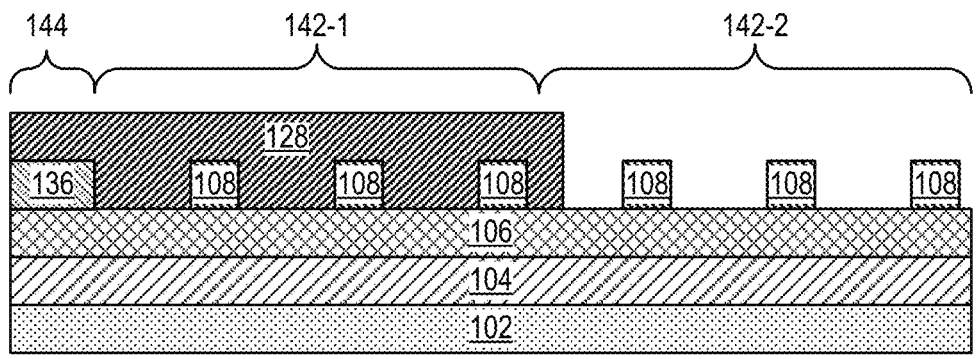
Figure 13G:
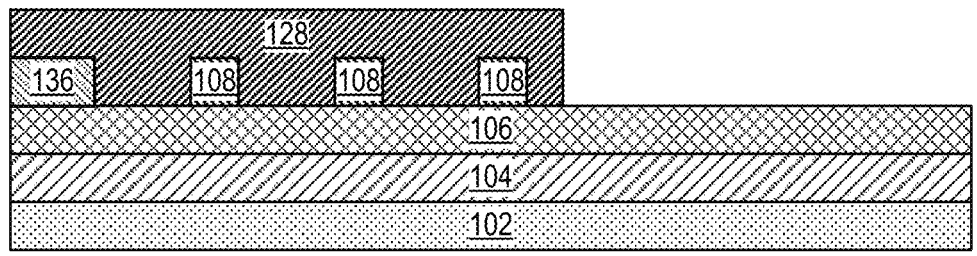
Figure 13H:
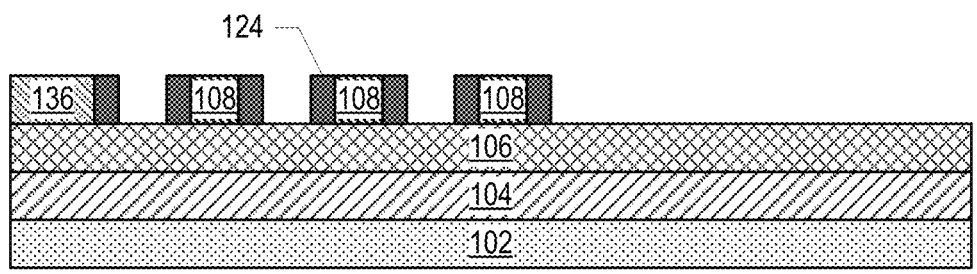
Figure 13I:
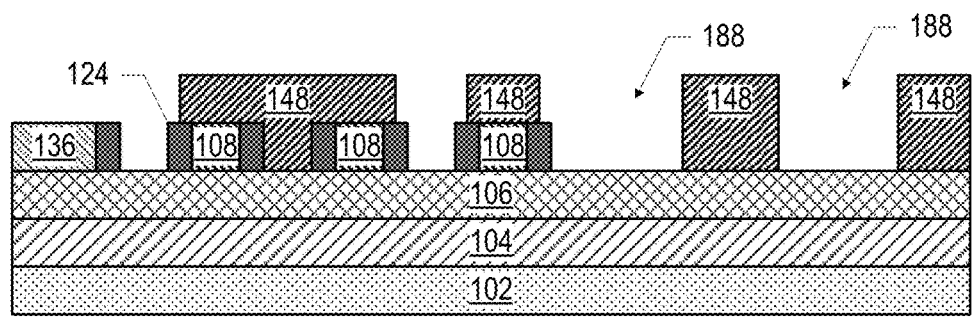
Figure 13J:
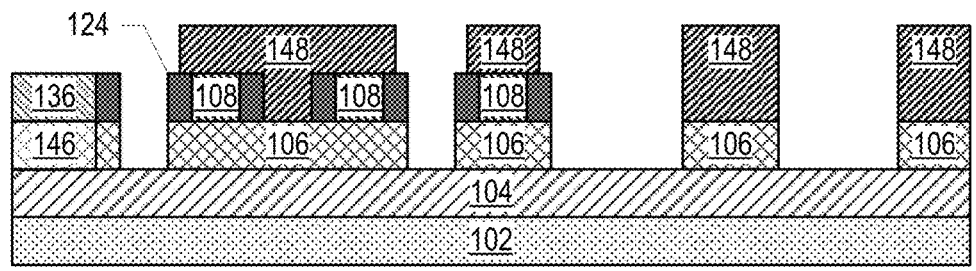
Figure 13K:
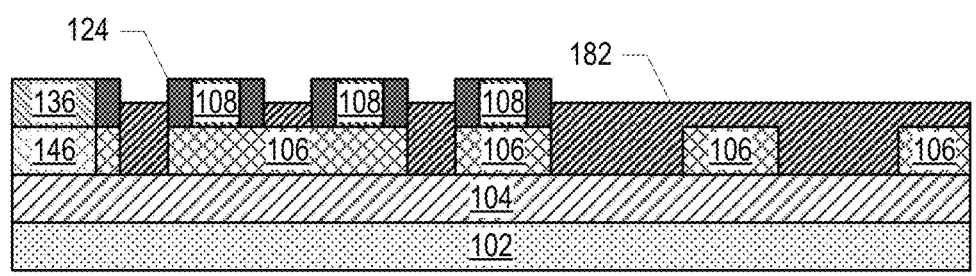
Figure 13L:
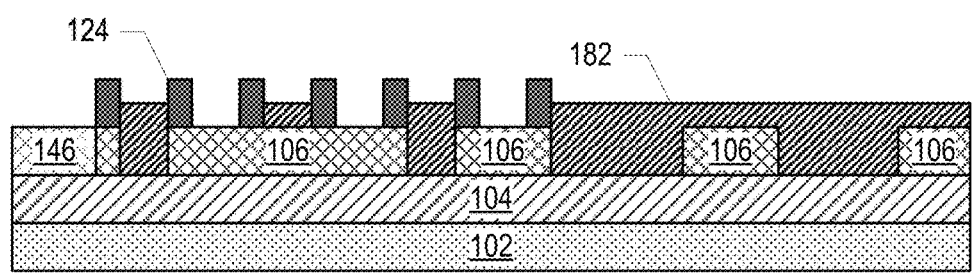
Figure 13M:
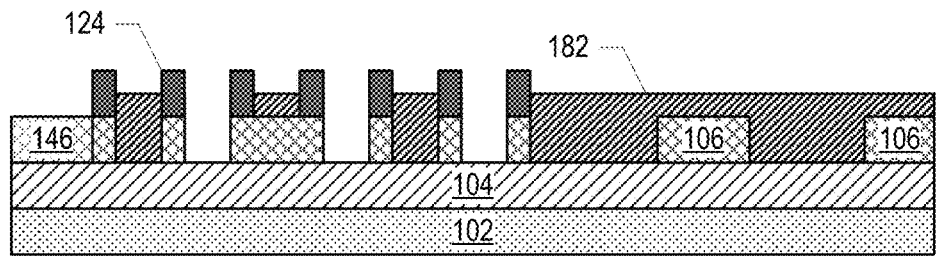
Figure 13N:
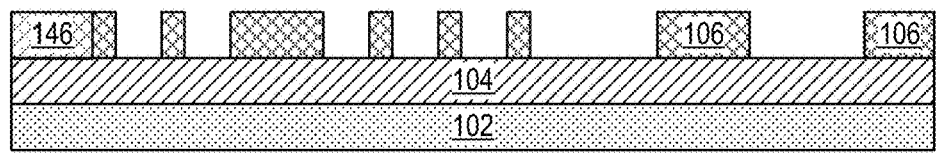
Figure 13O:
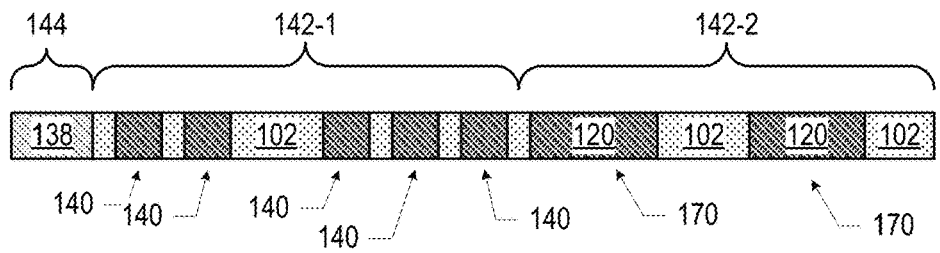
Figure 13P:
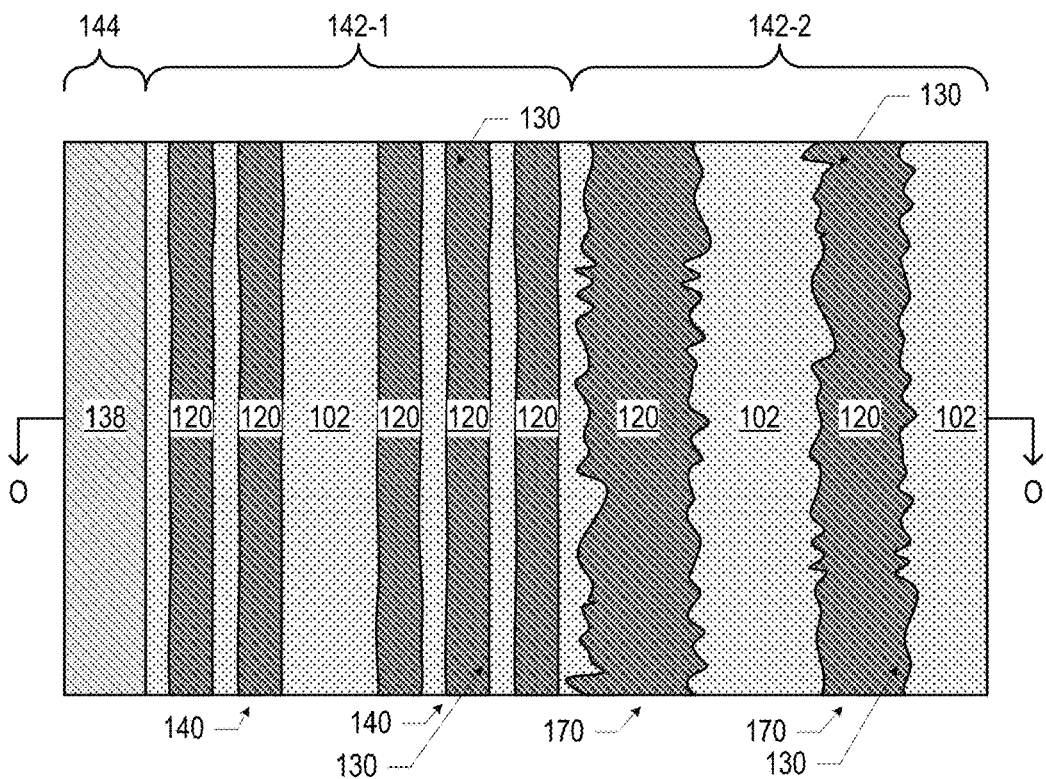

FIGS. 13A-13P illustrate stages in an example process of manufacturing the microelectronic structure of FIG. 12, in accordance with various embodiments. FIG. 13A is a side, cross-sectional view of an assembly like that of FIGS. 2C, 9A, and 11A, including a patterned initial brush 110. The assembly of FIG. 13A may be formed in accordance with any of the fabrication techniques discussed herein with reference to FIG. 2C. Like the assembly of FIG. 2C, openings 178 may be patterned into the first component 116 using lithographic techniques, and thus may have highly rough edges.

FIG. 13B is a side, cross-sectional view of an assembly subsequent to depositing a BCP (e.g., a BCP 114 as discussed above, not shown) on the assembly of FIG. 13A, and then treating the resulting assembly in order to cause the BCP to self-assemble in accordance with the template provided by the brush 110. The resulting assembly includes alternating vertically oriented regions of the first component 116 and the second component 118 in the patterned region 142. Outside the patterned region 142, the brush 110 may not provide a surface on which the BCP readily self-assembles into alternating vertically oriented regions of the first component 116 and the second component 118, and so instead, the BCP 114 in the unpatterned region 144 may self-assemble into unordered lamellae 132 of the first component 116 and the second component 118; the unordered lamellae 132 may have a structure like that illustrated in FIG. 10.

FIG. 13C is a side, cross-sectional view of an assembly subsequent to removing the second component 118 from the assembly of FIG. 13B. The first component 116 may remain in place, and thus the patterned region 142 may include a series of parallel openings 180. In some embodiments, the assembly of FIG. 13B may be treated with an ion implant technique to harden the first component 116 (e.g., PS) prior to removing the second component 118 (e.g., PMMA). In some embodiments, a suitable selective etch technique may be used to remove the second component 118. Removing the second component 118 from the unordered lamellae 132 may result in the partially etched unordered lamellae 134, which may retain a structure like that of FIG. 10. As discussed above with reference to FIGS. 2G and 2H, the process of performing a DSA operation on the "rough" openings 178 of the assembly of FIG. 13A may result in the "smooth" openings 180 of the assembly of FIG. 13C, and thus the technique of FIG. 13 (and others of the DSA-based techniques disclosed herein) may be said to "rectify" the "rough" openings 178.

FIG. 13D is a side, cross-sectional view of an assembly subsequent to transferring the pattern of the openings 180 of the assembly of FIG. 13C into the underlying mask material 108. Any suitable etch technique may be used. Transferring the pattern of the openings 180 into the mask material 108 may also result in transferring the unordered lamellar patterns of the partially etched unordered lamellae 134 into the underlying mask material 108 in the unpatterned region 144, yielding the unordered lamellae-patterned mask material 136.

FIG. 13E is a side, cross-sectional view of an assembly subsequent to removing the first component 116 (and thus the partially etched unordered lamellae 134) from the assembly of FIG. 13D. Any suitable etch technique may be used (e.g., an ash technique when the first component 116 includes PS).

FIG. 13F is a side, cross-sectional view of an assembly subsequent to depositing a mask material 128 over the assembly of FIG. 13E, and patterning the mask material 128 to cover the mask material 108 (and thus the unordered lamellae-patterned mask material 136) in the unpatterned region 144 and the first patterned region 142-1, while exposing the mask material 108 in the second patterned region 142-2. Any suitable mask material 128 may be used.

FIG. 13G is a side, cross-sectional view of an assembly subsequent to removing the exposed mask material 108 (in the second patterned region 142-2) from the assembly of FIG. 13F. Any suitable etch technique may be used.

FIG. 13H is a side, cross-sectional view of an assembly subsequent to removing the mask material 128 from the assembly of FIG. 13G, and forming spacers 124 at the side faces of the remaining patterned mask material 108. The spacers 124 may include a dielectric material, and may be fabricated using any known spacer technique (e.g., a conformal deposition of the dielectric material, followed by a "downward" directional etch to remove the dielectric material on horizontal surfaces and leave the dielectric material in place on side faces).

FIG. 13I is a side, cross-sectional view of an assembly subsequent to depositing and patterning a mask material 148 on the assembly of FIG. 13H to selectively cover desired portions of the mask material 108, spaces in between the mask material 108, and portions of the mask material 106 in the second patterned region 142-2, as shown. Any suitable mask material 148 and selective etch technique may be used. The openings 188 in the mask material 128 in the second patterned region 142-2 will correspond to the high-LER lines 170 of FIG. 12. In some embodiments, the openings 188 may be formed using lithographic techniques, and thus may have rough edges.

FIG. 13J is a side, cross-sectional view of an assembly subsequent to transferring the pattern of the mask material 108/spacer material 124/mask material 148 of the assembly of FIG. 13I into the underlying mask material 106. Any suitable selective etch technique may be used. The pattern of the unordered lamellae-patterned mask material 136 may be transferred into the mask material 106 in the unpatterned region 144, yielding the unordered lamellae-patterned mask material 146.

FIG. 13K is a side, cross-sectional view of an assembly subsequent to depositing a mask material 182 on the assembly of FIG. 13J, and then recessing the mask material 182 to expose the top surfaces of the mask material 108 (and therefore the unordered lamellae-patterned mask material 136) and the spacers 124. Any suitable mask material 182 and recess technique may be used.

FIG. 13L is a side, cross-sectional view of an assembly subsequent to removing the exposed mask material 108 (and therefore the unordered lamellae-patterned mask material 136) from the assembly of FIG. 13K, selectively exposing the underlying mask material 106. Any suitable selective etch technique may be used.

FIG. 13M is a side, cross-sectional view of an assembly subsequent to removing the exposed mask material 106 from the assembly of FIG. 13L. Any suitable selective etch technique may be used.

FIG. 13N is a side, cross-sectional view of an assembly subsequent to removing the spacers 124 and the mask material 182 from the assembly of FIG. 13M. Any suitable selective etch techniques may be used.

FIG. 13O is a side, cross-sectional view of an assembly subsequent to transferring the pattern of the mask material 106/unordered lamellae-patterned mask material 146 of the assembly of FIG. 13N into the dielectric material 102 (through the intermediate mask material 104, subsequently removed), and then providing line material 120 in the openings of the dielectric material 102 to form the low-LER lines 140 and the high-LER lines 170. The pattern of the unordered lamellae-patterned mask material 146 may be transferred into the dielectric material 102 to form the unordered lamellar structure 138. FIG. 13P is a top view of the assembly of FIG. 13O, illustrating the edges 130 of the low-LER lines 140 and the high-LER line 170, as well as the selectively variable inter-line spaces. The illustration of FIG. 13O is taken through the section O-O of FIG. 13P. The assembly of FIGS. 13O and 13P may take the form of the microelectronic structure 100 of FIG. 12.

Figure 14A:
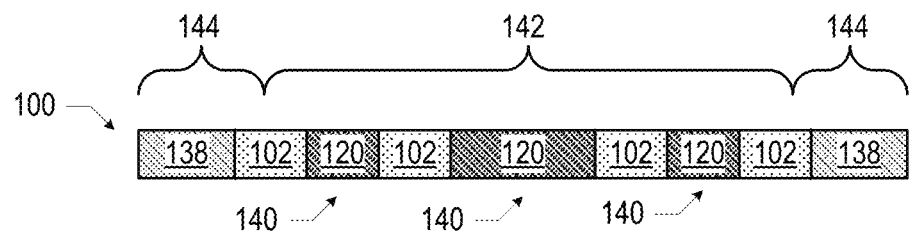
FIGS. 14A-14B are various views of another microelectronic structure including lines having low LER, in accordance with various embodiments.
Figure 14B:
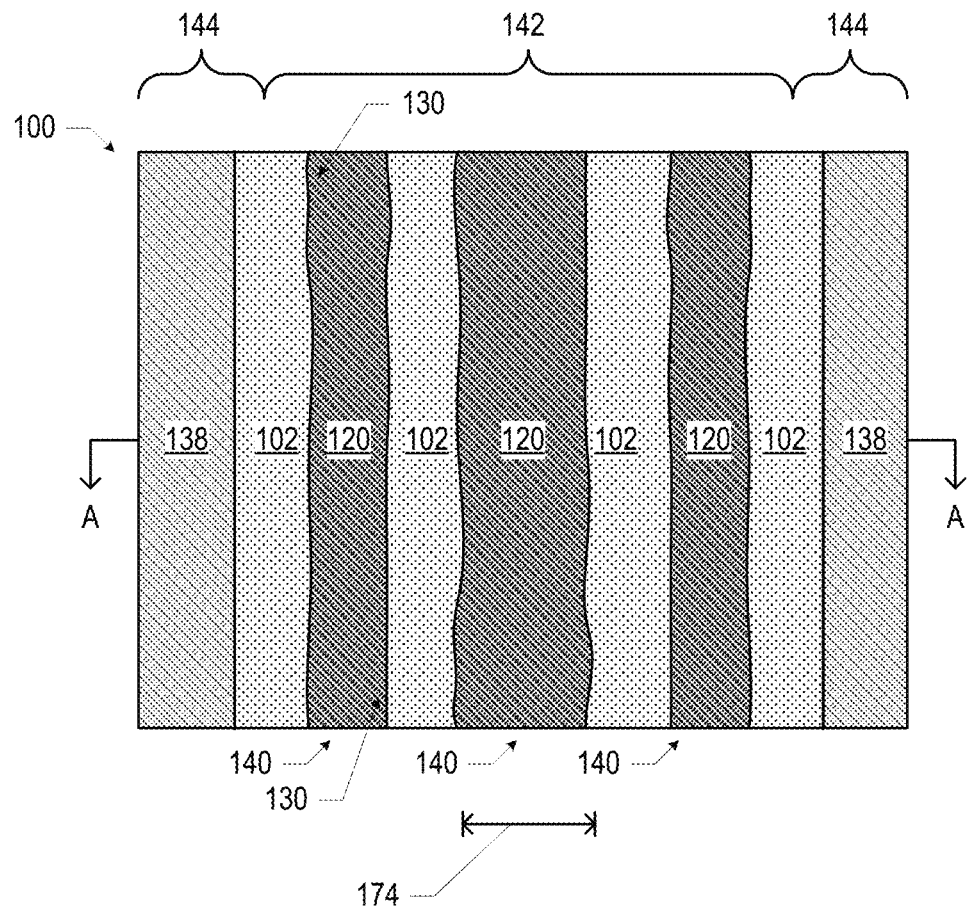

As noted above, a BCP may be capable of self-assembling into multiple different arrangements. For example, a BCP may be capable of forming both the vertically oriented repeating structures illustrated in various ones of the preceding drawings, as well as horizontally oriented repeating structures. Whether such a BCP forms a vertically oriented repeating structure, a horizontally oriented repeating structure, or an unordered structure may depend on the pattern of the underlying brush 110, the composition of the BCP, and the conditions under which the BCP undergoes DSA; these variables may be adjusted to achieve a desired result. The opportunity to form horizontally oriented repeating structures may be utilized to manufacture low-LER lines 140 having different line widths 174. For example, FIGS. 14A-14B are various views of another microelectronic structure 100 including low-LER lines 140 having different line widths 174, in accordance with various embodiments. FIG. 14A is a side, cross-sectional view of the microelectronic structure 100 through the section A-A of FIG. 14B, and FIG. 14B is a top view of the microelectronic structure 100; the unordered lamellar structure 138 of the microelectronic structure 100 of FIG. 14 may take the form illustrated in FIG. 10. The embodiment of FIG. 14 shares a number of elements with preceding embodiments; for ease of discussion, a description of these elements is not repeated, and these elements may take the form of any of the embodiments of these elements disclosed herein. Relative to the embodiment of FIG. 1, the microelectronic structure 100 of FIG. 14 includes a low-LER lines 140 having different line widths 174 (i.e., with the middle low-LER line 140 having a greater line width 174 than the adjacent low-LER lines 140).

Figure 15A:
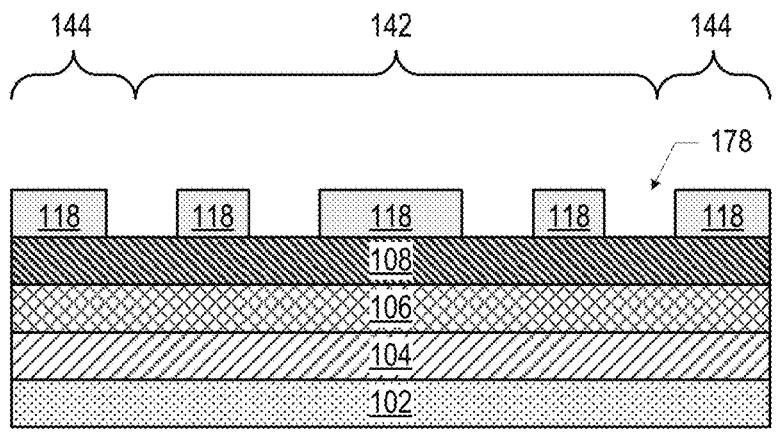
FIGS. 15A-15G illustrate stages in an example process of manufacturing the microelectronic structure of FIG. 14, in accordance with various embodiments.

FIGS. 15A-15G illustrate stages in an example process of manufacturing the microelectronic structure 100 of FIG. 14, in accordance with various embodiments. FIG. 15A is a side, cross-sectional view of an assembly like that of FIG. 2C, including a patterned initial brush 110; the initial brush 110 of FIG. 15A may include the second component 118, instead of the first component 116. The assembly of FIG. 15A may be formed in accordance with any of the fabrication techniques discussed herein with reference to FIG. 2C. Like the assembly of FIG. 2C, the openings 178 in the brush 110 may be patterned using lithographic techniques, and thus may have highly rough edges. Note that the central portion of the second component 118 of the brush 110 is wider than other portions of the second component 118 in the patterned region 142.

Figure 15B:
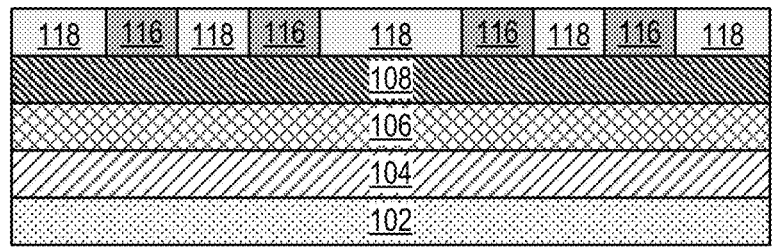

FIG. 15B is a side, cross-sectional view of an assembly subsequent to "filling in" the openings 178 in the brush 110 of FIG. 15A with the first component 116 to "complete" the brush 110, as discussed above with reference to FIG. 3. In other embodiments, this operation is not performed before proceeding to subsequent operations.

Figure 15C:
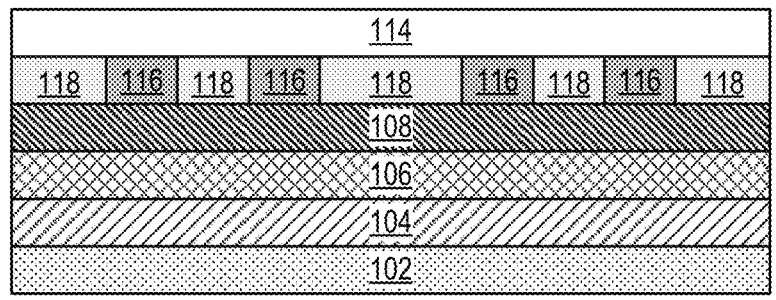

FIG. 15C is a side, cross-sectional view of an assembly subsequent to depositing a BCP 114 on the assembly of FIG. 15B. As noted above, the brush 110 and the BCP 114 may be selected so as to achieve a desired DSA behavior. In the embodiment of FIG. 15, the BCP 114 may include a first component 116 and a second component 118.

Figure 15D:
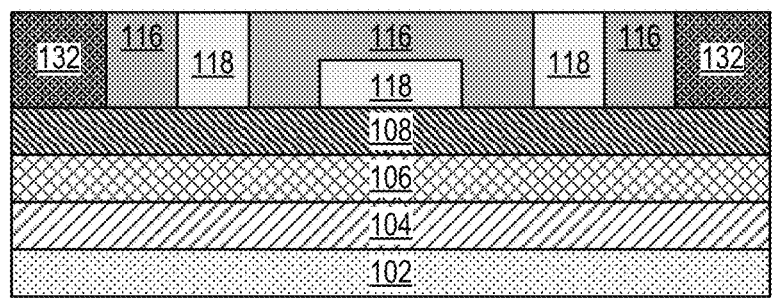

FIG. 15D is a side, cross-sectional view of an assembly subsequent to treating the assembly of FIG. 15C to cause the BCP 114 to self-assemble in accordance with the template provided by the brush 110. The resulting assembly includes alternating vertically oriented regions of the first component 116 and the second component 118, as well as a horizontally oriented region of the first component 116 (formed over the "wider" portion of the second component 118 in the patterned region 142). Outside the patterned region 142, the brush 110 may not provide a surface on which the BCP 114 readily self-assembles into alternating vertically oriented regions of the first component 116 and the second component 118 (or into alternating horizontally oriented regions of the first component 116 and the second component 118), and so instead, the BCP 114 in the unpatterned region 144 may self-assemble into unordered lamellae 132 of the first component 116 and the second component 118; the unordered lamellae 132 may have a structure like that illustrated in FIG. 10.

Figure 15E:
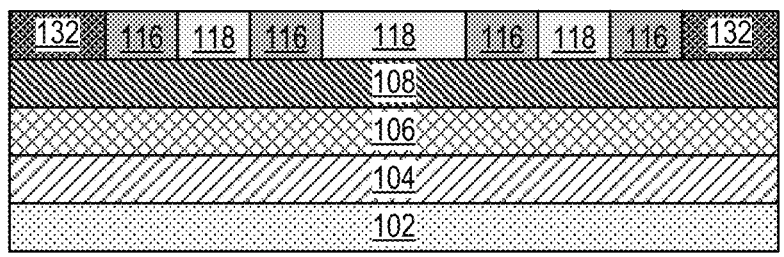

FIG. 15E is a side, cross-sectional view of an assembly subsequent to planarizing the assembly of FIG. 15D to remove the upper portion of the first component 116, second component 118, and the unordered lamellae 132 (e.g., using a CMP technique).

Figure 15F:
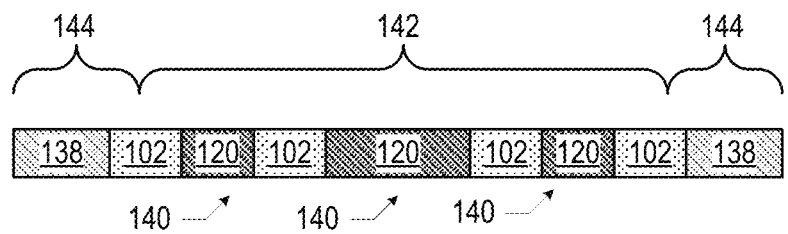
Figure 15G:
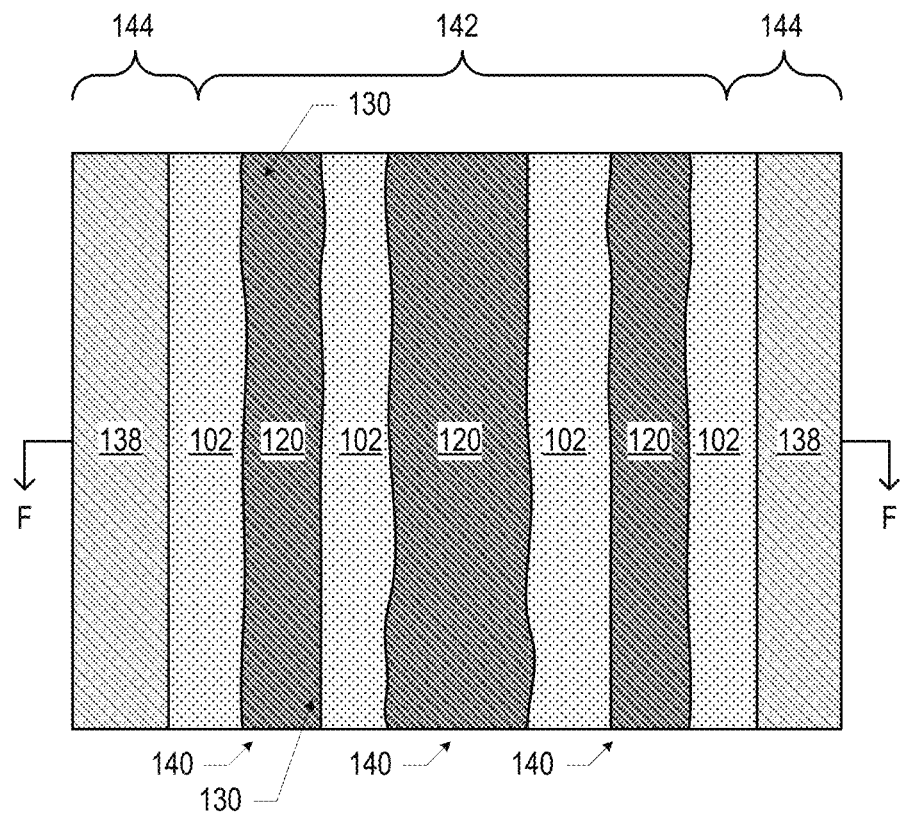

FIG. 15F is a side, cross-sectional view of an assembly subsequent to removing the second component 118 from the assembly of FIG. 15E (e.g., using a suitable selective etch technique) to form openings in the first component 116 that are "smoother" than the rough openings 178, transferring the pattern of the first component 116 (through the intermediate mask materials 108, 106, and 104, subsequently removed), and then providing line material 120 in the openings of the dielectric material 102 to form the low-LER lines 140. The pattern of the unordered lamellae 132 may be transferred into the dielectric material 102 to form the unordered lamellar structure 138. FIG. 15G is a top view of the assembly of FIG. 15F, illustrating the edges 130 of the low-LER lines 140. The illustration of FIG. 15F is taken through the section F-F of FIG. 15G. The assembly of FIGS. 15F and 15G may take the form of the microelectronic structure 100 of FIG. 14.

Figure 16A:
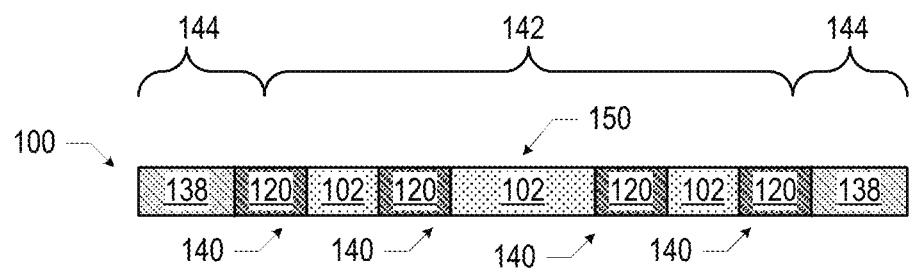
FIGS. 16A-16B are various views of another microelectronic structure including lines having low LER, in accordance with various embodiments.
Figure 16B:
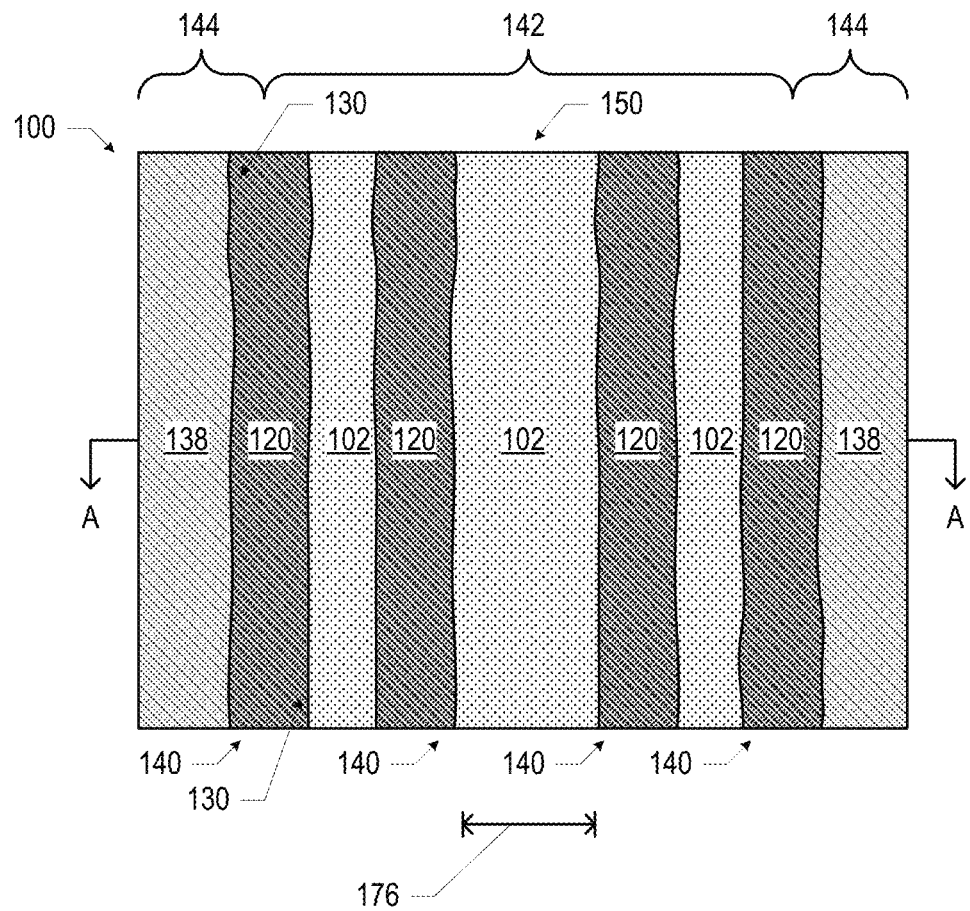

The opportunity to form horizontally oriented repeating structures may be utilized to manufacture low-LER lines 140 having different spacings 176 (instead of or in addition to different line widths 174, as discussed above with reference to FIGS. 14 and 15). For example, FIGS. 16A-16B are various views of another microelectronic structure 100 including low-LER lines 140 having different spacings 176 therebetween, in accordance with various embodiments. FIG. 16A is a side, cross-sectional view of the microelectronic structure 100 through the section A-A of FIG. 16B, and FIG. 16B is a top view of the microelectronic structure 100; the unordered lamellar structure 138 of the microelectronic structure 100 of FIG. 16 may take the form illustrated in FIG. 10. The embodiment of FIG. 16 shares a number of elements with preceding embodiments; for ease of discussion, a description of these elements is not repeated, and these elements may take the form of any of the embodiments of these elements disclosed herein. Relative to the embodiment of FIG. 1, the microelectronic structure 100 of FIG. 16 includes low-LER lines 140 having different spacings 176 (i.e., with the middle spacing 176 greater than the adjacent spacings 176).

Figure 17A:
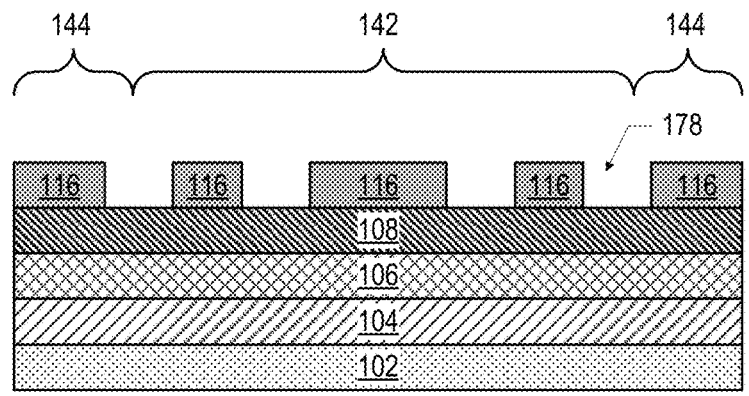
FIGS. 17A-17G illustrate stages in an example process of manufacturing the microelectronic structure of FIG. 16, in accordance with various embodiments.

FIGS. 17A-17G illustrate stages in an example process of manufacturing the microelectronic structure 100 of FIG. 16, in accordance with various embodiments. FIG. 17A is a side, cross-sectional view of an assembly like that of FIG. 2C, including a patterned initial brush 110 of the first component 116. The assembly of FIG. 17A may be formed in accordance with any of the fabrication techniques discussed herein with reference to FIG. 2C. Like the assembly of FIG. 2C, the openings 178 in the brush 110 may be patterned using lithographic techniques, and thus may have highly rough edges. Note that the central portion of the first component 116 of the brush 110 is wider than other portions of the first component 116 in the patterned region 142.

Figure 17B:
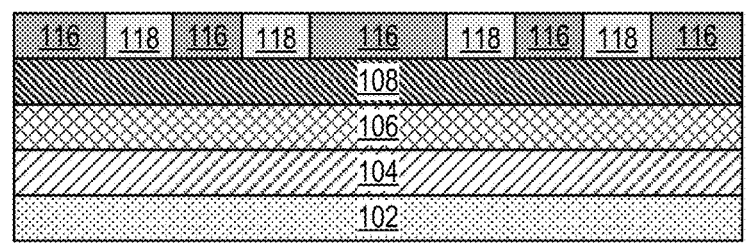

FIG. 17B is a side, cross-sectional view of an assembly subsequent to "filling in" the openings 178 in the brush 110 of FIG. 17A with the second component 118 to "complete" the brush 110, as discussed above with reference to FIG. 3. In other embodiments, this operation is not performed before proceeding to subsequent operations.

Figure 17C:
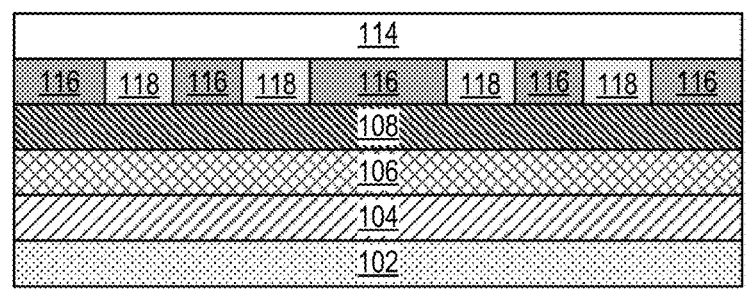

FIG. 17C is a side, cross-sectional view of an assembly subsequent to depositing a BCP 114 on the assembly of FIG. 17B. As noted above, the brush 110 and the BCP 114 may be selected so as to achieve a desired DSA behavior. In the embodiment of FIG. 17, the BCP 114 may include a first component 116 and a second component 118.

Figure 17D:
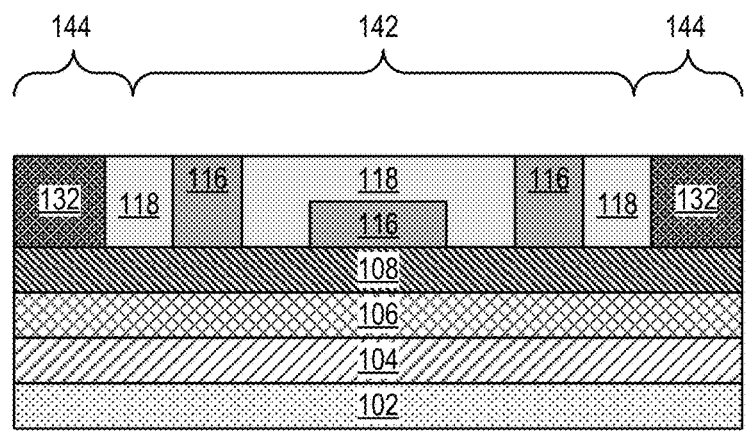

FIG. 17D is a side, cross-sectional view of an assembly subsequent to treating the assembly of FIG. 17C in order to cause the BCP 114 to self-assemble in accordance with the template provided by the brush 110. The resulting assembly includes alternating vertically oriented regions of the first component 116 and the second component 118, as well as a horizontally oriented region of the second component 118 (formed over the "wider" portion of the first component 116 in the patterned region 142). Outside the patterned region 142, the brush 110 may not provide a surface on which the BCP 114 readily self-assembles into alternating vertically (or horizontally) oriented regions of the first component 116 and the second component 118, and so instead, the BCP 114 in the unpatterned region 144 may self-assemble into unordered lamellae 132 of the first component 116 and the second component 118; the unordered lamellae 132 may have a structure like that of FIG. 10.

Figure 17E:
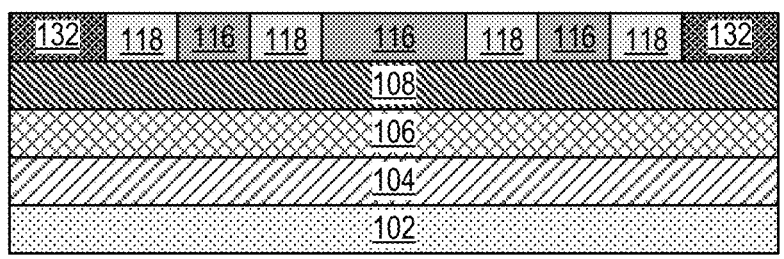

FIG. 17E is a side, cross-sectional view of an assembly subsequent to planarizing the assembly of FIG. 17D to remove the upper portion of the first component 116, second component 118, and the unordered lamellae 132 (e.g., using a CMP technique).

Figure 17F:
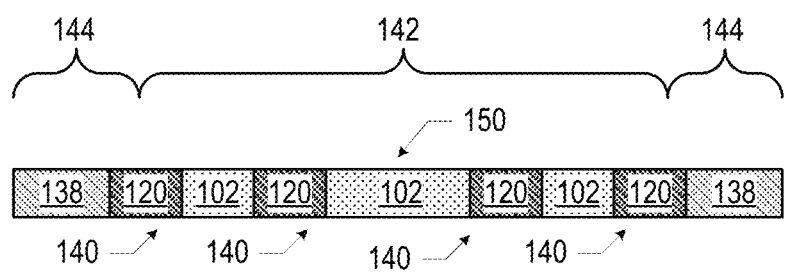
Figure 17G:
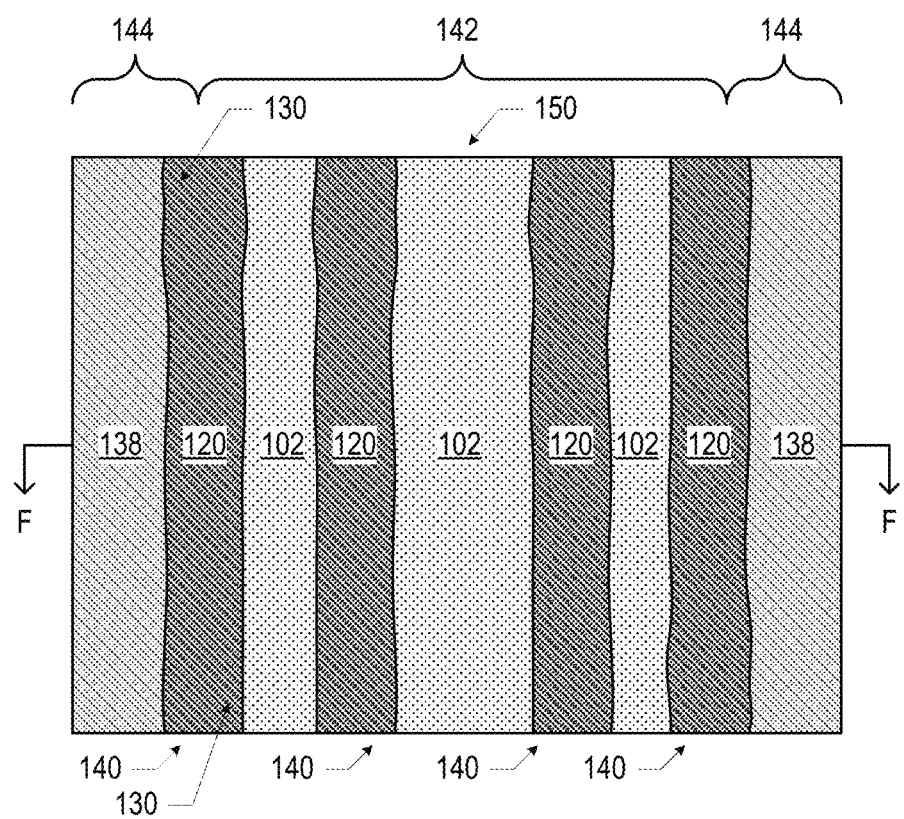

FIG. 17F is a side, cross-sectional view of an assembly subsequent to removing the second component 118 from the assembly of FIG. 17E (e.g., using a suitable selective etch technique) to form openings in the first component 116 that are "smoother" than the rough openings 178, transferring the pattern of the first component 116 (through the intermediate mask materials 108, 106, and 104, subsequently removed), and then providing line material 120 in the openings of the dielectric material 102 to form the low-LER lines 140. The pattern of the unordered lamellae 132 may be transferred into the dielectric material 102 to form the unordered lamellar structure 138. FIG. 17G is a top view of the assembly of FIG. 17F, illustrating the edges 130 of the low-LER lines 140. The illustration of FIG. 17F is taken through the section F-F of FIG. 17G. The assembly of FIGS. 17F and 17G may take the form of the microelectronic structure 100 of FIG. 16.

Figure 18:
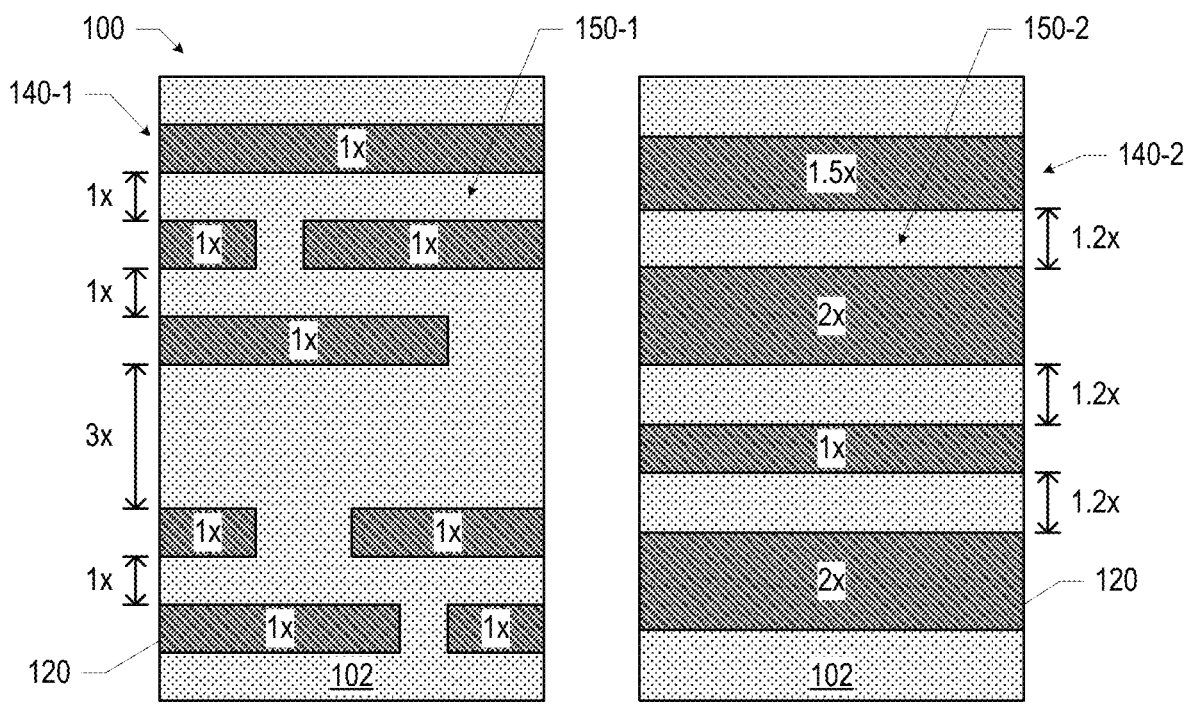
FIG. 18 is a top view of a microelectronic structure including lines having low LER at multiple pitches, in accordance with various embodiments.

In some embodiments, a BCP used in a DSA-based technique may be "stretchable" in that it is capable of self-assembling into repeating patterns having variable size (e.g., around a nominal size), depending upon the dimensions and structure of the underlying brush. For example, FIG. 18 is a top view of a microelectronic structure 100 including low-LER lines 140 at multiple pitches (including variable line widths and line spacings), in accordance with various embodiments. The microelectronic structure 100 of FIG. 18 includes a first set of low-LER lines 140-1 and a second set of low-LER lines 140-2, and corresponding inter-line spaces 150-1 and 150-2, respectively. The widths of the low-LER lines 140 are shown as superimposed over the low-LER lines 140 (e.g., 1×, 1.5×, 2×) and the widths of the inter-line spaces 150 are shown adjacent to the inter-line spaces 150 (e.g., 1×, 1.2×, 3×). The use of a stretchable BCP in a DSA-based technique, such as those discussed below with reference to FIGS. 19 and 20, to form a microelectronic structure 100 may result in features having roughnesses that increase with the feature size; further, those features may not have the lithographic property, as discussed above, and thus the use of a stretchable BCP in the fabrication of a microelectronic structure 100 may be detected in the microelectronic structure 100.

Figure 19A:
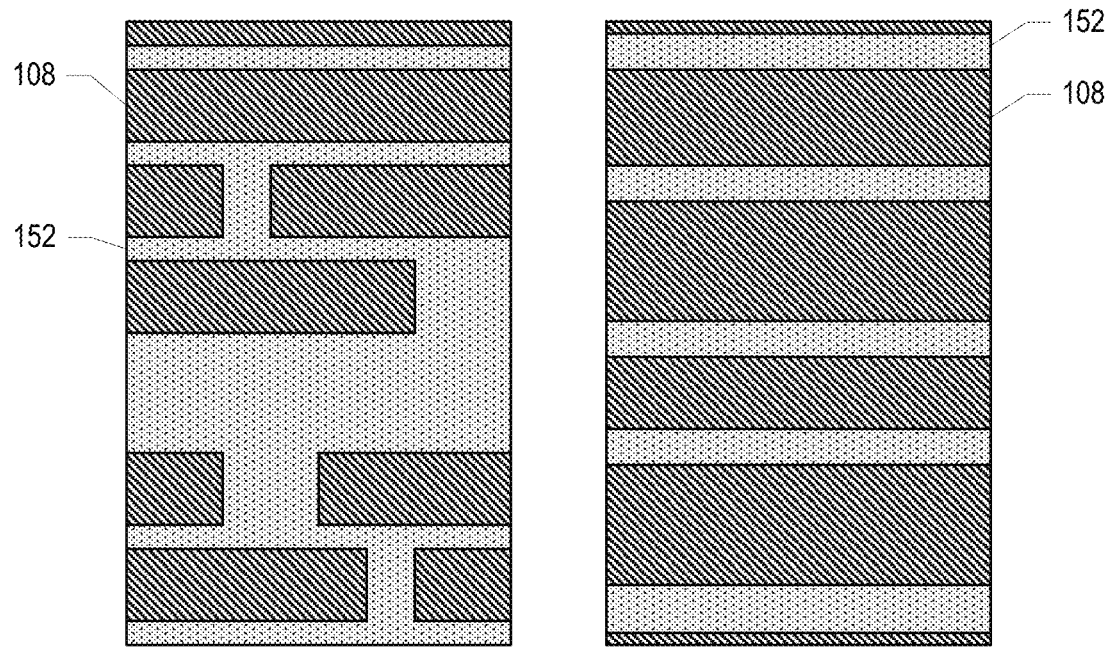
FIGS. 19A-19E illustrate stages in an example process of manufacturing the microelectronic structure of FIG. 18, in accordance with various embodiments.

FIGS. 19A-19E illustrate stages in an example process of manufacturing the microelectronic structure 100 of FIG. 18, in accordance with various embodiments. FIG. 19A is a top view of an assembly including a patterned metal 152 on top of a mask material 108. Additional mask materials (e.g., the mask materials 104 and 106, not shown) may underlie the mask material 108, and a dielectric material 102 (not shown) may underlie the additional mask materials. In some embodiments, the metal 152 may include titanium nitride or a metal oxide. The metal 152 may be patterned using a lithographic technique (and thus may have rough edges).

Figure 19B:
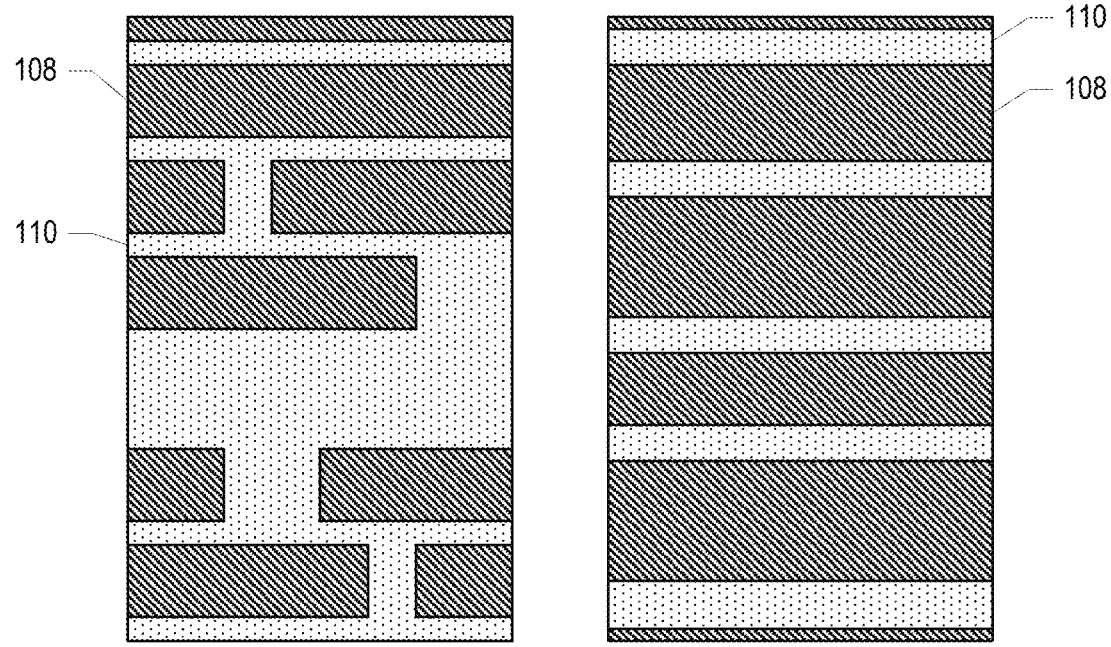

FIG. 19B is a top view of an assembly subsequent to providing a brush 110 on the metal 152 of the assembly of FIG. 19A. In some embodiments, the brush 110 may be a material that selectively deposits and adheres to the metal 152 in order to replicate the pattern of the metal 152.

Figure 19C:
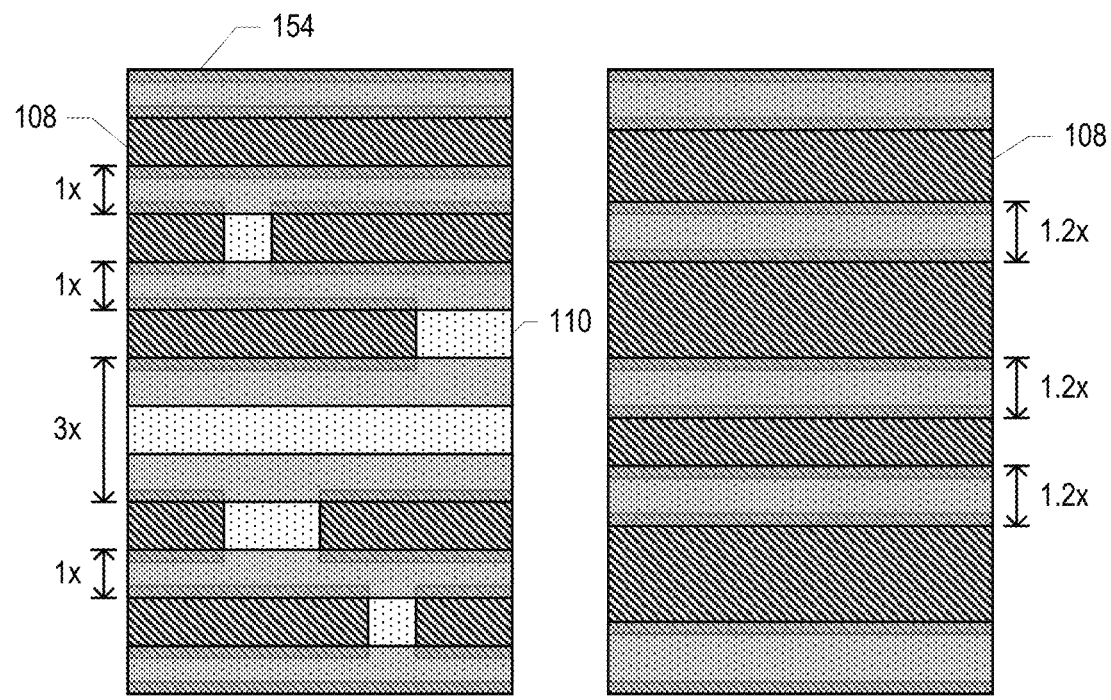

FIG. 19C is a top view of an assembly subsequent to depositing a BCP (e.g., the BCP 114, not shown), treating the resulting assembly in order to cause the BCP to self-assemble in accordance with the template provided by the brush 110, and then removing some of the assembled BCP to leave behind the BCP component 154. The BCP component 154 may be a "stretchable" component, as it is able to assemble into vertically oriented bands having different widths (e.g., 1× and 1.2×) depending upon the dimensions of the underlying brush 110. In some embodiments, a "stretchable" BCP may include a triblock copolymer, such as PMMA-b-PS-b-PMMA, PS-b-PMMA-b-PS, PS-b-poly (ethylene oxide) (PEO), PS-b-PEO-b-PS, PEO-b-PS-b-PEO, poly(styrene-b-2-vinylpyridine) (PS-b-P2VP), PS-b-P2VP-b-PS, P2VP-b-PS-b-P2VP, PS-b-P4VP, PS-b-P4VPb-PS, P4VP-b-PS-b-P4VP, polystyrene-block-polydimethylsiloxane (PS-b-PDMS), PDMS-b-PS-b-PDMS, or PS-b-PDMS-b-PS.

Figure 19D:
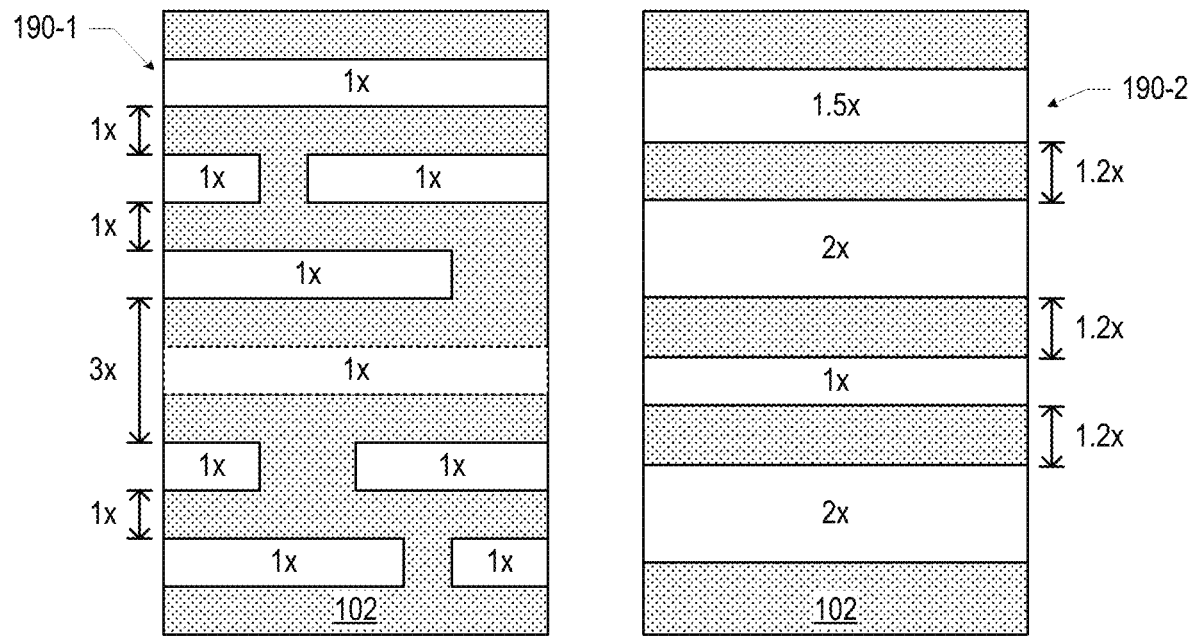

FIG. 19D is a top view of an assembly subsequent to removing the exposed mask material 108 from the assembly of FIG. 19C (e.g., by an appropriate selective etch), patterning the underlying dielectric material 102 of the resulting assembly in accordance with the pattern of the BCP component 154 and the brush 110, and then removing the BCP component 154 and the brush 110 (e.g., by appropriate selective etches). The openings 190 in the dielectric material 102 may have "smooth" edges.

Figure 19E:
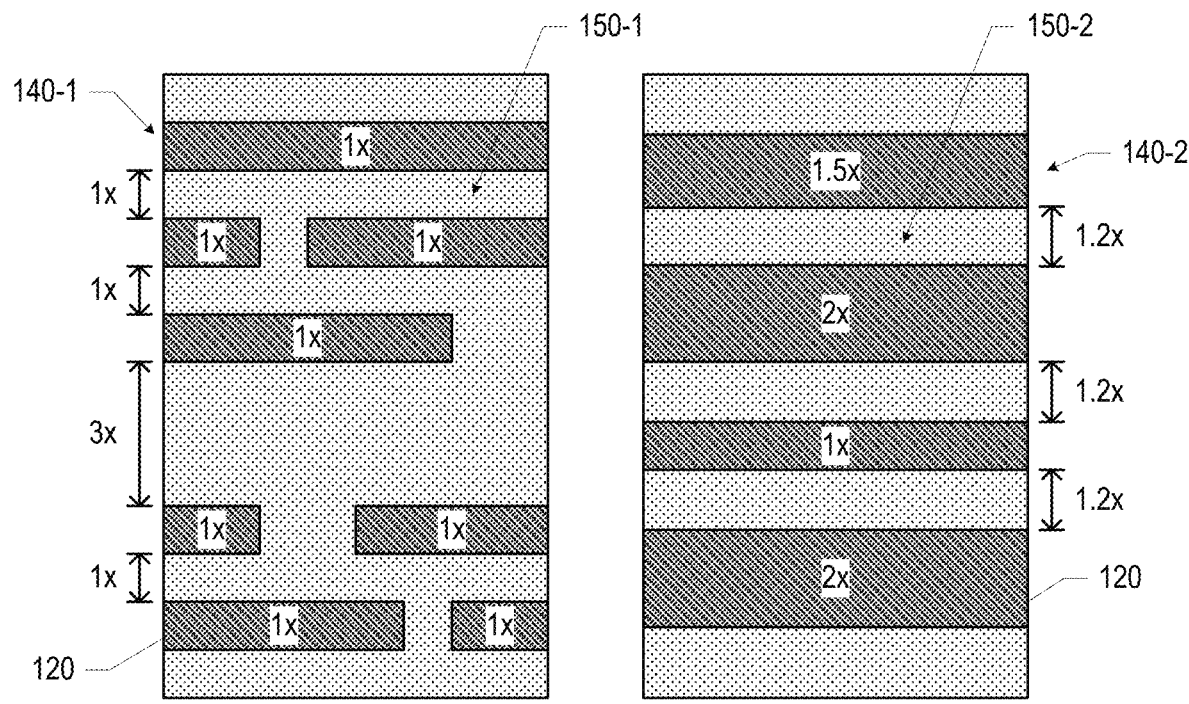

FIG. 19E is a top view of an assembly subsequent to filling the openings 190 of the assembly of FIG. 19D with line material (e.g., line material 120) to form the low-LER lines 140 and inter-line spaces 150. The assembly of FIG. 19E may take the form of the microelectronic structure 100 of FIG. 18. Note that the drawings of FIGS. 18 and 19 are simply examples, and the components thereof may take any suitable form. For example, the dielectric material 102 may be a multi-layer dielectric and/or the inter-line spaces 150 may be provided by dielectric spacers (e.g., including silicon oxynitride, silicon oxycarbide, aluminum oxide, silicon nitride, or silicon oxide) on an intervening dielectric material (e.g., a carbon-doped oxide).

Figure 20:
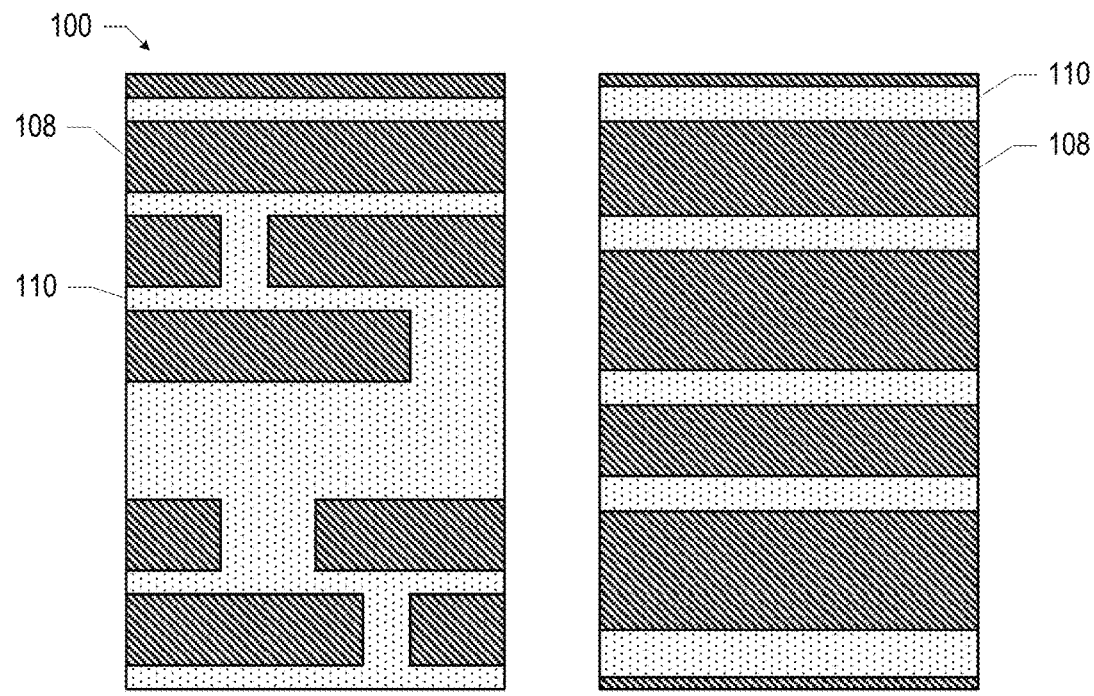
FIG. 20 illustrates a stage in another example process of manufacturing the microelectronic structure of FIG. 18, in accordance with various embodiments.

In some embodiments, a "stretchable" BCP may be utilized in a DSA-based technique that does not utilize an underlying metal 152 on which a brush 110 may be replicated. Instead, the brush 110 may be patterned using other techniques (e.g., lithography). For example, FIG. 20 is a top view of an assembly including a patterned brush 110 on top of a mask material 108. An assembly like that of FIG. 20 may be utilized as discussed above with reference to FIGS. 19C-19E to form the microelectronic structure 100 of FIG. 18.

In some embodiments, low-LER lines 140 may be included in a metallization stack, as discussed below with reference to FIG. 29. For example, low-LER lines 140 in accordance with any of the embodiments disclosed herein may be part of the M0, M1, M2, or other interconnect layers of a metallization stack. In some embodiments, low-LER lines 140 may be contacted by vias in a metallization stack. In some such embodiments, the vias may be formed using conventional techniques, such as by forming openings that land on the low-LER lines 140 using lithographic techniques, and filling those openings with conductive material. In other embodiments, such vias may be formed using self-alignment techniques to reduce the misalignment that may occur when conventional approaches are used. For example, FIG. 2I is a side, cross-sectional view of a microelectronic structure 100 including vias 166 in conductive contact with low-LER lines 140, in accordance with various embodiments. FIG. 2I (and others of the accompanying drawings) illustrate the vias 166 as including the line material 120, but the vias 166 may include any suitable fill and/or liner materials.

In the microelectronic structure 100 of FIG. 2I, the vias 166 include a lower portion that extends through a second replication brush component 158 (discussed further below), and an upper portion that extends through a photoresist 162. The photoresist 162 may be a dielectric material that includes cross-linking elements that may be selectively activated by EUV exposure, as discussed further below. An unpatterned region 144 of the microelectronic structure 100 of FIG. 2I may include an unordered lamellar structure 138, as discussed above, and an unordered dielectric material 160 on the unordered lamellar structure 138.

Figure 22A:
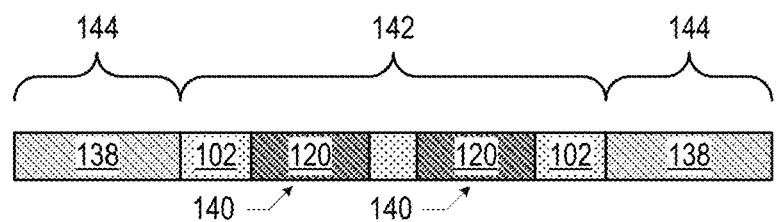
FIGS. 22A-22F illustrate stages in an example process of manufacturing the microelectronic structure of FIG. 21, in accordance with various embodiments.

FIGS. 22A-22F illustrate stages in an example process of manufacturing the microelectronic structure 100 of FIG. 2I, in accordance with various embodiments. FIG. 22A is a side, cross-sectional view of an assembly including a patterned region 142 having one or more low-LER lines 140 in a dielectric material 102, and an unpatterned region 144 having an unordered lamellar structure 138. The assembly of FIG. 22A may take the form of any of the microelectronic structures 100 discussed above with reference to FIGS. 1-20.

Figure 22B:
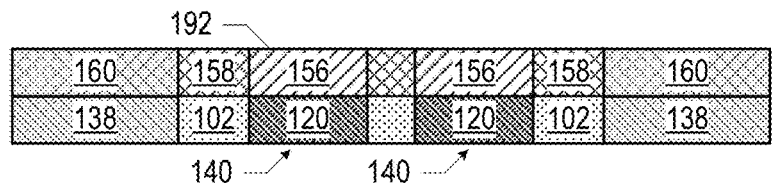

FIG. 22B is a side, cross-sectional view of an assembly subsequent to forming a replication brush 192 on the assembly of FIG. 22A. The replication brush 192 may include a first replication brush component 156 and a second replication brush component 158. The first replication brush component 156 may preferentially attach to the line material 120 of the low-LER lines 140 and the second replication brush component 158 may preferentially attach to the dielectric material 102 to form a self-assembled replication brush 192. The replication brush 192 may also include the unordered dielectric material 160, which may not have a self-assembled structure, or may have a unordered lamellar structure like that of FIG. 10. In some embodiments, the first replication brush component 156 (a metal-selective brush material) may have a surface anchoring group including phosphines, thiol, thiolate, thioacetate, disulfide, alkyl azide, aryl azide, nitrile, phosphate, silyl, alkyl and other phosphonate ester, phosphonamide, sulfonamides, sulfenate, sulfinate, sulfonate, boronic acid, phosphonic acids, carboxylic acids, phosphorous dichloride, alkenes or alkyne material. In some embodiments, the second replication brush component 158 (a dielectric-selective brush material) may have a surface anchoring group of hydroxyl, amines, or a carboxylic acid group.

Figure 22C:
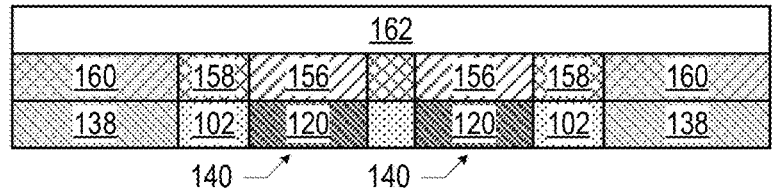

FIG. 22C is a side, cross-sectional view of an assembly subsequent to depositing a photoresist 162 on the assembly of FIG. 22B. The photoresist 162 may include cross-linking elements that, upon activation by EUV exposure, cross-link when in the presence of the first replication brush component 156, and do not cross-link otherwise. In some embodiments, the photoresist 162 and/or the first replication brush component 156 may include photo acid generator (PAG) molecules that, upon ultraviolet (UV) exposure (e.g., EUV exposure), generate acid to cause cross-linking of the photoresist 162; the cross-linked photoresist 164, discussed below, may then be selectively removed. In some embodiments, the photoresist 162 and/or the second replication brush component 158 may include quencher molecules that, upon UV exposure, cause acid generated by the photoresist 162 to be quenched in the areas above the second replication brush component 158 to prevent cross-linking of the photoresist 162 in the areas above the second replication brush component 158; the cross-linked photoresist 164, discussed below, may then be selectively removed. More generally, the first replication brush component 156, the second replication brush component 158, and/or the photoresist 162 may include catalysts that can selectively localize the cross-linking of the photoresist 162 upon exposure to UV radiation.

Figure 22D:
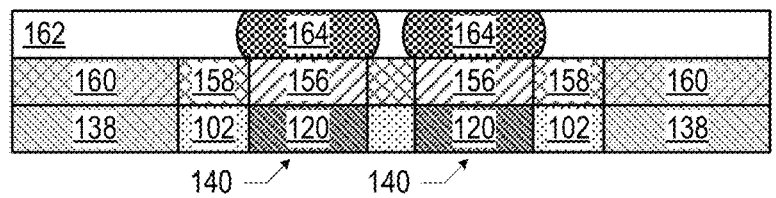

FIG. 22D is a side, cross-sectional view of an assembly subsequent to exposing the photoresist 162 of the assembly of FIG. 22C to EUV radiation (e.g., an EUV "flood"), forming cross-linked photoresist 164 in the volumes of the photoresist 162 proximate to the first replication brush component 156.

Figure 22E:
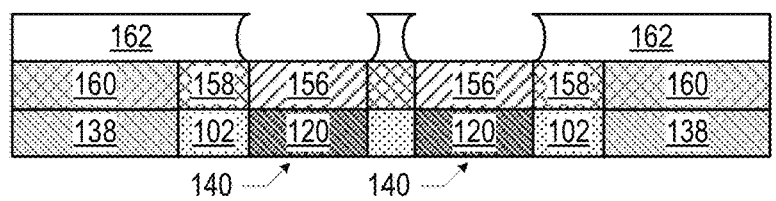

FIG. 22E is a side, cross-sectional view of an assembly subsequent to removing the cross-linked photoresist 164 from the assembly of FIG. 22D (e.g., using a suitable selective etch technique).

Figure 21:
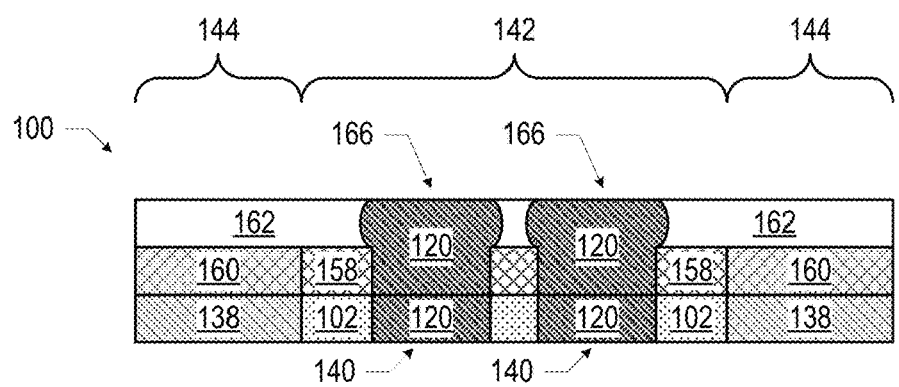
FIG. 21 is a side, cross-sectional view of a microelectronic structure including vias in conductive contact with lines having low LER, in accordance with various embodiments.
Figure 22F:
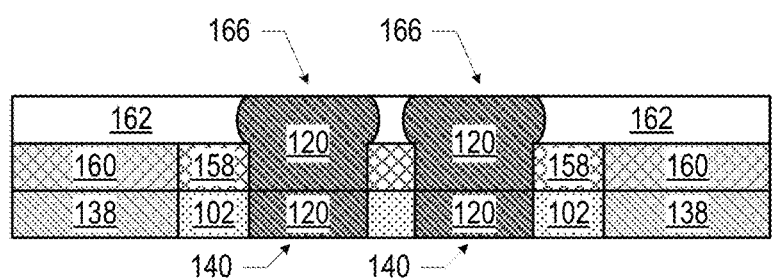

FIG. 22F is a side, cross-sectional view of an assembly subsequent to removing the first replication brush component 156 from the assembly of FIG. 22E (e.g., using a suitable selective etch technique), and then filling the openings with the line material 120 to form the vias 166. The assembly of FIG. 22F may take the form of the microelectronic structure 100 of FIG. 21.

Figure 23:
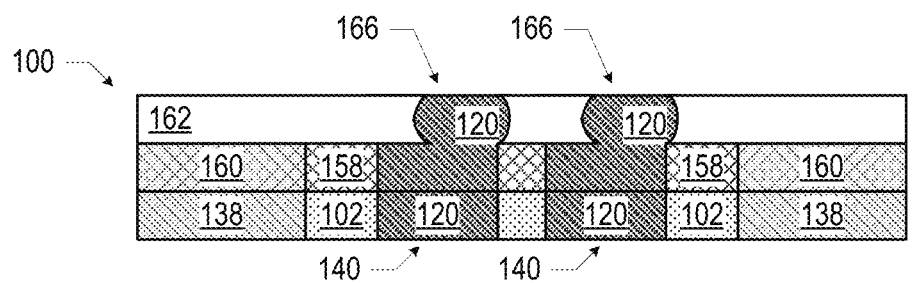
FIG. 23 is a side, cross-sectional view of another microelectronic structure including vias in conductive contact with lines with low LER, in accordance with various embodiments.

FIGS. 21 and 22 illustrate a microelectronic structure 100 that may include vias 166 patterned by a technique that includes an EUV flood. In other embodiments, the vias 166 may be patterned using selective application of UV radiation. For example, FIG. 23 is a side, cross-sectional view of another microelectronic structure 100 including vias 166 in conductive contact with low-LER lines 140, in accordance with various embodiments. The microelectronic structure 100 of FIG. 23 shares many elements in common with the microelectronic structure 100 of FIG. 21; for ease of discussion, a description of these elements is not repeated, and these elements may take the form of any of the embodiments of these elements disclosed herein. In the embodiment of FIG. 23, however, the vias 166 may not be centered over the low-LER lines 140, but may instead be formed at the intersection between the volume above the low-LER lines 140 and the area to which EUV radiation is selectively applied, as discussed below.

Figure 24A:
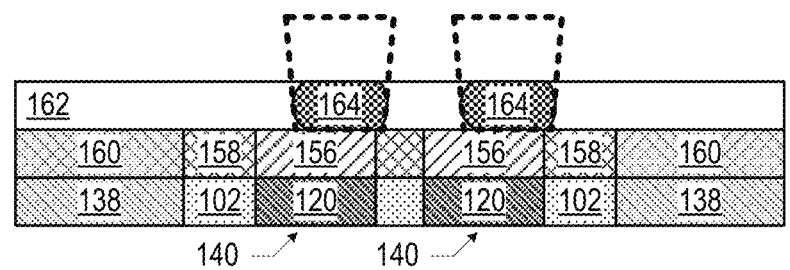
FIGS. 24A-24C illustrate stages in an example process of manufacturing the microelectronic structure of FIG. 23, in accordance with various embodiments.
Figure 24B:
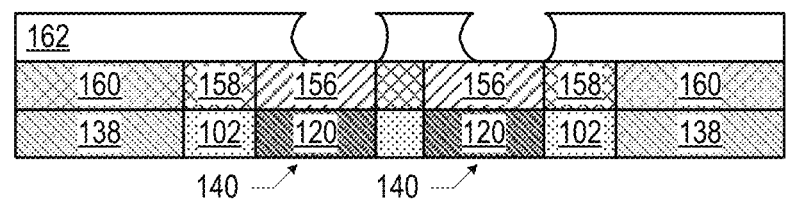
Figure 24C:
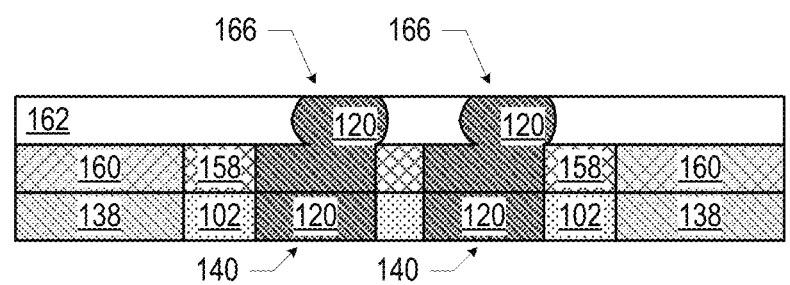

FIGS. 24A-24C illustrate stages in an example process of manufacturing the microelectronic structure 100 of FIG. 23, in accordance with various embodiments. FIG. 24A is a side, cross-sectional view of an assembly subsequent to exposing the photoresist 162 of the assembly of FIG. 22C to patterned EUV radiation (with the regions of EUV radiation indicated by the dotted lines), forming cross-linked photoresist 164 in the intersection between the EUV radiation volumes and the volumes of the photoresist 162 proximate to the first replication brush component 156.

FIG. 24B is a side, cross-sectional view of an assembly subsequent to removing the cross-linked photoresist 164 from the assembly of FIG. 24A (e.g., using a suitable selective etch technique).

FIG. 24C is a side, cross-sectional view of an assembly subsequent to removing the first replication brush component 156 from the assembly of FIG. 24B (e.g., using a suitable selective etch technique), and then filling the openings with the line material 122 form the vias 166. The assembly of FIG. 24C may take the form of the microelectronic structure 100 of FIG. 23.

Figure 25:
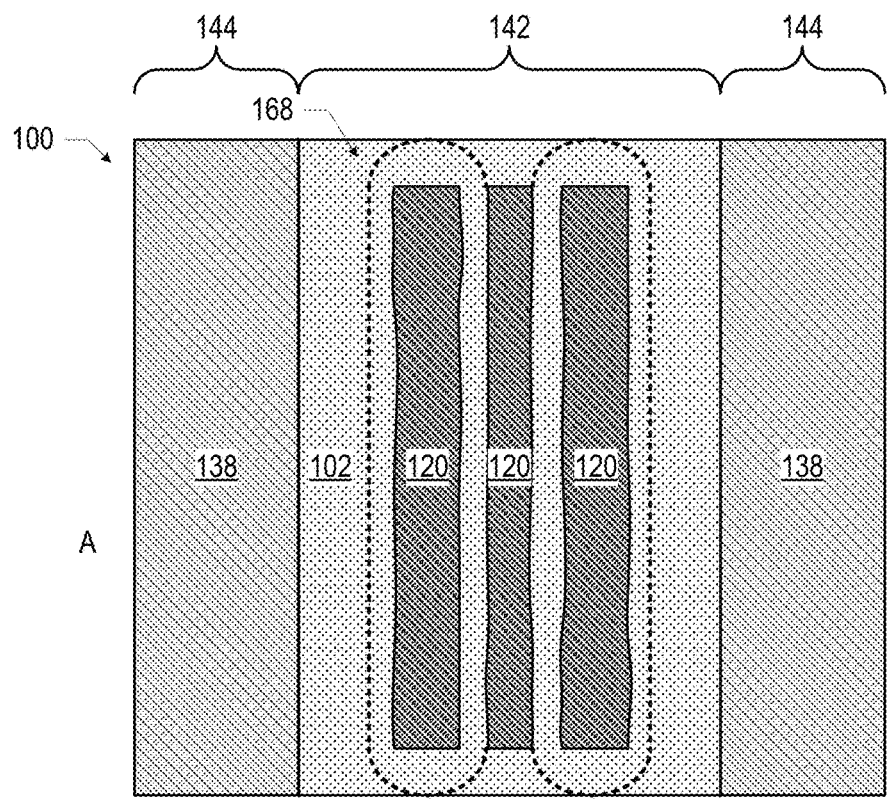
FIGS. 25-27 are top views of microelectronic structures including pitch-division artifacts, in accordance with various embodiments.
Figure 26:
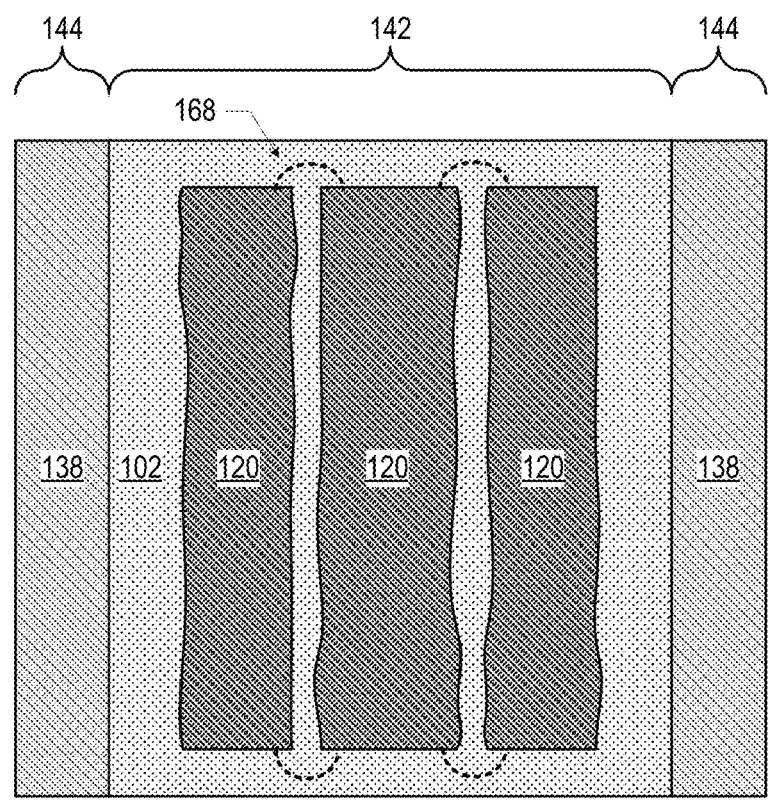
Figure 27:
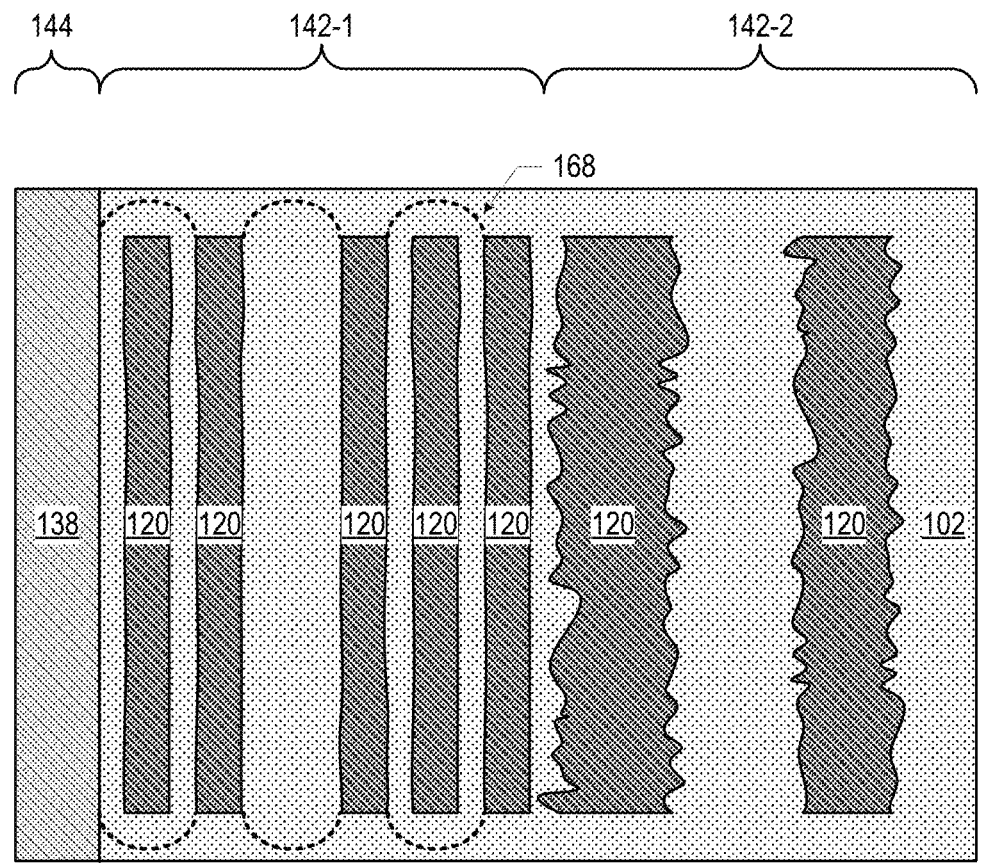

The fabrication process discussed above with reference to FIGS. 4-5, 6-7, and 12-13 include spacer-based pitch-division techniques. The particular pitch-division techniques of FIGS. 5, 7, and 13 are pitch-halving techniques (utilizing one round of spacer formation), but in other embodiments, a pitch-quartering technique (using two rounds of spacer formation) may be used instead to obtain smaller feature sizes. The use of such pitch-division techniques in the process of forming low-LER lines 140 in a patterned region 142 may be evidenced in a microelectronic structure 100 by the presence of pitch-division artifacts in the microelectronic structure 100. For example, because of the manner in which the width of various elements propagate through the pitch-division technique to the line widths 174 and inter-line spacings 176, the line widths 174 and the inter-line spacings 176 may exhibit a periodicity across multiple ones of the low-LER lines 140. Such periodicity may serve as a pitch-division artifact in the microelectronic structure 100 that provides evidence of the use of a pitch-division technique during fabrication. Another example of a pitch-division artifact that may appear in a microelectronic structure 100 are nested and/or rounded, half-ring patterns in the dielectric material 102 that correspond to the ends of the spacers 124. FIGS. 25, 26, and 27 are top views of the microelectronic structures 100 of FIGS. 4, 6, and 12, respectively illustrating such nested and rounded patterns 168 proximate to a perimeter of the patterned regions 142; in embodiments in which a pitch-quartering technique is used instead of a pitch-halving technique, more "half-rings" may be part of the patterns 168. The presence of such nested and/or rounded patterns may serve as a pitch-division artifact in the microelectronic structure 100 that provides evidence of the use of a pitch-division technique during fabrication. Other pitch-division artifacts may be present instead of or in addition to one or more of these artifacts. For example, spacer-based pitch-division, as discussed above, may have a single size of a feature (either a line width or a width of a space between lines) that is defined by ALD spacer deposition. The thickness of the ALD spacer deposition may determine this size.

The microelectronic structures 100 disclosed herein may be included in any suitable electronic component. FIGS. 28-32 illustrate various examples of apparatuses that may include any of the microelectronic structures 100 disclosed herein.

Figure 28:
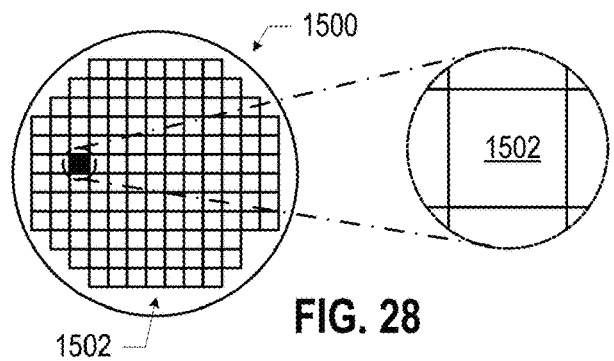
FIG. 28 is a top view of a wafer and dies that may include any of the microelectronic structures disclosed herein.

FIG. 28 is a top view of a wafer 1500 and dies 1502 that may include one or more microelectronic structures 100 in accordance with any of the embodiments disclosed herein. The wafer 1500 may be composed of semiconductor material and may include one or more dies 1502 having microelectronic structures formed on a surface of the wafer 1500. Each of the dies 1502 may be a repeating unit of a semiconductor product that includes any suitable microelectronic structure. After the fabrication of the semiconductor product is complete, the wafer 1500 may undergo a singulation process in which the dies 1502 are separated from one another to provide discrete "chips" of the semiconductor product. The die 1502 may include one or more microelectronic structures 100 (e.g., as discussed below with reference to FIG. 29), one or more transistors (e.g., some of the transistors 1640 of FIG. 29, discussed below) and/or supporting circuitry to route electrical signals to the transistors, as well as any other circuit components. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 32) or other logic that is configured to store information in the memory devices or execute instructions stored in the memory array.

Figure 29:
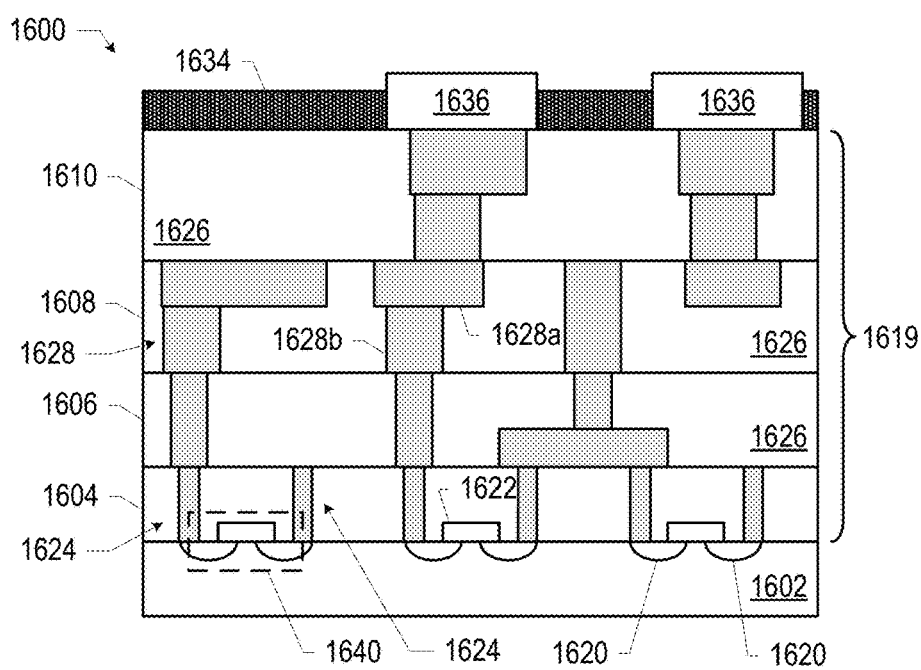
FIG. 29 is a side, cross-sectional view of a microelectronic device that may include any of the microelectronic structures disclosed herein.

FIG. 29 is a side, cross-sectional view of a microelectronic device 1600 that may include one or more microelectronic structures 100 in accordance with any of the embodiments disclosed herein. One or more of the microelectronic devices 1600 may be included in one or more dies 1502 (FIG. 28). The microelectronic device 1600 may be formed on a substrate 1602 (e.g., the wafer 1500 of FIG. 28) and may be included in a die (e.g., the die 1502 of FIG. 28). The substrate 1602 may be a semiconductor substrate composed of semiconductor material systems including, for example, n-type or p-type materials systems (or a combination of both). The substrate 1602 may include, for example, a crystalline substrate formed using a bulk silicon or a silicon-on-insulator (SOI) substructure. In some embodiments, the substrate 1602 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1602. Although a few examples of materials from which the substrate 1602 may be formed are described here, any material that may serve as a foundation for a microelectronic device 1600 may be used. The substrate 1602 may be part of a singulated die (e.g., the dies 1502 of FIG. 28) or a wafer (e.g., the wafer 1500 of FIG. 28).

The microelectronic device 1600 may include one or more device layers 1604 disposed on the substrate 1602. The device layer 1604 may include features of one or more transistors 1640 (e.g., metal oxide semiconductor field-effect transistors (MOSFETs)) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 29 and may include a wide variety of other types and configurations such as, for example, planar transistors, non-planar transistors, or a combination of both. Planar transistors may include bipolar junction transistors (BJT), heterojunction bipolar transistors (HBT), or high-electron-mobility transistors (HEMT). Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the substrate 1602 adjacent to the gate 1622 of each transistor 1640. The S/D regions 1620 may be formed using an implantation/diffusion process or an etching/deposition process, for example. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion-implantation process. In the latter process, the substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

Electrical signals, such as power and/or input/output (I/O) signals, may be routed to and/or from the devices (e.g., the transistors 1640) of the device layer 1604 through one or more interconnect layers disposed on the device layer 1604 (illustrated in FIG. 29 as interconnect layers 1606-1610). For example, conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the microelectronic device 1600. Any of the microelectronic structures 100 disclosed herein may be included in any of the interconnect layers of a metallization stack 1619.

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 29). Although a particular number of interconnect layers 1606-1610 is depicted in FIG. 29, embodiments of the present disclosure include microelectronic devices having more or fewer interconnect layers than depicted.

In some embodiments, the interconnect structures 1628 may include lines 1628a and/or vias 1628b filled with a conductive material such as a metal. The lines 1628a may be arranged to route electrical signals in a direction of a plane that is substantially parallel with a surface of the substrate 1602 upon which the device layer 1604 is formed. For example, the lines 1628a may route electrical signals in a direction in and out of the page from the perspective of FIG. 29. Any of the lines 1628a in a metallization stack 1619 may take the form of the low-LER lines 140 disclosed herein; for example, one or more of the lines 1628a in an interconnect layer of a metallization stack 1619 may be low-LER lines 140. The vias 1628b may be arranged to route electrical signals in a direction of a plane that is substantially perpendicular to the surface of the substrate 1602 upon which the device layer 1604 is formed. In some embodiments, the vias 1628b may electrically couple lines 1628a of different interconnect layers 1606-1610 together. Any of the vias 1628b in a metallization stack 1619 may take the form of the vias 166 disclosed herein.

The interconnect layers 1606-1610 may include a dielectric material 1626 disposed between the interconnect structures 1628, as shown in FIG. 29. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 may be formed above the device layer 1604. In some embodiments, the first interconnect layer 1606 may include lines 1628a and/or vias 1628b, as shown. The lines 1628a of the first interconnect layer 1606 may be coupled with contacts (e.g., the S/D contacts 1624) of the device layer 1604. The first interconnect layer 1606 may be referred to as the "M0" interconnect layer, and in some embodiments, the M0 interconnect layer may include any of the low-LER lines 140 disclosed herein. In some embodiments, the M0 interconnect layer may include any suitable portion of any of the microelectronic structures 100 disclosed herein.

A second interconnect layer 1608 may be formed above the first interconnect layer 1606. In some embodiments, the second interconnect layer 1608 may include vias 1628b to couple the lines 1628a of the second interconnect layer 1608 with the lines 1628a of the first interconnect layer 1606. Although the lines 1628a and the vias 1628b are structurally delineated with a line within each interconnect layer (e.g., within the second interconnect layer 1608) for the sake of clarity, the lines 1628a and the vias 1628b may be structurally and/or materially contiguous (e.g., simultaneously filled during a dual-damascene process) in some embodiments. The second interconnect layer 1608 may be referred to as the "M1" interconnect layer, and in some embodiments, the M1 interconnect layer may include any of the low-LER lines 140 disclosed herein. In some embodiments, the M1 interconnect layer may include any suitable portion of any of the microelectronic structures 100 disclosed herein.

A third interconnect layer 1610 (and additional interconnect layers, as desired) may be formed in succession on the second interconnect layer 1608 according to similar techniques and configurations described in connection with the second interconnect layer 1608 or the first interconnect layer 1606. The third interconnect layer 1610 may be referred to as the "M2" interconnect layer, and in some embodiments, the M2 interconnect layer may include any of the low-LER lines 140 disclosed herein. In some embodiments, the M2 interconnect layer may include any suitable portion of any of the microelectronic structures 100 disclosed herein. In some embodiments, the interconnect layers that are "higher up" in the metallization stack 1619 in the microelectronic device 1600 (i.e., farther away from the device layer 1604) may be thicker.

The microelectronic device 1600 may include a solder resist material 1634 (e.g., polyimide or similar material) and one or more conductive contacts 1636 formed on the interconnect layers 1606-1610. In FIG. 29, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the microelectronic device 1600 with another component (e.g., a circuit board). The microelectronic device 1600 may include additional or alternate structures to route the electrical signals from the interconnect layers 1606-1610; for example, the conductive contacts 1636 may include other analogous features (e.g., posts) that route the electrical signals to external components.

Figure 30:
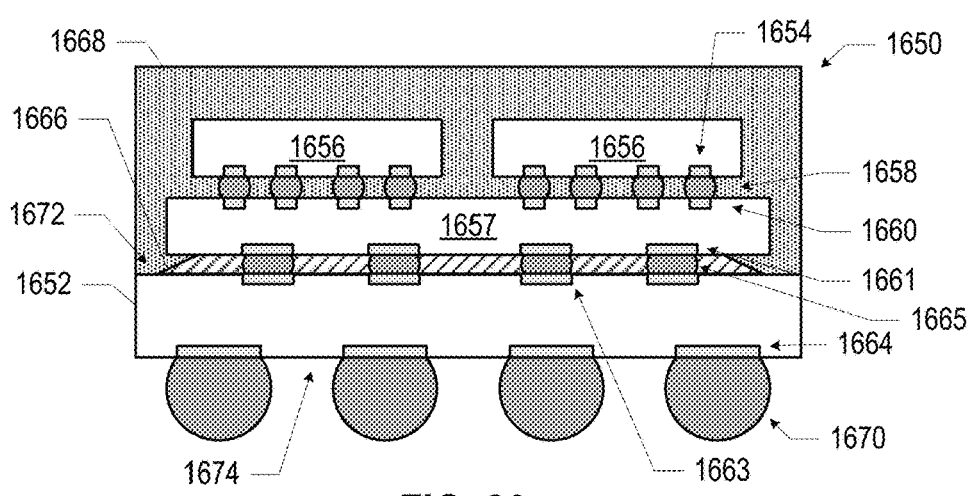
FIG. 30 is a side, cross-sectional view of a microelectronic package that may include any of the microelectronic structures disclosed herein.

FIG. 30 is a side, cross-sectional view of an example microelectronic package 1650 that may include one or more microelectronic structures 100 in accordance with any of the embodiments disclosed herein. In some embodiments, the microelectronic package 1650 may be a system-in-package (SiP).

The package substrate 1652 may be formed of a dielectric material (e.g., a ceramic, a buildup film, an epoxy film having filler particles therein, glass, an organic material, an inorganic material, combinations of organic and inorganic materials, embedded portions formed of different materials, etc.), and may have conductive pathways extending through the dielectric material between the face 1672 and the face 1674, or between different locations on the face 1672, and/or between different locations on the face 1674. These conductive pathways may take the form of any of the interconnects 1628 discussed above with reference to FIG. 29.

The package substrate 1652 may include conductive contacts 1663 that are coupled to conductive pathways (not shown) through the package substrate 1652, allowing circuitry within the dies 1656 and/or the interposer 1657 to electrically couple to various ones of the conductive contacts 1664 (or to other devices included in the package substrate 1652, not shown).

The microelectronic package 1650 may include an interposer 1657 coupled to the package substrate 1652 via conductive contacts 1661 of the interposer 1657, first-level interconnects 1665, and the conductive contacts 1663 of the package substrate 1652. The first-level interconnects 1665 illustrated in FIG. 30 are solder bumps, but any suitable first-level interconnects 1665 may be used. In some embodiments, no interposer 1657 may be included in the microelectronic package 1650; instead, the dies 1656 may be coupled directly to the conductive contacts 1663 at the face 1672 by first-level interconnects 1665. More generally, one or more dies 1656 may be coupled to the package substrate 1652 via any suitable structure (e.g., (e.g., a silicon bridge, an organic bridge, one or more waveguides, one or more interposers, wirebonds, etc.).

The microelectronic package 1650 may include one or more dies 1656 coupled to the interposer 1657 via conductive contacts 1654 of the dies 1656, first-level interconnects 1658, and conductive contacts 1660 of the interposer 1657. The conductive contacts 1660 may be coupled to conductive pathways (not shown) through the interposer 1657, allowing circuitry within the dies 1656 to electrically couple to various ones of the conductive contacts 1661 (or to other devices included in the interposer 1657, not shown). The first-level interconnects 1658 illustrated in FIG. 30 are solder bumps, but any suitable first-level interconnects 1658 may be used. As used herein, a "conductive contact" may refer to a portion of conductive material (e.g., metal) serving as an interface between different components; conductive contacts may be recessed in, flush with, or extending away from a surface of a component, and may take any suitable form (e.g., a conductive pad or socket).

In some embodiments, an underfill material 1666 may be disposed between the package substrate 1652 and the interposer 1657 around the first-level interconnects 1665, and a mold compound 1668 may be disposed around the dies 1656 and the interposer 1657 and in contact with the package substrate 1652. In some embodiments, the underfill material 1666 may be the same as the mold compound 1668. Example materials that may be used for the underfill material 1666 and the mold compound 1668 are epoxy mold materials, as suitable. Second-level interconnects 1670 may be coupled to the conductive contacts 1664. The second-level interconnects 1670 illustrated in FIG. 30 are solder balls (e.g., for a ball grid array arrangement), but any suitable second-level interconnects 16770 may be used (e.g., pins in a pin grid array arrangement or lands in a land grid array arrangement). The second-level interconnects 1670 may be used to couple the microelectronic package 1650 to another component, such as a circuit board (e.g., a motherboard), an interposer, or another microelectronic package, as known in the art and as discussed below with reference to FIG. 31.

The dies 1656 may take the form of any of the embodiments of the die 1502 discussed herein (e.g., may include any of the embodiments of the microelectronic device 1600). In embodiments in which the microelectronic package 1650 includes multiple dies 1656, the microelectronic package 1650 may be referred to as a multi-chip package (MCP). The dies 1656 may include circuitry to perform any desired functionality. For example, or more of the dies 1656 may be logic dies (e.g., silicon-based dies), and one or more of the dies 1656 may be memory dies (e.g., high bandwidth memory).

Although the microelectronic package 1650 illustrated in FIG. 30 is a flip chip package, other package architectures may be used. For example, the microelectronic package 1650 may be a ball grid array (BGA) package, such as an embedded wafer-level ball grid array (eWLB) package. In another example, the microelectronic package 1650 may be a wafer-level chip scale package (WLCSP) or a panel fanout (FO) package. Although two dies 1656 are illustrated in the microelectronic package 1650 of FIG. 30, a microelectronic package 1650 may include any desired number of dies 1656. A microelectronic package 1650 may include additional passive components, such as surface-mount resistors, capacitors, and inductors disposed on the first face 1672 or the second face 1674 of the package substrate 1652, or on either face of the interposer 1657. More generally, a microelectronic package 1650 may include any other active or passive components known in the art.

Figure 31:
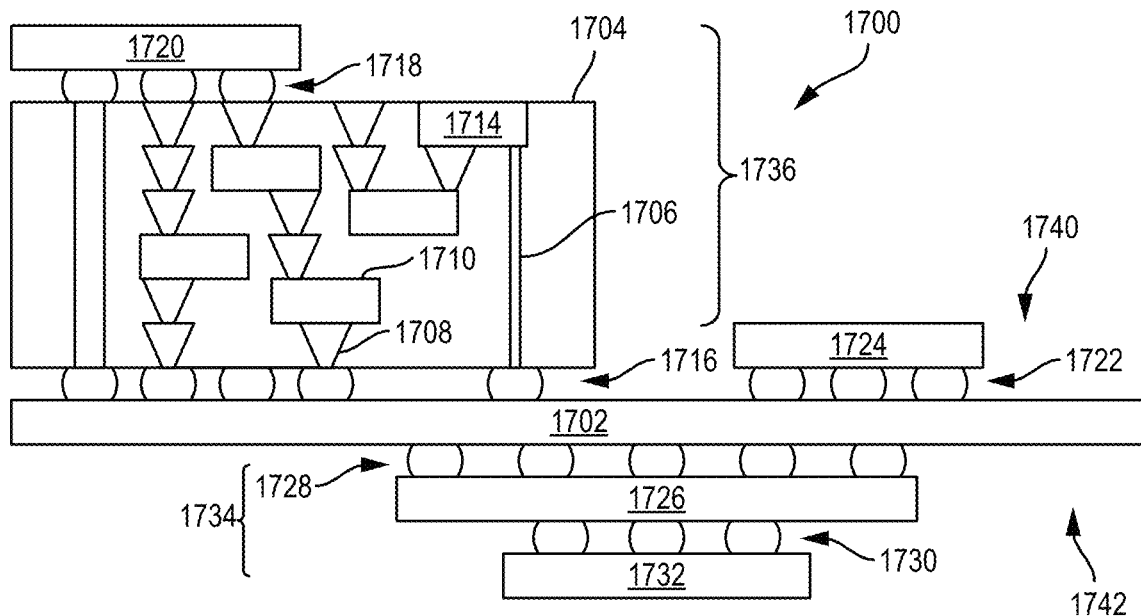
FIG. 31 is a side, cross-sectional view of a microelectronic device assembly that may include any of the microelectronic structures disclosed herein.

FIG. 31 is a side, cross-sectional view of a microelectronic device assembly 1700 that may include one or more microelectronic packages or other electronic components (e.g., a die) including one or more microelectronic structures 100 in accordance with any of the embodiments disclosed herein. The microelectronic device assembly 1700 includes a number of components disposed on a circuit board 1702 (which may be, e.g., a motherboard). The microelectronic device assembly 1700 includes components disposed on a first face 1740 of the circuit board 1702 and an opposing second face 1742 of the circuit board 1702; generally, components may be disposed on one or both faces 1740 and 1742. Any of the microelectronic packages discussed below with reference to the microelectronic device assembly 1700 may take the form of any of the embodiments of the microelectronic package 1650 discussed above with reference to FIG. 30 (e.g., may include one or more microelectronic structures 100 in a die).

In some embodiments, the circuit board 1702 may be a printed circuit board (PCB) including multiple metal layers separated from one another by layers of dielectric material and interconnected by conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The microelectronic device assembly 1700 illustrated in FIG. 31 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 31), male and female portions of a socket, an adhesive, an underfill material, and/or any other suitable electrical and/or mechanical coupling structure.

The package-on-interposer structure 1736 may include a microelectronic package 1720 coupled to an package interposer 1704 by coupling components 1718. The coupling components 1718 may take any suitable form for the application, such as the forms discussed above with reference to the coupling components 1716. Although a single microelectronic package 1720 is shown in FIG. 31, multiple microelectronic packages may be coupled to the package interposer 1704; indeed, additional interposers may be coupled to the package interposer 1704. The package interposer 1704 may provide an intervening substrate used to bridge the circuit board 1702 and the microelectronic package 1720. The microelectronic package 1720 may be or include, for example, a die (the die 1502 of FIG. 28), a microelectronic device (e.g., the microelectronic device 1600 of FIG. 29), or any other suitable component. Generally, the package interposer 1704 may spread a connection to a wider pitch or reroute a connection to a different connection. For example, the package interposer 1704 may couple the microelectronic package 1720 (e.g., a die) to a set of BGA conductive contacts of the coupling components 1716 for coupling to the circuit board 1702. In the embodiment illustrated in FIG. 31, the microelectronic package 1720 and the circuit board 1702 are attached to opposing sides of the package interposer 1704; in other embodiments, the microelectronic package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal lines 1710 and vias 1708, including but not limited to through-silicon vias (TSVs) 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the package interposer 1704. The package-on-interposer structure 1736 may take the form of any of the package-on-interposer structures known in the art.

The microelectronic device assembly 1700 may include a microelectronic package 1724 coupled to the first face 1740 of the circuit board 1702 by coupling components 1722. The coupling components 1722 may take the form of any of the embodiments discussed above with reference to the coupling components 1716, and the microelectronic package 1724 may take the form of any of the embodiments discussed above with reference to the microelectronic package 1720.

The microelectronic device assembly 1700 illustrated in FIG. 31 includes a package-on-package structure 1734 coupled to the second face 1742 of the circuit board 1702 by coupling components 1728. The package-on-package structure 1734 may include a microelectronic package 1726 and a microelectronic package 1732 coupled together by coupling components 1730 such that the microelectronic package 1726 is disposed between the circuit board 1702 and the microelectronic package 1732. The coupling components 1728 and 1730 may take the form of any of the embodiments of the coupling components 1716 discussed above, and the microelectronic packages 1726 and 1732 may take the form of any of the embodiments of the microelectronic package 1720 discussed above. The package-on-package structure 1734 may be configured in accordance with any of the package-on-package structures known in the art.

Figure 32:
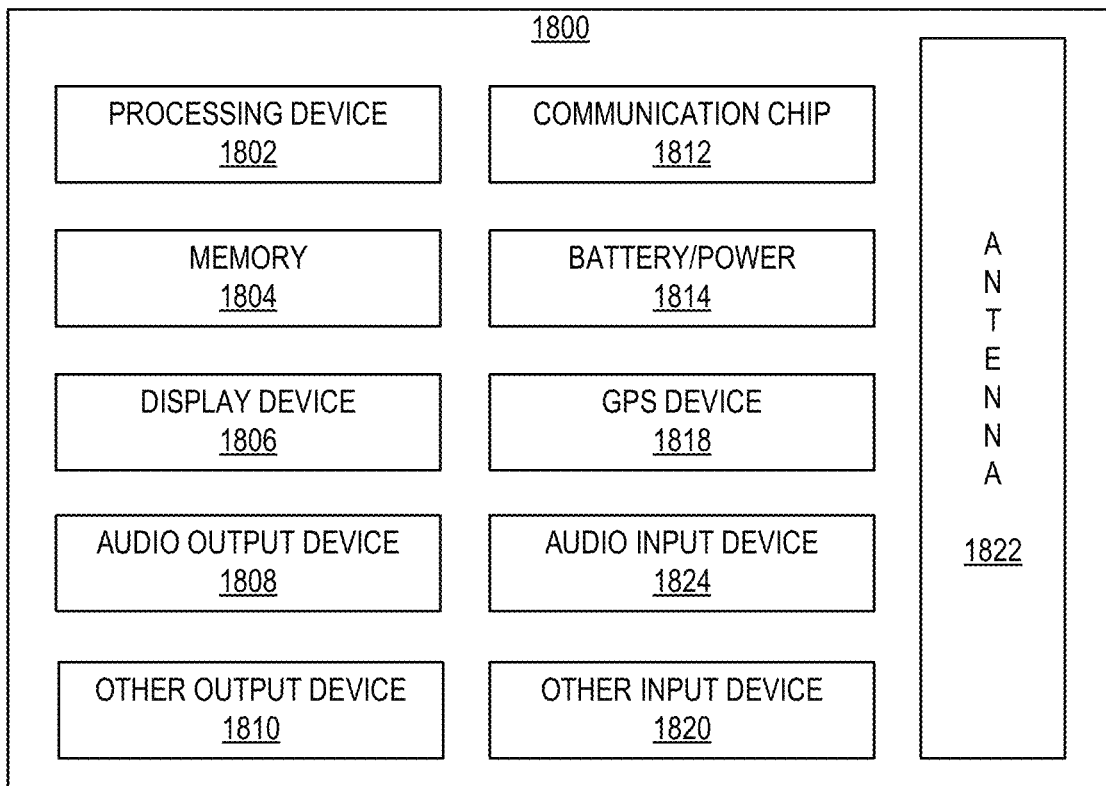
FIG. 32 is a block diagram of an example computing device that may include any of the microelectronic structures disclosed herein.

FIG. 32 is a block diagram of an example computing device 1800 that may include one or more microelectronic structures 100 in accordance with any of the embodiments disclosed herein. For example, any suitable ones of the components of the computing device 1800 may include one or more of the microelectronic device assemblies 1700, microelectronic packages 1650, microelectronic devices 1600, or dies 1502 disclosed herein. A number of components are illustrated in FIG. 32 as included in the computing device 1800, but any one or more of these components may be omitted or duplicated, as suitable for the application. In some embodiments, some or all of the components included in the computing device 1800 may be attached to one or more motherboards. In some embodiments, some or all of these components are fabricated onto a single system-on-a-chip (SoC) die.

Additionally, in various embodiments, the computing device 1800 may not include one or more of the components illustrated in FIG. 32, but the computing device 1800 may include interface circuitry for coupling to the one or more components. For example, the computing device 1800 may not include a display device 1806, but may include display device interface circuitry (e.g., a connector and driver circuitry) to which a display device 1806 may be coupled. In another set of examples, the computing device 1800 may not include an audio input device 1824 or an audio output device 1808, but may include audio input or output device interface circuitry (e.g., connectors and supporting circuitry) to which an audio input device 1824 or audio output device 1808 may be coupled.

The computing device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The computing device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the computing device 1800 may include a communication chip 1812 (e.g., one or more communication chips). For example, the communication chip 1812 may be configured for managing wireless communications for the transfer of data to and from the computing device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The computing device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The computing device 1800 may include battery/power circuitry 1814. The battery/power circuitry 1814 may include one or more energy storage devices (e.g., batteries or capacitors) and/or circuitry for coupling components of the computing device 1800 to an energy source separate from the computing device 1800 (e.g., AC line power).

The computing device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The computing device 1800 may include an audio output device 1808 (or corresponding interface circuitry, as discussed above). The audio output device 1808 may include any device that generates an audible indicator, such as speakers, headsets, or earbuds.

The computing device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The computing device 1800 may include a GPS device 1818 (or corresponding interface circuitry, as discussed above). The GPS device 1818 may be in communication with a satellite-based system and may receive a location of the computing device 1800, as known in the art.

The computing device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The computing device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 1800 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop computing device, a server computing device or other networked computing component, a vehicle computing device (e.g., a vehicle control unit), a laptop computing device, a printer, a scanner, a monitor, a set-top box, an entertainment control unit, a digital camera, a digital video recorder, or a wearable computing device. In some embodiments, the computing device 1800 may be any other electronic device that processes data.

The following paragraphs provide various examples of the embodiments disclosed herein. Example 1 is a microelectronic structure, including: a patterned region including a first conductive line and a second conductive line, wherein the second conductive line is adjacent to the first conductive line, the first conductive line and the second conductive line have a pitch that is less than 30 nanometers, the first conductive line has a line edge roughness that is less than 1.2 nanometers, and the second conductive line has a line edge roughness that is less than 1.2 nanometers.

Example 2 includes the subject matter of Example 1, and further specifies that the microelectronic structure further includes an unordered region having an unordered lamellar pattern, and the unordered region is coplanar with the patterned region.

Example 3 includes the subject matter of Example 2, and further specifies that the microelectronic structure is part of a die, and the unordered region is part of a transition region of the die, under a guard ring of the die, or in a frame of the die.

Example 4 includes the subject matter of any of Examples 2-3, and further specifies that the first conductive line includes a conductive material, and the unordered region includes a material having a same material composition as the conductive material.

Example 5 includes the subject matter of any of Examples 2-4, and further specifies that the patterned region includes a dielectric material, and the unordered region includes a material having a same material composition as the dielectric material.

Example 6 includes the subject matter of any of Examples 1-5, and further specifies that a spacing between the first conductive line and the second conductive line is less than 15 nanometers.

Example 7 includes the subject matter of any of Examples 1-6, and further specifies that a spacing between the first conductive line and the second conductive line is less than 12 nanometers.

Example 8 includes the subject matter of any of Examples 1-6, and further specifies that the first conductive line has a width that is less than 15 nanometers.

Example 9 includes the subject matter of any of Examples 1-8, and further specifies that the first conductive line has a width that is less than 12 nanometers.

Example 10 includes the subject matter of any of Examples 1-9, and further specifies that the second conductive line has a width that is less than 15 nanometers.

Example 11 includes the subject matter of any of Examples 1-10, and further specifies that the second conductive line has a width that is less than 12 nanometers.

Example 12 includes the subject matter of any of Examples 1-11, and further specifies that the first conductive line and the second conductive line are part of a set of conductive lines, the set of conductive lines includes more than two conductive lines, and the pitch of the first conductive line and the second conductive line is the same as a pitch between adjacent ones of the conductive lines in the set of conductive lines.

Example 13 includes the subject matter of any of Examples 1-12, and further specifies that the microelectronic structure further includes pitch-division artifacts proximate to the patterned region.

Example 14 includes the subject matter of Example 13, and further specifies that the pitch-division artifacts include one or more half-ring patterns in a dielectric material.

Example 15 includes the subject matter of any of Examples 1-14, and further specifies that widths of at least some of the conductive lines in the patterned region are periodic across the conductive lines.

Example 16 includes the subject matter of any of Examples 1-15, and further specifies that the second conductive line has a width that is greater than a width of the first conductive line.

Example 17 includes the subject matter of Example 16, and further specifies that the line edge roughness of the second conductive line is greater than the line edge roughness of the first conductive line.

Example 18 includes the subject matter of Example 17, and further specifies that the patterned region includes an other conductive line, a width of the other conductive line is greater than a width of the second conductive line, and a line edge roughness of the other conductive line is greater than the line edge roughness of the second conductive line.

Example 19 includes the subject matter of any of Examples 16-18, and further specifies that the width of the second conductive line is at least three times greater than a width of the first conductive line.

Example 20 includes the subject matter of any of Examples 1-15, and further specifies that the first conductive line has a width that is greater than a width of the second conductive line.

Example 21 includes the subject matter of Example 20, and further specifies that the line edge roughness of the first conductive line is greater than the line edge roughness of the second conductive line.

Example 22 includes the subject matter of Example 21, and further specifies that the patterned region includes an other conductive line, a width of the other conductive line is greater than a width of the first conductive line, and a line edge roughness of the other conductive line is greater than the line edge roughness of the first conductive line.

Example 23 includes the subject matter of Example 22, and further specifies that the width of the first conductive line is at least three times greater than a width of the second conductive line.

Example 24 includes the subject matter of any of Examples 1-23, and further specifies that a spacing between the first conductive line and the second conductive line is greater than a spacing between the second conductive line and a conductive line adjacent to the second conductive line.

Example 25 includes the subject matter of any of Examples 1-23, and further specifies that a spacing between the first conductive line and the second conductive line is less than a spacing between the second conductive line and a conductive line adjacent to the second conductive line.

Example 26 includes the subject matter of any of Examples 1-25, and further specifies that the patterned region is a first patterned region, the microelectronic structure further includes a second patterned region including a first conductive line and a second conductive line, wherein the second conductive line of the second patterned region is adjacent to the first conductive line of the second patterned region, the first conductive line of the second patterned region and the second conductive line of the second patterned region have a pitch that is greater than 24 nanometers.

Example 27 includes the subject matter of Example 26, and further specifies that the first conductive line of the second patterned region and the second conductive line of the second patterned region have a pitch that is greater than 30 nanometers.

Example 28 includes the subject matter of any of Examples 26-27, and further specifies that the first conductive line of the second patterned region has a line edge roughness that is greater than 1.2 nanometers, and the second conductive line has a line edge roughness that is greater than 1.2 nanometers.

Example 29 includes the subject matter of any of Examples 26-28, and further specifies that the first conductive line of the second patterned region has a line width roughness and a line edge roughness, and the line width roughness is equal to the line edge roughness multiplied by the square root of 2.

Example 30 includes the subject matter of any of Examples 26-29, and further specifies that the second conductive line of the second patterned region has a line width roughness and a line edge roughness, and the line width roughness is equal to the line edge roughness multiplied by the square root of 2.

Example 31 includes the subject matter of any of Examples 26-30, and further specifies that the second patterned region is coplanar with the first patterned region.

Example 32 includes the subject matter of any of Examples 26-31, and further specifies that the second patterned region is in a same layer of a metallization stack as the first patterned region.

Example 33 includes the subject matter of any of Examples 1-32, and further specifies that the first conductive line has a line width roughness, and the line width roughness of the first conductive line is not equal to the line edge roughness of the first conductive line multiplied by the square root of 2.

Example 34 includes the subject matter of any of Examples 1-33, and further specifies that the second conductive line has a line width roughness, and the line width roughness of the second conductive line is not equal to the line edge roughness of the second conductive line multiplied by the square root of 2.

Example 35 includes the subject matter of any of Examples 1-34, and further specifies that the patterned region includes a third conductive line and a fourth conductive line, the third conductive line is between the second conductive line and the fourth conductive line, the third conductive line has a line edge roughness greater than 1.2 nanometers, and the fourth conductive line has a line edge roughness less than 1.2 nanometers.

Example 36 includes the subject matter of any of Examples 1-35, and further specifies that the microelectronic structure further includes a via in conductive contact with the first conductive line.

Example 37 includes the subject matter of Example 36, and further specifies that the via is in a dielectric material, and the dielectric material includes a photo acid generator.

Example 38 includes the subject matter of any of Examples 36-37, and further specifies that the dielectric material includes a quencher.

Example 39 includes the subject matter of any of Examples 36-38, and further specifies that the via has side faces that are self-aligned with side faces of the first conductive line.

Example 40 includes the subject matter of any of Examples 36-38, and further specifies that the via does not contact dielectric material adjacent to the first conductive line in the patterned region.

Example 41 includes the subject matter of any of Examples 1-40, and further specifies that the microelectronic structure further includes a via in conductive contact with the second conductive line.

Example 42 includes the subject matter of Example 41, and further specifies that the via is in a dielectric material, and the dielectric material includes a photo acid generator.

Example 43 includes the subject matter of any of Examples 41-42, and further specifies that the dielectric material includes a quencher.

Example 44 includes the subject matter of any of Examples 41-43, and further specifies that the via has side faces that are self-aligned with side faces of the first conductive line.

Example 45 includes the subject matter of any of Examples 41-43, and further specifies that the via does not contact dielectric material adjacent to the second conductive line in the patterned region.

Example 46 includes the subject matter of any of Examples 1-45, and further specifies that the microelectronic structure further includes a device layer, and the patterned region is included in an interconnect layer above or below the device layer.

Example 47 includes the subject matter of Example 46, and further specifies that the microelectronic structure further includes conductive contacts, and the patterned region is between the conductive contacts and the device layer.

Example 48 includes the subject matter of any of Examples 1-47, and further specifies that the patterned region is included in an M0 interconnect layer.

Example 49 includes the subject matter of any of Examples 1-47, and further specifies that the patterned region is included in an M1 interconnect layer.

Example 50 includes the subject matter of any of Examples 1-47, and further specifies that the patterned region is included in an M2 interconnect layer.

Example 51 includes the subject matter of any of Examples 1-50, and further specifies that the first conductive line is parallel to the second conductive line.

Example 52 is a microelectronic structure, including: a patterned region including a first conductive line and a second conductive line, wherein the second conductive line is adjacent to the first conductive line; and an unordered region having an unordered lamellar pattern, wherein the unordered region is coplanar with the patterned region.

Example 53 includes the subject matter of Example 52, and further specifies that the first conductive line includes a conductive material, and the unordered region includes a material having a same material composition as the conductive material.

Example 54 includes the subject matter of any of Examples 52-53, and further specifies that the patterned region includes a dielectric material, and the unordered region includes a material having a same material composition as the dielectric material.

Example 55 includes the subject matter of any of Examples 52-54, and further specifies that a spacing between the first conductive line and the second conductive line is less than 15 nanometers.

Example 56 includes the subject matter of any of Examples 52-55, and further specifies that a spacing between the first conductive line and the second conductive line is less than 12 nanometers.

Example 57 includes the subject matter of any of Examples 52-55, and further specifies that the first conductive line has a width that is less than 15 nanometers.

Example 58 includes the subject matter of any of Examples 52-57, and further specifies that the first conductive line has a width that is less than 12 nanometers.

Example 59 includes the subject matter of any of Examples 52-58, and further specifies that the second conductive line has a width that is less than 15 nanometers.

Example 60 includes the subject matter of any of Examples 52-59, and further specifies that the second conductive line has a width that is less than 12 nanometers.

Example 61 includes the subject matter of any of Examples 52-60, and further specifies that the first conductive line and the second conductive line are part of a set of conductive lines, the set of conductive lines includes more than two conductive lines, and a pitch of the first conductive line and the second conductive line is the same as a pitch between adjacent ones of the conductive lines in the set of conductive lines.

Example 62 includes the subject matter of any of Examples 52-61, and further specifies that the microelectronic structure further includes pitch-division artifacts proximate to the patterned region.

Example 63 includes the subject matter of Example 62, and further specifies that the pitch-division artifacts include one or more half-ring patterns in a dielectric material.

Example 64 includes the subject matter of any of Examples 52-63, and further specifies that widths of at least some of the conductive lines in the patterned region are periodic across the conductive lines.

Example 65 includes the subject matter of any of Examples 52-64, and further specifies that the second conductive line has a width that is greater than a width of the first conductive line.

Example 66 includes the subject matter of Example 65, and further specifies that a line edge roughness of the second conductive line is greater than a line edge roughness of the first conductive line.

Example 67 includes the subject matter of Example 66, and further specifies that the patterned region includes another conductive line, a width of the other conductive line is greater than a width of the second conductive line, and a line edge roughness of the other conductive line is greater than the line edge roughness of the second conductive line.

Example 68 includes the subject matter of any of Examples 65-67, and further specifies that the width of the second conductive line is at least three times greater than a width of the first conductive line.

Example 69 includes the subject matter of any of Examples 52-64, and further specifies that the first conductive line has a width that is greater than a width of the second conductive line.

Example 70 includes the subject matter of Example 69, and further specifies that a line edge roughness of the first conductive line is greater than a line edge roughness of the second conductive line.

Example 71 includes the subject matter of Example 70, and further specifies that the patterned region includes another conductive line, a width of the other conductive line is greater than a width of the first conductive line, and a line edge roughness of the other conductive line is greater than the line edge roughness of the first conductive line.

Example 72 includes the subject matter of Example 71, and further specifies that the width of the first conductive line is at least three times greater than a width of the second conductive line.

Example 73 includes the subject matter of any of Examples 52-72, and further specifies that a spacing between the first conductive line and the second conductive line is greater than a spacing between the second conductive line and a conductive line adjacent to the second conductive line.

Example 74 includes the subject matter of any of Examples 52-72, and further specifies that a spacing between the first conductive line and the second conductive line is less than a spacing between the second conductive line and a conductive line adjacent to the second conductive line.

Example 75 includes the subject matter of any of Examples 52-74, and further specifies that the patterned region is a first patterned region, the microelectronic structure further includes a second patterned region including a first conductive line and a second conductive line, wherein the second conductive line of the second patterned region is adjacent to the first conductive line of the second patterned region, the first conductive line of the second patterned region and the second conductive line of the second patterned region have a pitch that is greater than 24 nanometers.

Example 76 includes the subject matter of Example 75, and further specifies that the first conductive line of the second patterned region and the second conductive line of the second patterned region have a pitch that is greater than 30 nanometers.

Example 77 includes the subject matter of any of Examples 75-76, and further specifies that the first conductive line of the second patterned region has a line edge roughness that is greater than 1.2 nanometers, and the second conductive line has a line edge roughness that is greater than 1.2 nanometers.

Example 78 includes the subject matter of any of Examples 75-77, and further specifies that the first conductive line of the second patterned region has a line width roughness and a line edge roughness, and the line width roughness is equal to the line edge roughness multiplied by the square root of 2.

Example 79 includes the subject matter of any of Examples 75-78, and further specifies that the second conductive line of the second patterned region has a line width roughness and a line edge roughness, and the line width roughness is equal to the line edge roughness multiplied by the square root of 2.

Example 80 includes the subject matter of any of Examples 75-79, and further specifies that the second patterned region is coplanar with the first patterned region.

Example 81 includes the subject matter of any of Examples 75-80, and further specifies that the second patterned region is in a same layer of a metallization stack as the first patterned region.

Example 82 includes the subject matter of any of Examples 52-81, and further specifies that the first conductive line has a line width roughness, and the line width roughness of the first conductive line is not equal to the line edge roughness of the first conductive line multiplied by the square root of 2.

Example 83 includes the subject matter of any of Examples 52-82, and further specifies that the second conductive line has a line width roughness, and the line width roughness of the second conductive line is not equal to the line edge roughness of the second conductive line multiplied by the square root of 2.

Example 84 includes the subject matter of any of Examples 52-83, and further specifies that the patterned region includes a third conductive line and a fourth conductive line, the third conductive line is between the second conductive line and the fourth conductive line, the third conductive line has a line edge roughness greater than 1.2 nanometers, and the fourth conductive line has a line edge roughness less than 1.2 nanometers.

Example 85 includes the subject matter of any of Examples 52-84, and further specifies that the microelectronic structure further includes a via in conductive contact with the first conductive line.

Example 86 includes the subject matter of Example 85, and further specifies that the via is in a dielectric material, and the dielectric material includes a photo acid generator.

Example 87 includes the subject matter of any of Examples 85-86, and further specifies that the dielectric material includes a quencher.

Example 88 includes the subject matter of any of Examples 85-87, and further specifies that the via has side faces that are self-aligned with side faces of the first conductive line.

Example 89 includes the subject matter of any of Examples 85-87, and further specifies that the via does not contact dielectric material adjacent to the first conductive line in the patterned region.

Example 90 includes the subject matter of any of Examples 52-89, and further specifies that the microelectronic structure further includes a via in conductive contact with the second conductive line.

Example 91 includes the subject matter of Example 90, and further specifies that the via is in a dielectric material, and the dielectric material includes a photo acid generator.

Example 92 includes the subject matter of any of Examples 90-91, and further specifies that the dielectric material includes a quencher.

Example 93 includes the subject matter of any of Examples 90-92, and further specifies that the via has side faces that are self-aligned with side faces of the first conductive line.

Example 94 includes the subject matter of any of Examples 90-92, and further specifies that the via does not contact dielectric material adjacent to the second conductive line in the patterned region.

Example 95 includes the subject matter of any of Examples 52-94, and further specifies that the microelectronic structure further includes a device layer, and the patterned region is included in an interconnect layer above or below the device layer.

Example 96 includes the subject matter of Example 95, and further specifies that the microelectronic structure further includes conductive contacts, and the patterned region is between the conductive contacts and the device layer.

Example 97 includes the subject matter of any of Examples 52-96, and further specifies that the patterned region is included in an M0 interconnect layer.

Example 98 includes the subject matter of any of Examples 52-96, and further specifies that the patterned region is included in an M1 interconnect layer.

Example 99 includes the subject matter of any of Examples 52-96, and further specifies that the patterned region is included in an M2 interconnect layer.

Example 100 includes the subject matter of any of Examples 52-99, and further specifies that the first conductive line is parallel to the second conductive line.

Example 101 is a microelectronic structure, including: a first patterned region including a first conductive line; and a second patterned region including a second conductive line, wherein the second patterned region is coplanar with the first patterned region, the first conductive line has a first line width roughness and a first line edge roughness, the first line width roughness is not equal to the first line edge roughness multiplied by the square root of 2, the second conductive line has a second line width roughness and a second line edge roughness, and the second line width roughness is equal to the second line edge roughness multiplied by the square root of 2.

Example 102 includes the subject matter of Example 101, and further specifies that the microelectronic structure further includes an unordered region having an unordered lamellar pattern, and the unordered region is coplanar with the first patterned region.

Example 103 includes the subject matter of Example 102, and further specifies that the microelectronic structure is part of a die, and the unordered region is part of a transition region of the die, under a guard ring of the die, or in a frame of the die.

Example 104 includes the subject matter of any of Examples 102-103, and further specifies that the first conductive line includes a conductive material, and the unordered region includes a material having a same material composition as the conductive material.

Example 105 includes the subject matter of any of Examples 102-104, and further specifies that the first patterned region includes a dielectric material, and the unordered region includes a material having a same material composition as the dielectric material.

Example 106 includes the subject matter of any of Examples 101-105, and further specifies that a pitch of conductive lines in the first patterned region is less than 30 nanometers.

Example 107 includes the subject matter of any of Examples 101-106, and further specifies that a pitch of conductive lines in the first patterned region is less than 24 nanometers.

Example 108 includes the subject matter of any of Examples 101-106, and further specifies that the first conductive line has a width that is less than 15 nanometers.

Example 109 includes the subject matter of any of Examples 101-108, and further specifies that the first conductive line has a width that is less than 12 nanometers.

Example 110 includes the subject matter of any of Examples 101-109, and further specifies that the microelectronic structure further includes pitch-division artifacts proximate to the first patterned region.

Example 111 includes the subject matter of Example 110, and further specifies that the pitch-division artifacts include one or more half-ring patterns in a dielectric material.

Example 112 includes the subject matter of any of Examples 101-111, and further specifies that widths of at least some conductive lines in the first patterned region are periodic across the at least some conductive lines.

Example 113 includes the subject matter of any of Examples 101-112, and further specifies that the second conductive line has a width that is greater than a width of the first conductive line.

Example 114 includes the subject matter of Example 113, and further specifies that the second line edge roughness is greater than the first line edge roughness.

Example 115 includes the subject matter of Example 114, and further specifies that the second line edge roughness is greater than 1.2 nanometers.

Example 116 includes the subject matter of any of Examples 113-115, and further specifies that the first line edge roughness is less than 1.2 nanometers.

Example 117 includes the subject matter of any of Examples 101-112, and further specifies that the first conductive line has a width that is greater than a width of the second conductive line.

Example 118 includes the subject matter of any of Examples 101-117, and further specifies that a pitch of conductive lines in the second patterned region is greater than 30 nanometers.

Example 119 includes the subject matter of any of Examples 101-118, and further specifies that the second patterned region is coplanar with the first patterned region.

Example 120 includes the subject matter of any of Examples 101-119, and further specifies that the second patterned region is in a same layer of a metallization stack as the first patterned region.

Example 121 includes the subject matter of any of Examples 101-120, and further specifies that the microelectronic structure further includes a via in conductive contact with the first conductive line.

Example 122 includes the subject matter of Example 121, and further specifies that the via is in a dielectric material, and the dielectric material includes a photo acid generator.

Example 123 includes the subject matter of any of Examples 121-122, and further specifies that the dielectric material includes a quencher.

Example 124 includes the subject matter of any of Examples 121-123, and further specifies that the via has side faces that are self-aligned with side faces of the first conductive line.

Example 125 includes the subject matter of any of Examples 121-123, and further specifies that the via does not contact dielectric material adjacent to the first conductive line in the first patterned region.

Example 126 includes the subject matter of any of Examples 101-125, and further specifies that the microelectronic structure further includes a device layer, and the first patterned region is included in an interconnect layer above or below the device layer.

Example 127 includes the subject matter of Example 126, and further specifies that the microelectronic structure further includes conductive contacts, and the first patterned region is between the conductive contacts and the device layer.

Example 128 includes the subject matter of any of Examples 101-127, and further specifies that the first patterned region is included in an M0 interconnect layer.

Example 129 includes the subject matter of any of Examples 101-127, and further specifies that the first patterned region is included in an M1 interconnect layer.

Example 130 includes the subject matter of any of Examples 101-127, and further specifies that the first patterned region is included in an M2 interconnect layer.

Example 131 includes the subject matter of any of Examples 101-130, and further specifies that the first conductive line is parallel to the second conductive line.

Example 132 is a computing device, including: a die including any of the microelectronic structures of any of claims 1-131; and a circuit board, wherein the die is communicatively coupled to the circuit board.

Example 133 includes the subject matter of Example 132, and further specifies that the die is included in a package, and the package is communicatively coupled to the circuit board.

Example 134 includes the subject matter of Example 133, and further specifies that the package is communicatively coupled to the circuit board by solder.

Example 135 includes the subject matter of any of Examples 132-134, and further specifies that the circuit board is a motherboard.

Example 136 includes the subject matter of any of Examples 132-135, and further specifies that the die is part of a processing device or a memory device.

Example 137 includes the subject matter of any of Examples 132-136, and further specifies that the computing device is a mobile computing device.

Example 138 includes the subject matter of any of Examples 132-136, and further specifies that the computing device is a laptop computing device.

Example 139 includes the subject matter of any of Examples 132-136, and further specifies that the computing device is a desktop computing device.

Example 140 includes the subject matter of any of Examples 132-136, and further specifies that the computing device is a wearable computing device.

Example 141 includes the subject matter of any of Examples 132-136, and further specifies that the computing device is a server computing device.

Example 142 includes the subject matter of any of Examples 132-136, and further specifies that the computing device is a vehicle computing device.

Example 143 includes the subject matter of any of Examples 132-142, and further specifies that the computing device further includes a display communicatively coupled to the circuit board.

Example 144 includes the subject matter of any of Examples 132-143, and further specifies that the computing device further includes an antenna communicatively coupled to the circuit board.

Example 145 includes the subject matter of any of Examples 132-144, and further specifies that the computing device further includes a housing around the die and the circuit board.

Example 146 includes the subject matter of Example 145, and further specifies that the housing includes a plastic material.

Example 147 includes any of the manufacturing methods disclosed herein.

The invention claimed is:

1. A microelectronic structure, comprising:
a patterned region including a first conductive line and a second conductive line, wherein the first conductive line and the second conductive line have a pitch that is less than 30 nanometers, the first conductive line has a line edge roughness that is less than 1.2 nanometers, and the second conductive line has a line edge roughness that is less than 1.2 nanometers; and
an unpatterned region having an unordered lamellar pattern, wherein the unpatterned region is adjacent to the patterned region.

2. The microelectronic structure of claim 1, wherein the microelectronic structure further includes pitch-division artifacts proximate to the patterned region.

3. The microelectronic structure of claim 1, wherein the patterned region is a first patterned region, the microelectronic structure further includes a second patterned region including a first conductive line and a second conductive line, wherein the second conductive line of the second patterned region is adjacent to the first conductive line of the second patterned region, the first conductive line of the second patterned region and the second conductive line of the second patterned region have a pitch that is greater than 24 nanometers.

4. The microelectronic structure of claim 3, wherein the first conductive line of the second patterned region has a line edge roughness that is greater than 1.2 nanometers, and the second conductive line has a line edge roughness that is greater than 1.2 nanometers.

5. The microelectronic structure of claim 3, wherein the first conductive line of the second patterned region has a line width roughness and a line edge roughness, and the line width roughness is equal to the line edge roughness multiplied by a square root of 2.

6. The microelectronic structure of claim 3, wherein the second patterned region is coplanar with the first patterned region.

7. The microelectronic structure of claim 3, wherein the second patterned region is in a same layer of a metallization stack as the first patterned region.

8. The microelectronic structure of claim 1, wherein the first conductive line has a line width roughness, and the line width roughness of the first conductive line is not equal to the line edge roughness of the first conductive line multiplied by a square root of 2.

9. The microelectronic structure of claim 1, wherein the patterned region includes a third conductive line and a fourth conductive line, the third conductive line is between the second conductive line and the fourth conductive line, the third conductive line has a line edge roughness greater than 1.2 nanometers, and the fourth conductive line has a line edge roughness less than 1.2 nanometers.

10. The microelectronic structure of claim 1, wherein the unpatterned region includes a block copolymer.

11. A microelectronic structure, comprising:
a patterned region including a first conductive line and a second conductive line, wherein the second conductive line is adjacent to the first conductive line; and
an unpatterned region having an unordered lamellar pattern, wherein the unpatterned region is coplanar with the patterned region.

12. The microelectronic structure of claim 11, wherein the first conductive line includes a conductive material, and the unpatterned region includes a material having a same material composition as the conductive material.

13. The microelectronic structure of claim 11, wherein the patterned region includes a dielectric material, and the unpatterned region includes a material having a same material composition as the dielectric material.

14. The microelectronic structure of claim 11, wherein a spacing between the first conductive line and the second conductive line is less than 15 nanometers.

15. The microelectronic structure of claim 11, wherein the microelectronic structure further includes a device layer, and the patterned region is included in an interconnect layer above or below the device layer.

16. The microelectronic structure of claim 11, wherein the unpatterned region is under a guard ring of the microelectronic structure.

17. The microelectronic structure of claim 16, wherein the first conductive line and the second conductive line are not under the guard ring.

18. The microelectronic structure of claim 11, wherein the unpatterned region is in a frame of a die of the microelectronic structure.

19. The microelectronic structure of claim 11, wherein the first conductive line and the second conductive line are outside of a frame of a die of the microelectronic structure.

20. The microelectronic structure of claim 11, wherein the unpatterned region includes a block copolymer.

* * * * *